(12) United States Patent
Han et al.

(10) Patent No.: US 10,147,882 B2
(45) Date of Patent: Dec. 4, 2018

(54) STYRL-BASED COMPOUND AND ORGANIC LIGHT EMITTING DIODE COMPRISING THE SAME

(71) Applicant: SAMSUNG DISPLAY CO., LTD., Yongin, Gyeonggi-Do (KR)

(72) Inventors: Sang-Hyun Han, Yongin (KR); Seok-Hwan Hwang, Yongin (KR); Young-Kook Kim, Yongin (KR); Hye-Jin Jung, Yongin (KR); Jin-O Lim, Yongin (KR); Soo-Yon Kim, Yongin (KR); Eun-Jae Jeong, Yongin (KR); Jun-Ha Park, Yongin (KR); Eun-Young Lee, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 471 days.

(21) Appl. No.: 14/075,573

(22) Filed: Nov. 8, 2013

(65) Prior Publication Data
US 2014/0332772 A1 Nov. 13, 2014

(30) Foreign Application Priority Data
May 9, 2013 (KR) ........................ 10-2013-0052751

(51) Int. Cl.
*H01L 51/00* (2006.01)
*H01L 51/50* (2006.01)

(52) U.S. Cl.
CPC ........ *H01L 51/0058* (2013.01); *H01L 51/006* (2013.01); *H01L 51/0061* (2013.01);
(Continued)

(58) Field of Classification Search
CPC ........................... C09K 11/06; H01L 51/0058
See application file for complete search history.

(56) References Cited

U.S. PATENT DOCUMENTS

| 3,968,051 A | 7/1976 | Stamm et al. |
| 5,635,308 A | 6/1997 | Inoue et al. |

(Continued)

FOREIGN PATENT DOCUMENTS

| CN | 102925139 A | 2/2013 |
| JP | 8-12600 A | 1/1996 |

(Continued)

OTHER PUBLICATIONS

Leem et al., Highly efficient tandem p-i-n organic light-emitting diodes adopting a low temperature evaporated rhenium oxide interconnecting layer, Applied Physics Letters, 93, 103304-1-3, 2008.*

(Continued)

*Primary Examiner* — Francisco Tschen
(74) *Attorney, Agent, or Firm* — Lewis Roca Rothgerber Christie LLP

(57) ABSTRACT

A styryl-based compound represented by Formula 1 below is disclosed. An organic light-emitting diode including the styryl-based compound is also disclosed.

Formula 1

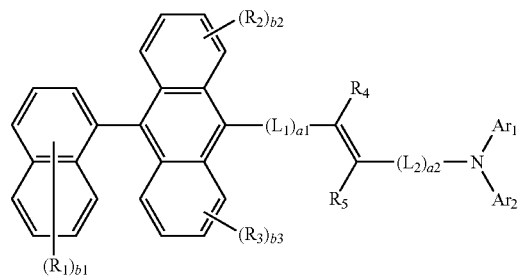

20 Claims, 1 Drawing Sheet

(52) U.S. Cl.
CPC ...... *H01L 51/0067* (2013.01); *H01L 51/0072* (2013.01); *H01L 51/0094* (2013.01); *H01L 51/5012* (2013.01)

(56) References Cited

U.S. PATENT DOCUMENTS

| | | | |
|---|---|---|---|
| 5,972,247 A | 10/1999 | Shi et al. | |
| 6,465,115 B2 | 10/2002 | Shi et al. | |
| 6,582,837 B1 | 6/2003 | Toguchi et al. | |
| 6,596,415 B2 | 7/2003 | Shi et al. | |
| 7,053,255 B2 | 5/2006 | Ikeda et al. | |
| 7,233,019 B2 | 6/2007 | Ionkin et al. | |
| 7,732,063 B2 | 6/2010 | Matsuura et al. | |
| 7,839,074 B2 | 11/2010 | Ikeda et al. | |
| 8,221,905 B2 | 7/2012 | Lin et al. | |
| 8,324,802 B2 | 12/2012 | Matsuura et al. | |
| 8,334,648 B2 | 12/2012 | Matsuura et al. | |
| 9,711,736 B2 | 7/2017 | Han et al. | |
| 2004/0076853 A1 | 4/2004 | Jarikov | |
| 2004/0137270 A1 | 7/2004 | Seo et al. | |
| 2004/0214036 A1 | 10/2004 | Bentsen et al. | |
| 2005/0064233 A1 | 3/2005 | Matsuura et al. | |
| 2005/0089717 A1* | 4/2005 | Cosimbescu | C09K 11/06 428/690 |
| 2005/0156164 A1 | 7/2005 | Sotoyama | |
| 2005/0214565 A1 | 9/2005 | Ikeda et al. | |
| 2005/0245752 A1 | 11/2005 | Conley et al. | |
| 2005/0249972 A1 | 11/2005 | Hatwar et al. | |
| 2006/0052641 A1 | 3/2006 | Funahashi | |
| 2006/0083945 A1* | 4/2006 | Morishita | C07D 209/88 428/690 |
| 2006/0113905 A1 | 6/2006 | Nakamura | |
| 2006/0152146 A1 | 7/2006 | Funahashi | |
| 2006/0159952 A1 | 7/2006 | Ricks et al. | |
| 2007/0114917 A1 | 5/2007 | Funahashi et al. | |
| 2007/0152565 A1 | 7/2007 | Kubota et al. | |
| 2007/0155991 A1 | 7/2007 | Funahashi | |
| 2007/0170419 A1 | 7/2007 | Gerhard et al. | |
| 2007/0237984 A1 | 10/2007 | Matsuura et al. | |
| 2008/0160342 A1* | 7/2008 | Meng | C09K 11/06 428/690 |
| 2008/0193796 A1 | 8/2008 | Arakane et al. | |
| 2009/0004458 A1 | 1/2009 | Falster et al. | |
| 2009/0004485 A1 | 1/2009 | Zheng et al. | |
| 2009/0026930 A1 | 1/2009 | Shin et al. | |
| 2010/0013381 A1 | 1/2010 | Stoessel et al. | |
| 2010/0032658 A1 | 2/2010 | Lee et al. | |
| 2010/0052526 A1 | 3/2010 | Je et al. | |
| 2010/0127618 A1 | 5/2010 | Ohrui et al. | |
| 2010/0187521 A1 | 7/2010 | Park et al. | |
| 2010/0244012 A1 | 9/2010 | Mazur et al. | |
| 2010/0270913 A1 | 10/2010 | Matsuura et al. | |
| 2010/0277061 A1 | 11/2010 | Matsuura et al. | |
| 2010/0279156 A1 | 11/2010 | Kim et al. | |
| 2010/0295445 A1 | 11/2010 | Kuma et al. | |
| 2010/0314615 A1 | 12/2010 | Mizuki et al. | |
| 2011/0001130 A1 | 1/2011 | Nishimura et al. | |
| 2011/0006289 A1 | 1/2011 | Mizuki et al. | |
| 2011/0057116 A1 | 3/2011 | Trogler et al. | |
| 2011/0156016 A1 | 6/2011 | Kawamura et al. | |
| 2011/0210320 A1 | 9/2011 | Shin et al. | |
| 2011/0284832 A1 | 11/2011 | In et al. | |
| 2012/0001158 A1 | 1/2012 | Asari et al. | |
| 2012/0032152 A1 | 2/2012 | Kim et al. | |
| 2012/0056165 A1 | 3/2012 | Kawamura et al. | |
| 2012/0091885 A1* | 4/2012 | Kim | C09K 11/06 313/504 |
| 2012/0138915 A1 | 6/2012 | Nishimura et al. | |
| 2012/0181518 A1 | 7/2012 | Ogiwara et al. | |
| 2012/0181922 A1 | 7/2012 | Kawamura et al. | |
| 2012/0235561 A1 | 9/2012 | Ikeda et al. | |
| 2012/0305904 A1 | 12/2012 | Kai et al. | |
| 2012/0313511 A1 | 12/2012 | Tsurutani et al. | |
| 2013/0001526 A1 | 1/2013 | Kwak et al. | |
| 2013/0049581 A1 | 2/2013 | Nishide et al. | |
| 2013/0090446 A1 | 4/2013 | Zhou et al. | |
| 2013/0105786 A1 | 5/2013 | Watanabe et al. | |
| 2013/0112949 A1 | 5/2013 | Sim et al. | |
| 2013/0119355 A1* | 5/2013 | Han | C07C 211/58 257/40 |
| 2013/0221332 A1 | 8/2013 | Xia et al. | |
| 2013/0228752 A1 | 9/2013 | Shin et al. | |
| 2013/0295706 A1 | 11/2013 | Goto et al. | |
| 2013/0306958 A1 | 11/2013 | Ito et al. | |
| 2014/0008641 A1 | 1/2014 | Kubota et al. | |
| 2014/0048792 A1 | 2/2014 | Chun et al. | |
| 2014/0124763 A1 | 5/2014 | Funahashi | |
| 2014/0175395 A1 | 6/2014 | Kim et al. | |
| 2014/0264301 A1 | 9/2014 | Takaku et al. | |
| 2014/0332772 A1 | 11/2014 | Han et al. | |
| 2014/0346406 A1 | 11/2014 | Lee et al. | |
| 2014/0346464 A1 | 11/2014 | Kim et al. | |
| 2014/0346482 A1 | 11/2014 | Mizuki et al. | |
| 2015/0001479 A1 | 1/2015 | Lee et al. | |
| 2015/0053946 A1 | 2/2015 | Kim et al. | |
| 2015/0069344 A1 | 3/2015 | Kim et al. | |
| 2015/0090964 A1 | 4/2015 | Hwang et al. | |
| 2015/0090965 A1 | 4/2015 | Park et al. | |
| 2015/0108448 A1 | 4/2015 | Dai et al. | |
| 2015/0171337 A1 | 6/2015 | Jung et al. | |
| 2015/0236273 A1 | 8/2015 | Jang et al. | |
| 2015/0255736 A1 | 9/2015 | Kim et al. | |
| 2015/0318508 A1 | 11/2015 | Kim et al. | |
| 2015/0333266 A1 | 11/2015 | Ito et al. | |
| 2015/0333268 A1 | 11/2015 | Han et al. | |
| 2015/0349265 A1 | 12/2015 | Hwang et al. | |
| 2015/0357574 A1 | 12/2015 | Ito et al. | |
| 2015/0364693 A1 | 12/2015 | Ito et al. | |
| 2016/0005980 A1 | 1/2016 | Ito et al. | |
| 2016/0020404 A1 | 1/2016 | Ito et al. | |
| 2016/0133845 A1 | 5/2016 | Jung et al. | |

FOREIGN PATENT DOCUMENTS

| | | |
|---|---|---|
| JP | 11-003782 A | 1/1999 |
| JP | 2002-63989 | 2/2002 |
| JP | 2003-306454 | 10/2003 |
| JP | 2005-041843 A | 2/2005 |
| JP | 2006-273737 A | 10/2006 |
| JP | 2008-291263 | 12/2008 |
| JP | 2009-212238 | 9/2009 |
| JP | 2011176267 A * | 9/2011 |
| JP | 2012-82209 | 4/2012 |
| JP | 2012-119592 A | 6/2012 |
| JP | 2012-156499 A | 8/2012 |
| JP | 2013-063930 | 4/2013 |
| JP | 2013-063931 | 4/2013 |
| JP | 52-08271 B2 | 6/2013 |
| JP | 5281304 | 9/2013 |
| KR | 10-2005-0058465 | 6/2005 |
| KR | 10-2005-0086518 A | 8/2005 |
| KR | 10-2005-0107809 | 11/2005 |
| KR | 10-2006-0006760 | 1/2006 |
| KR | 10-2006-0109524 | 10/2006 |
| KR | 10-2006-0113954 | 11/2006 |
| KR | 10-2006-0127138 | 12/2006 |
| KR | 10-2007-0009074 | 1/2007 |
| KR | 10-2007-0015195 | 2/2007 |
| KR | 10-2007-0050393 A | 5/2007 |
| KR | 10-2008-0068720 A | 7/2008 |
| KR | 10-2009-0010763 A | 1/2009 |
| KR | 10-2009-0033493 A | 4/2009 |
| KR | 10-2009-0122922 A | 12/2009 |
| KR | 10-2010-0007552 | 1/2010 |
| KR | 10-2010-0007780 A | 1/2010 |
| KR | 10-2010-0024894 | 3/2010 |
| KR | 10-2010-0048203 | 5/2010 |
| KR | 10-2010-0057465 | 5/2010 |
| KR | 10-2010-0070979 | 6/2010 |
| KR | 10-2010-0070992 | 6/2010 |
| KR | 10-2010-0093085 | 8/2010 |
| KR | 10-2010-0097182 A | 9/2010 |
| KR | 10-2010-0099327 | 9/2010 |
| KR | 10-2010-0105099 | 9/2010 |

(56) References Cited

FOREIGN PATENT DOCUMENTS

| | | |
|---|---|---|
| KR | 10-2011-0015213 | 2/2011 |
| KR | 10-2011-0041728 | 4/2011 |
| KR | 10-2011-0043625 A | 4/2011 |
| KR | 10-2011-0047278 A | 5/2011 |
| KR | 10-2011-0094271 | 8/2011 |
| KR | 10-2011-0107679 | 10/2011 |
| KR | 10-2011-0134885 | 12/2011 |
| KR | 10-2012-0002865 | 1/2012 |
| KR | 10-2012-0026513 | 3/2012 |
| KR | 10-2012-0039470 | 4/2012 |
| KR | 10-2012-0041110 | 4/2012 |
| KR | 10-1132635 B1 | 4/2012 |
| KR | 10-2012-0057611 | 6/2012 |
| KR | 10-2012-0066390 | 6/2012 |
| KR | 10-2012-0093354 | 8/2012 |
| KR | 10-2012-0117622 | 10/2012 |
| KR | 10-2012-0117675 | 10/2012 |
| KR | 10-2013-0007495 | 1/2013 |
| KR | 10-2013-0009765 | 1/2013 |
| KR | 10-1233377 | 2/2013 |
| KR | 10-1262420 | 5/2013 |
| KR | 10-2013-0100948 | 9/2013 |
| WO | WO 2010/050781 A1 | 5/2010 |
| WO | WO 2010/058995 A1 | 5/2010 |
| WO | WO 2010/107244 A2 | 9/2010 |
| WO | WO 2010/137678 A1 | 12/2010 |
| WO | WO 2012/070226 A1 | 5/2012 |
| WO | WO 2012/070234 A1 | 5/2012 |
| WO | WO 2013/051875 A2 | 4/2013 |

OTHER PUBLICATIONS

Kaminaga et al., Machine Translation of JP 2011-176267A, Published Sep. 2011, Retrieved from Google Patents on Feb. 3, 2017, pp. 1-44.*

Ding et al., "A Succinct Synthesis of the Vaulted Biaryl Ligand Vanol via a Dienone-Phenol Rearrangement", Full Papers, 2011 Wiley-VCH Verlag GmbH & Co., KGaA, Weinheim, Chem. Asian J. 2011, 6, 2130-2146, 17 pages.

Katritzky et al., "Polycyclic Fused Phenanthridines: An Alternative Approach from Benzotriazoles," Center for Heterocyclic Compounds, Department of Chemistry, University of Florida, Gainesville, pp. 1-27.

STIC Search Report for cross referenced U.S. Appl. No. 14/533,004, dated Dec. 1, 2015 (15 pages).

U.S. Office Action dated Dec. 8, 2015, for cross referenced U.S. Appl. No. 14/533,004, (12 pages).

U.S. Office Action dated Feb. 19, 2016, for cross referenced U.S. Appl. No. 14/072,478, (12 pages).

U.S. Office Action dated May 5, 2016, for cross referenced U.S. Appl. No. 14/195,836 (18 pages).

U.S. Notice of Allowance dated Jul. 15, 2016, for cross referenced U.S. Appl. No. 14/533,004 (13 pages).

U.S. Office Action dated Oct. 6, 2016, for cross referenced U.S. Appl. No. 14/550,801 (9 pages).

Yumiko et al., Machine English translation of KR 10-2010-0097182. Mar. 10, 2017.

U.S. Notice of Allowance dated Mar. 27, 2017, issued in cross-reference U.S. Appl. No. 14/550,801 (9 pages).

Machine translation for JP 2012-119592 A, publication date Jun. 21, 2012, 27 pages.

Machine Translation for KR 10-2011-0041728, publication date Apr. 22, 2011, 19 pages.

U.S. Office Action dated Jul. 13, 2017, issued in cross-reference U.S. Appl. No. 14/508,677 (10 pages).

U.S. Notice of Allowance dated Feb. 10, 2017, issued in cross-reference U.S. Appl. No. 14/533,004 (pages).

Machine English translation of Shin et al. (KR 10-2009-0010763), 27 pages.

U.S. Notice of Allowance dated Mar. 15, 2017, issued in U.S. Appl. No. 14/513,144 (9 pages).

U.S. Office Action dated May 18, 2017, issued in U.S. Appl. No. 14/789,672 (17 pages).

U.S. Office Action dated Aug. 23, 2017, issued in U.S. Appl. No. 14/702,970 (9 pages).

U.S. Office Action dated Sep. 7, 2017, issued in U.S. Appl. No. 14/789,672 (16 pages).

Machine translation for JP 2012-119592 A (publication date: Jun. 2012), 52 pages.

U.S. Office Action dated Dec. 18, 2017, issued in U.S. Appl. No. 14/550,801 (9 pages).

U.S. Office Action dated Dec. 20, 2017, issued in U.S. Appl. No. 14/195,836 (9 pages).

U.S. Notice of Allowance dated Mar. 13, 2018, issued in U.S. Appl. No. 14/789,672 (10 pages).

* cited by examiner

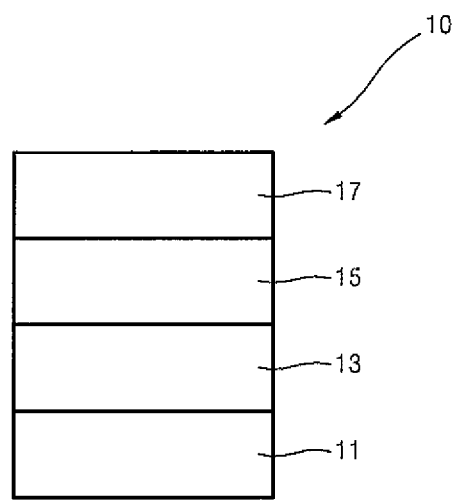

STYRL-BASED COMPOUND AND ORGANIC LIGHT EMITTING DIODE COMPRISING THE SAME

CROSS-REFERENCE TO RELATED APPLICATION

This application claims priority to and the benefit of Korean Patent Application No. 10-2013-0052751, filed on May 9, 2013, in the Korean Intellectual Property Office, the disclosure of which is incorporated herein in its entirety by reference.

BACKGROUND

1. Field

Aspects of embodiments according to the present invention relate to a styryl-based compound and an organic light-emitting diode (OLED) including the same.

2. Description of the Related Art

Organic light-emitting diodes (OLEDs) are self-emitting devices that have advantages such as a wide viewing angle, excellent contrast, quick response, high brightness, and excellent driving voltage, and can provide multicolored images.

A general OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic layers formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Aspects of embodiments according to the present invention provide a styryl-based compound having a novel structure and an organic light-emitting diode (OLED) including the styryl-based compound.

According to an embodiment of the present invention, a styryl-based compound is represented by Formula 1 below:

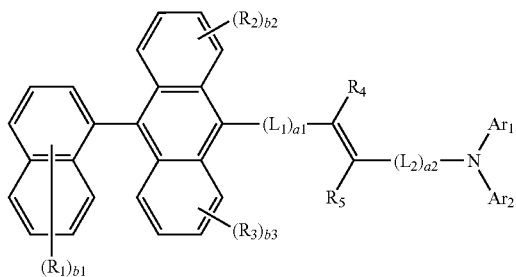

Formula 1 wherein, in Formula 1, $L_1$ and $L_2$ may be each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

a1 and a2 may be each independently an integer from 0 to 3;

$Ar_1$ and $Ar_2$ may be each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group, wherein $Ar_1$ and $Ar_2$, optionally, are linked to each other to form a saturated or unsaturated ring;

$R_1$ through $R_3$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —Si($Q_1$)($Q_2$)($Q_3$) and —N($Q_4$)($Q_5$) $Q_1$ through $Q_5$ each being independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group);

b1 may be an integer from 1 to 7;

b2 and b3 may be each independently an integer from 1 to 4; and $R_4$ and $R_5$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

According to another embodiment of the present invention, an organic light-emitting diode (OLED) includes a first electrode; a second electrode facing the first electrode; and an organic layer between the first electrode and the second electrode, wherein the organic layer includes a hole transporting region between the first electrode and an emission layer, and an electron transporting region between the emission layer and the second electrode, wherein the organic layer includes at least one of the styryl-based compounds stated above.

BRIEF DESCRIPTION OF THE DRAWINGS

The above and other features and advantages of the present invention will become more apparent by describing in detail embodiments thereof with reference to the accompanying drawing.

Here, the accompanying drawing is a schematic diagram illustrating an organic light-emitting diode (OLED) according to an embodiment of the present invention.

DETAILED DESCRIPTION

Hereinafter, only certain embodiments will be described more fully with reference to the accompanying drawing, in which an exemplary embodiment is shown. As those skilled in the art would recognize, the invention may be embodied in many different forms and should not be construed as being limited to the embodiments set forth herein. Also, in the context of the present application, when a first element is referred to as being "on" a second element, it can be directly on the second element or be indirectly on the second element with one or more intervening elements interposed therebetween. As used herein, the term "and/or" includes any and all combinations of one or more of the associated listed items. Expressions such as "at least one of," when preceding a list of elements, modify the entire list of elements and do not modify the individual elements of the list.

A styryl-based compound according to an embodiment of the present invention is represented by Formula 1 below:

Formula 1

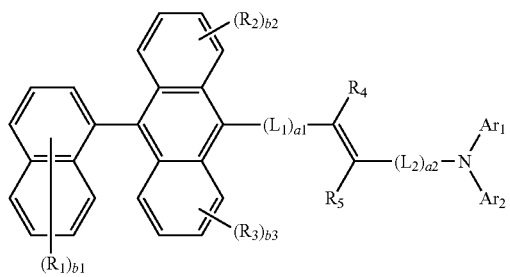

In Formula 1, $L_1$ and $L_2$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group.

For example, in Formula 1, $L_1$ and $L_2$ may be each independently selected from a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolyiene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinyiene group, a quinazolinylene group, a cinnolinylene group, a carbazolylene group, a phenanthridinylene group, an acridinylene group, a phenanthrolinylene group, a phenazinylene group, a benzoxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, and a dibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, and a dibenzosilolylene group, substituted with at least one of, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethyifluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group.

In some embodiments, $L_1$ and $L_2$ may be each independently represented by one of Formulae 2-1 through 2-28 below, but are not limited thereto:

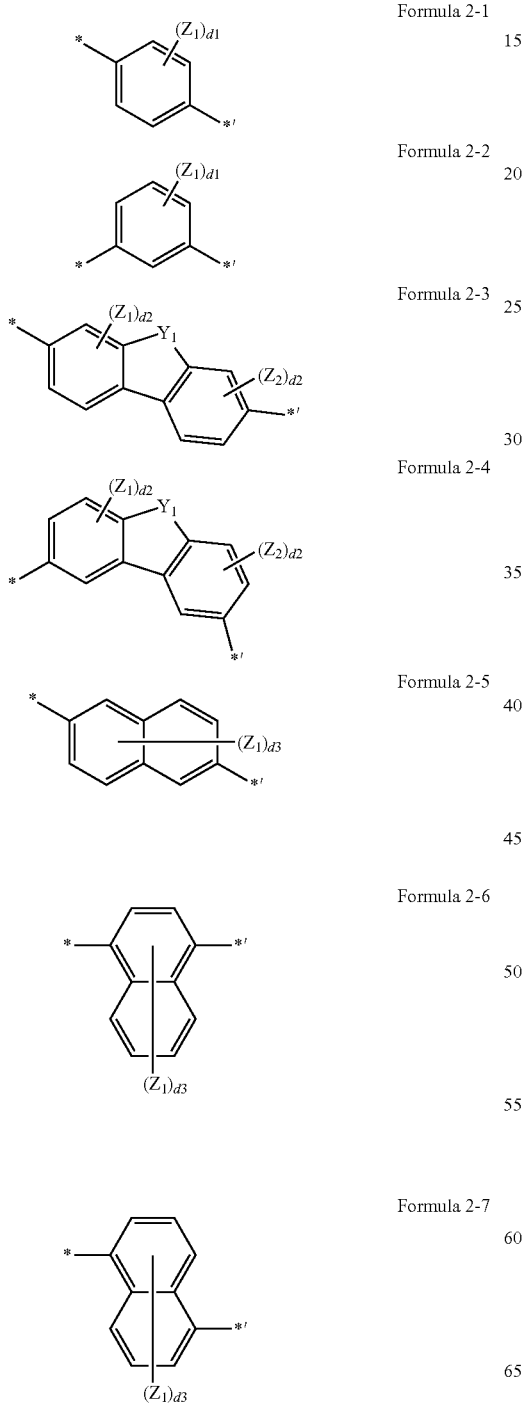

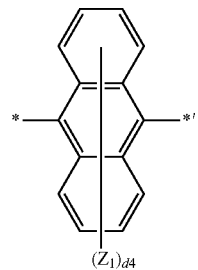
Formula 2-8

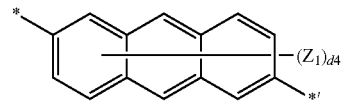
Formula 2-9

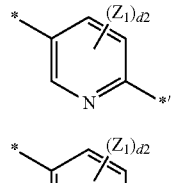
Formula 2-10

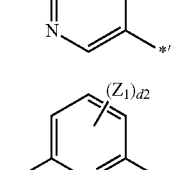
Formula 2-11

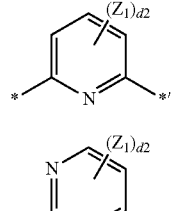
Formula 2-12

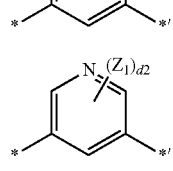
Formula 2-13

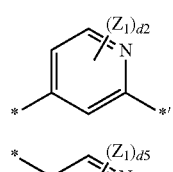
Formula 2-14

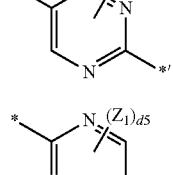
Formula 2-15

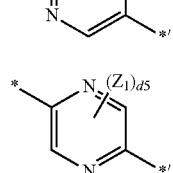
Formula 2-16

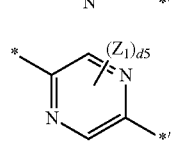
Formula 2-17

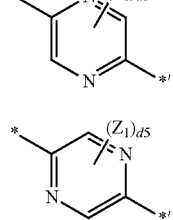
Formula 2-18

Formula 2-19

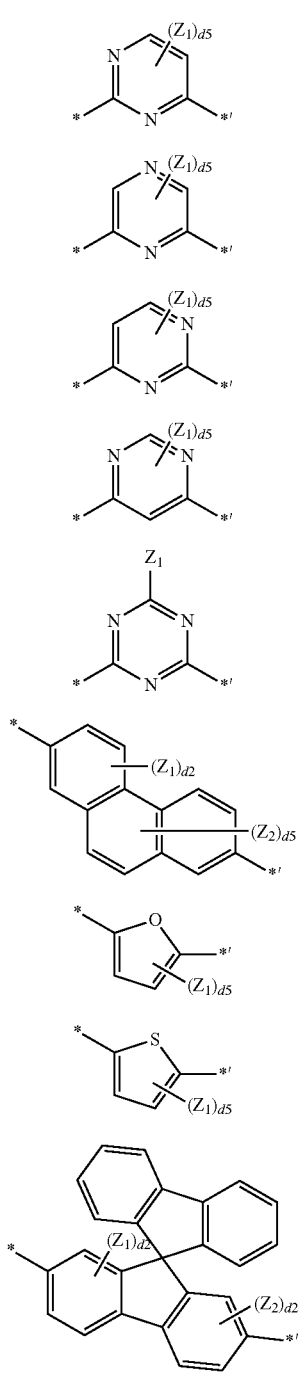

Formula 2-20

Formula 2-21

Formula 2-22

Formula 2-23

Formula 2-24

Formula 2-25

Formula 2-26

Formula 2-27

Formula 2-28

In Formulae 2-1 through 2-28, $Y_1$ may be O, S, $C(Z_3)(Z_4)$, $N(Z_5)$, or $Si(Z_6)(Z_7)$;

$Z_1$ through $Z_7$ may be each independently, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group;

d1 may be an integer from 1 to 4; d2 may be an integer from 1 to 3, d3 may be an integer from 1 to 6; d4 may be an integer from 1 to 8; d5 may be 1 or 2; d6 may be an integer from 1 to 5; each of * and *' may be a binding site for a neighboring atom.

For example, in Formulae 2-1 through 2-28, $Z_1$ through $Z_5$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group; and a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group, but not limited thereto.

In some embodiments, in Formula 1, $L_1$ and $L_2$ may be each independently represented by one of Formulae 3-1 through 3-19 below, but are not limited thereto:

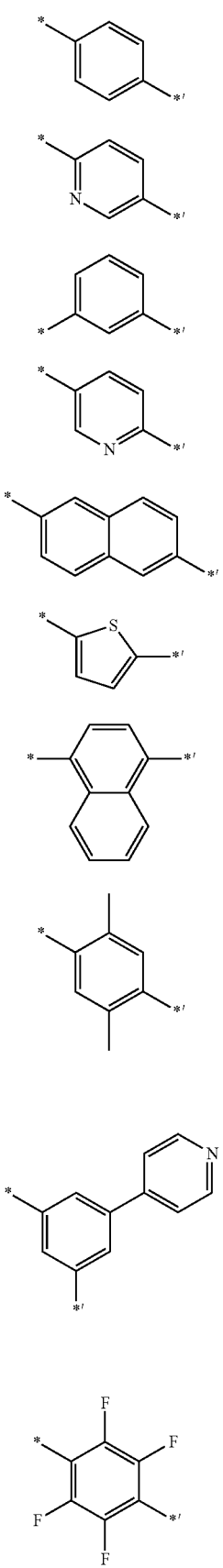
Formula 3-1
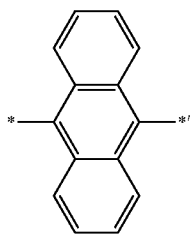
Formula 3-11
Formula 3-2
Formula 3-3
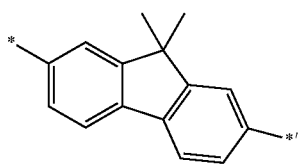
Formula 3-12
Formula 3-4
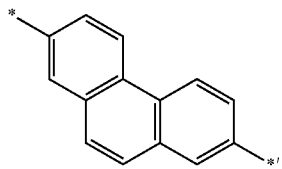
Formula 3-13
Formula 3-5
Formula 3-6
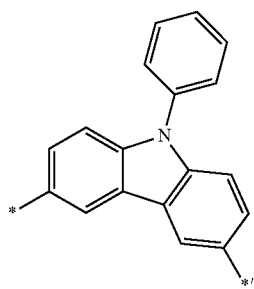
Formula 3-14
Formula 3-7
Formula 3-8
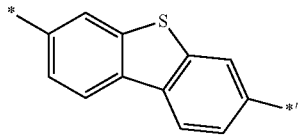
Formula 3-15
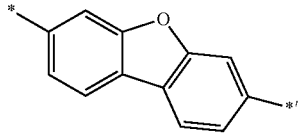
Formula 3-16
Formula 3-9
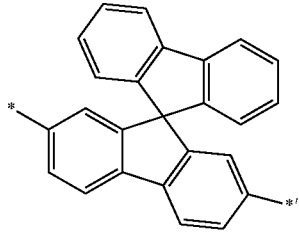
Formula 3-17
Formula 3-10
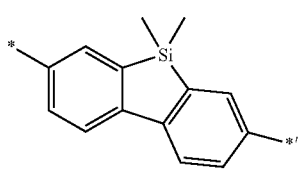
Formula 3-18

Formula 3-19

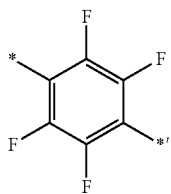

In Formulae 3-1 through 3-19, each of * and *' is a binding site for a neighboring atom.

In Formula 1, a1 and a2 may be each independently an integer from 0 to 3. a1 is the number of $L_1$ (e.g., a1 indicates the number of $L_1$ groups present in Formula 1), and when a1 is 0, a styryl-based group in Formula 1 is directly bonded to an anthracene ring in Formula 1. When a1 is 2 or greater, a1s of $L_1$ may be identical to or different from each other (e.g., each of the $L_1$ groups present may be identical to or different from one another). a2 is the number of $L_2$ (e.g., a2 indicates the number of $L_2$ groups present in Formula 1), and when a2 is 0, a styryl-based group in Formula 1 is directly bonded to a nitrogen in Formula 1. When a2 is 2 or greater, a2s of $L_2$ may be identical to or different from each other (e.g., each of the $L_2$ groups present may be identical to or different from one another). As used herein, the expression "styryl-based group" refers to a group including $L_1$ or $L_2$, as defined in this disclosure, bonded to a substituted or unsubstituted vinylene group.

In some embodiments, in Formula 1, i) a1 may be 0, and a2 may be 1 or 2; ii) a1 may be 1, and a2 may be 1 or 2; or iii) a1 may be 2, and a2 may be 1 or 2.

In Formula 1, $Ar_1$ and $Ar_2$ may be each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group. An and $Ar_2$ may be, optionally, linked to each other to form a saturated or unsaturated ring.

For example, $Ar_1$ and $Ar_2$ may be each independently selected from, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group, substituted with at least one selected from, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group.

For example, in Formula 1, $Ar_1$ and $Ar_2$ may be each independently selected from one of Formulae 5-1 through 5-13 below, but are not limited thereto:

Formula 5-1

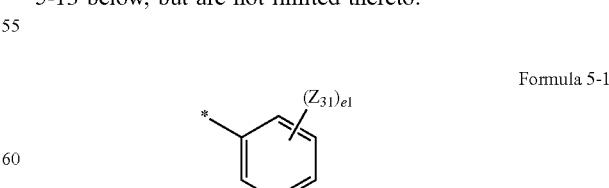

Formula 5-2

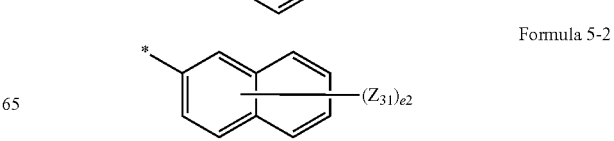

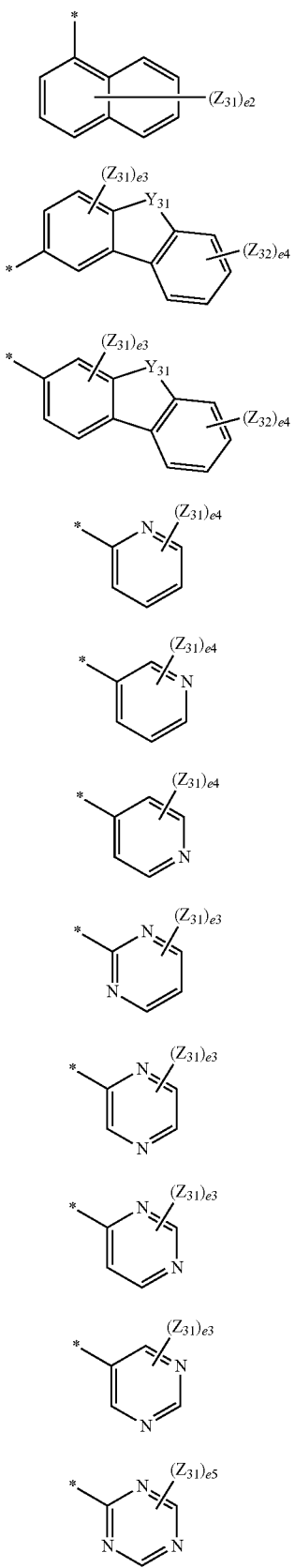

In Formulae 5-1 through 5-13, $Y_{31}$ may be O, S, $C(Z_{33})(Z_{34})$, or $N(Z_{35})$;

$Z_{31}$ through $Z_{35}$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one selected from a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group.

e1 may be an integer from 1 to 5; e2 may be an integer from 1 to 7; e3 may be an integer from 1 to 3; e4 may be an integer from 1 to 4; e5 may be 1 or 2; and * is a binding site for N in Formula 1.

For example, in Formulae 5-1 through 5-13, $Z_{31}$ through $Z_{35}$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group; and a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group, but is not limited thereto.

According to another embodiment of the present invention, $Ar_1$ and $Ar_2$ may be each independently represented by one of Formulae 6-1 through 6-15 below:

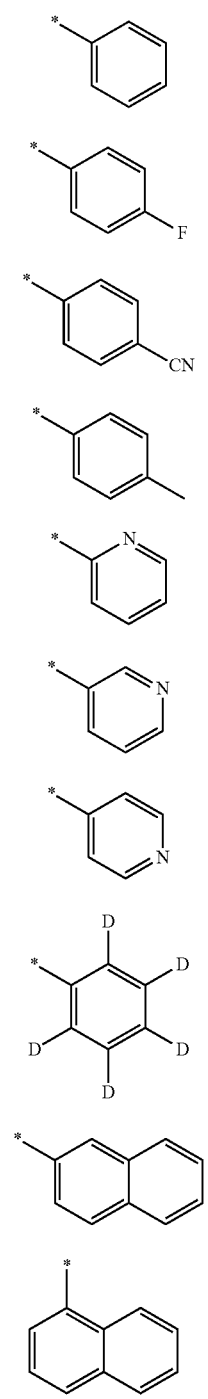

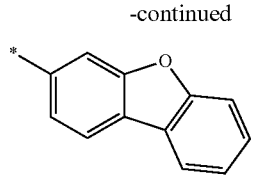

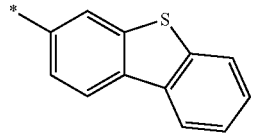

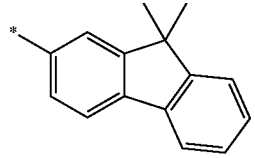

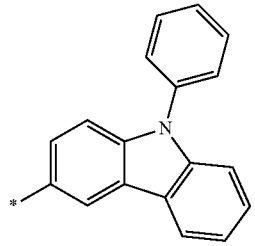

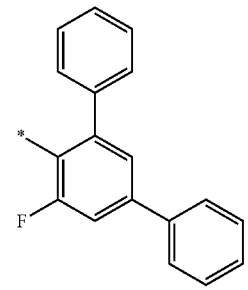

In Formulae 6-1 through 6-15, * is a binding site for N in Formula 1. Also, $Ar_1$ and $Ar_2$ in Formula 1 may be bonded to each other via a single bond or a $C_1$-$C_5$ alkylene group therebetween.

For example, —N($Ar_1$)($Ar_2$) in Formula 1 may be represented by Formula 7-1 below, but is not limited thereto:

Formula 7-1

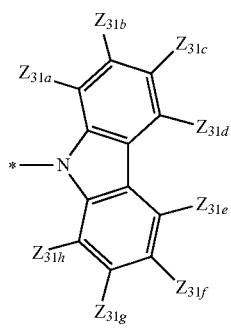

In Formula 7-1, detailed descriptions for $Z_{31a}$ through $Z_{31h}$ may correspond to the detailed description for $Z_{31}$ above.

For example, in Formula 7-1, $Z_{31a}$ through $Z_{31h}$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group;

a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group; and —Si($Q_{13}$)($Q_{14}$)($Q_{15}$) (here, $Q_{13}$ through $Q_{15}$ are each independently selected from a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenyifluorenyl group, a carbazolyl group, a pyridinyl group, a pyrimidinyl group, a pyrazinyl group, a pyridazinyl group, a triazinyl group, a quinolinyl group, and an isoquinolinyl group), but is not limited thereto.

In Formula 1, $R_1$ through $R_3$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —Si($Q_1$)($Q_2$)($Q_3$), and —N($Q_4$)($Q_5$) (here, $Q_1$ through $Q_5$ are each independently selected from a $C_1$-$C_{60}$ alkyl group, a $C_1$-$C_{60}$ alkoxy group, a $C_5$-$C_{60}$ aryl group, and a $C_2$-$C_{60}$ heteroaryl group).

For example, $R_1$ through $R_3$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzolmidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group, substituted with at least one selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group; and —Si($Q_1$)($Q_2$)($Q_3$) and —N($Q_4$)($Q_5$) (here, $Q_1$ through $Q_5$ are each independently selected from a $C_1$-$C_{20}$ alkyl group, a phenyl group, a naphthyl group, and an anthracenyl group).

According to an embodiment of the present invention, in Formula 1, $R_1$ through $R_3$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof;

Formulae 5-1 through 5-13, and Formulae 6-1 through 6-15); and

—Si($Q_1$)($Q_2$)($Q_3$) (here, $Q_1$ through $Q_3$ are each independently selected from a $C_1$-$C_{20}$ alkyl group, a phenyl group, a naphthyl group, and an anthracenyl group), but are not limited thereto.

In Formula 1, b1, b2, and b3 are each independently the number of $R_1$, $R_2$, and $R_3$, respectively (e.g., b1 indicates the number of $R_1$ groups present in Formula 1, b2 indicates the number of $R_2$ groups present, and b3 indicates the number of $R_3$ groups present in Formula 1). b1 in Formula 1 may be an integer from 1 to 7; and b2 and b3 may be each independently an integer from 1 to 4. For example, b1, b2, and b3 may be each independently 1, 2, or 3, but are not limited thereto.

In Formula 1, $R_4$ and $R_5$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{50}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group.

For example, in Formula 1, $R_4$ and $R_5$ may be each independently selected from a hydrogen atom, a deuterium atom, a $C_1$-$C_{20}$ alkyl group, a phenyl group, a naphthyl group, and an anthracenyl group, but are not limited thereto.

In some embodiments, in Formula 1, $R_4$ and $R_5$ may be each independently a hydrogen atom or a deuterium atom.

The styryl-based compound represented by Formula 1 may be represented by Formulae 1A, 1B, or 1C below:

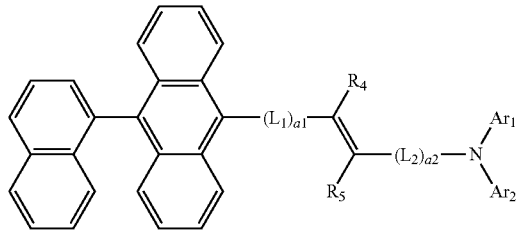

Formula 1A

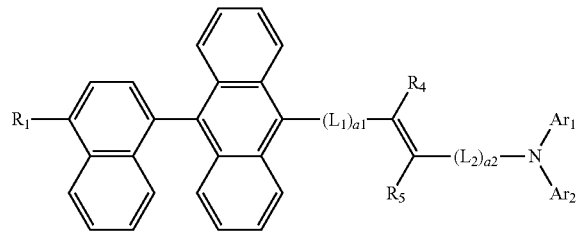

Formula 1B

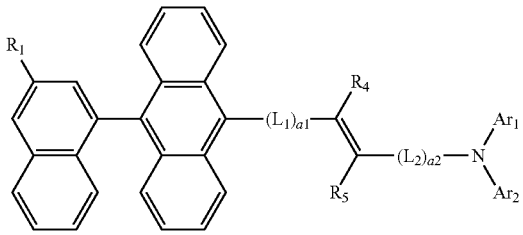

Formula 1C

In Formulae 1A through 1C, detailed descriptions for $L_1$, $L_2$, a1, a2, $Ar_1$, $Ar_2$, $R_1$, $R_4$, and $R_5$ are the same as those above, except that $R_1$ in Formulae 1B and 1C is not a hydrogen atom.

In some embodiments, in Formulae 1A through 1C, $L_1$ and $L_2$ may be represented by one of Formulae 2-1 through 2-28; i) a1 may be 0, and a2 may be 1 or 2, ii) a1 may be 1, and a2 may be 1 or 2, or iii) a1 may be 2, and a2 may be 1 or 2; $Ar_1$ and $Ar_2$ may be each independently selected from Formulae 5-1 through 5-13; and $R_1$ may be selected from i) a hydrogen atom (with the proviso that $R_1$ of Formulae 1B and 1C is not a hydrogen atom), a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{20}$ alkyl group, ii) a $C_1$-$C_{20}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof, iii) Formulae 5-1 through 5-13, and iv) —Si($Q_1$)($Q_2$)($Q_3$) (here, $Q_1$ through $Q_3$ are each independently selected from a $C_1$-$C_{20}$ alkyl group, a phenyl group, a naphthyl group, and an anthracenyl group).

In some embodiments, in Formulae 1A through 1C, $L_1$ and $L_2$ may be each independently represented by one of Formulae 2-1 through 2-28; i) a1 may be 0, and a2 may be 1 or 2, ii) a1 may be 1, and a2 may be 1 or 2, or iii) a1 may be 2, and a2 may be 1 or 2; —N($Ar_1$)($Ar_2$) may be represented by Formula 7-1; and $R_1$ may be selected from i) a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{20}$ alkyl group, ii) a $C_1$-$C_{20}$ alkyl group substituted by at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof, iii) Formulae 5-1 through 5-13, and iv) —Si($C_1$)($Q_2$)($Q_3$) (here, $Q_1$ through $Q_3$ are each independently, a $C_1$-$C_{20}$ alkyl group, a phenyl group, a naphthyl group, and an anthracenyl group).

In some embodiments, in Formulae 1A through 1C, $L_1$ and $L_2$ may be each independently represented by one of Formulae 3-1 through 3-19; i) a1 may be 0, and a2 may be 1 or 2, ii) a1 may be 1, and a2 may be 1 or 2, or iii) a1 may be 2, and a2 may be 1 or 2; $Ar_1$ and $Ar_2$ may be each independently selected from Formulae 6-1 through 6-15; and $R_1$ may be selected from i) a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{20}$ alkyl group, ii) a $C_1$-$C_{20}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof, iii) Formulae 6-1 through 6-16, and iv) —Si($C_1$)($Q_2$)($Q_3$) (here, $Q_1$ through $Q_3$ are each independently selected from a $C_1$-$C_{20}$ alkyl group, a phenyl group, a naphthyl group, and an anthracenyl group).

In some embodiments, in Formulae 1A through 1C, $L_1$ and $L_2$ may be each independently represented by one of Formulae 3-1 through 3-19; i) a1 may be 0, and a2 may be 1 or 2, ii) a1 may be 1, and a2 may be 1 or 2, or iii) a1 may be 2, and a2 may be 1 or 2; —N($Ar_1$)($Ar_2$) may be represented by Formula 7-1; and $R_1$ may be selected from i) a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{20}$ alkyl group, ii) a $C_1$-$C_{20}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, iii) Formulae 6-1 through 6-15, and iv) —Si($Q_1$)($Q_2$)($Q_3$) (here, $Q_1$ through $Q_3$ are each independently selected from a $C_1$-$C_{20}$ alkyl group, a phenyl group, a naphthyl group, and an anthracenyl group).

The styryl-based compound may be one of Compounds 1 through 78 below, but is not limited thereto:

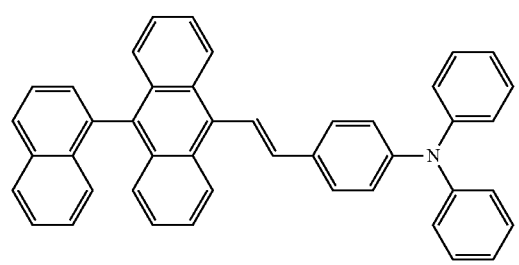

1

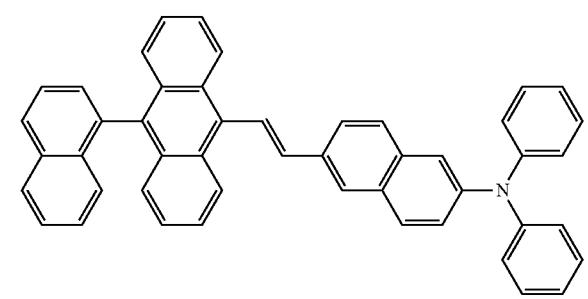

2

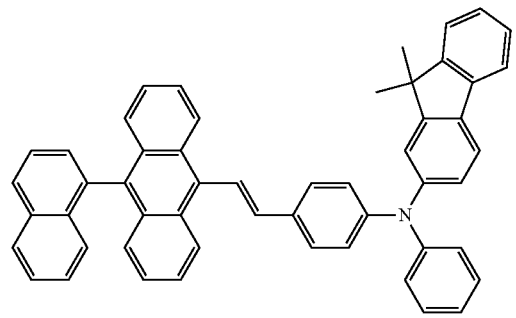

3

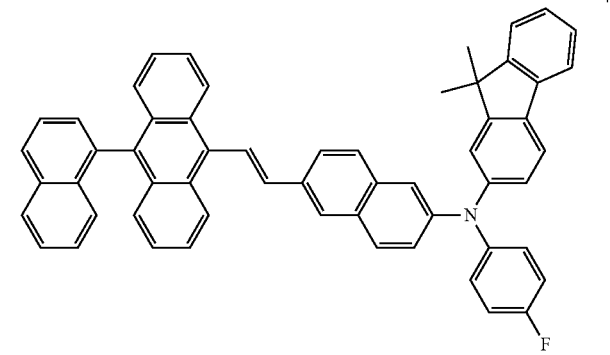

4

-continued
5
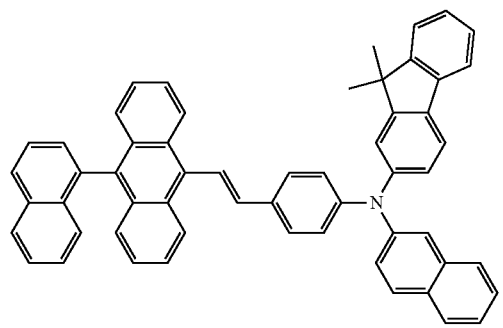
6
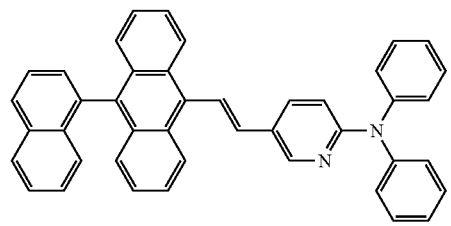
7
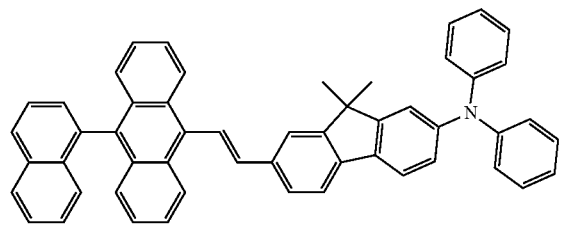
8
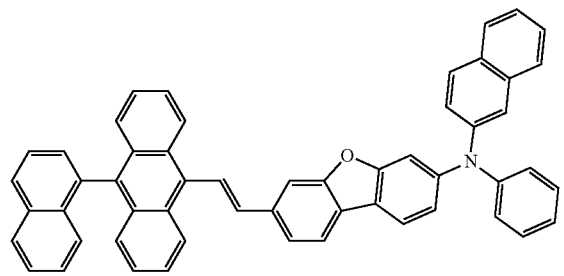
9
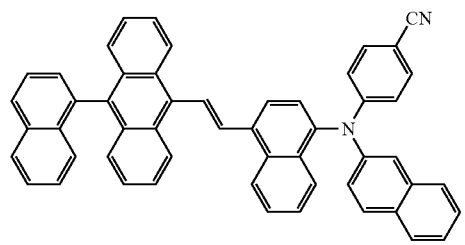
10
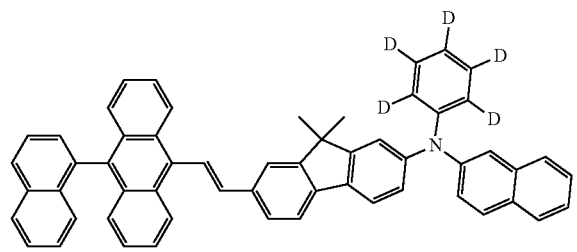
11
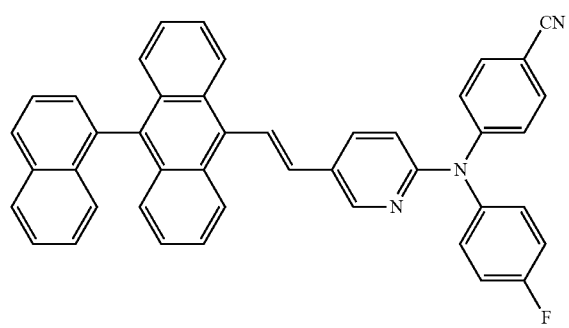
12
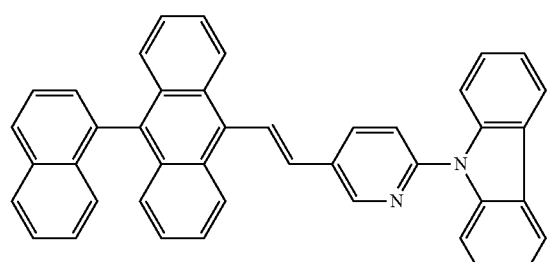
13
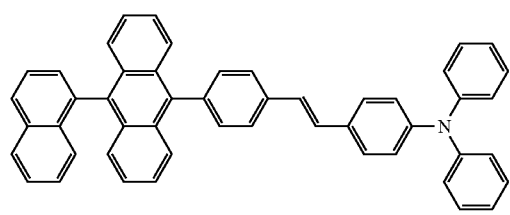
14
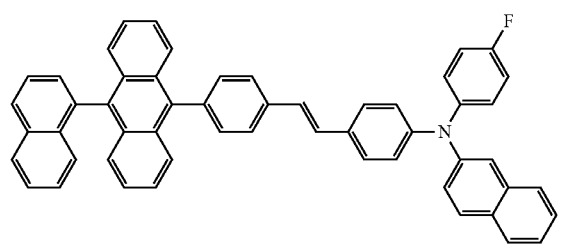

-continued
15
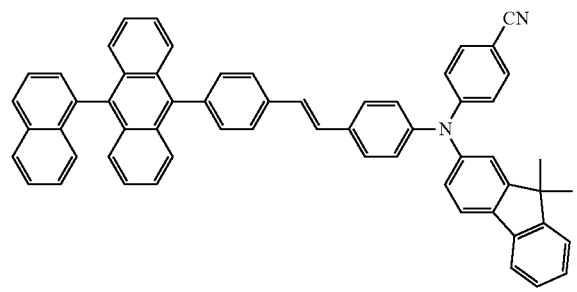
16
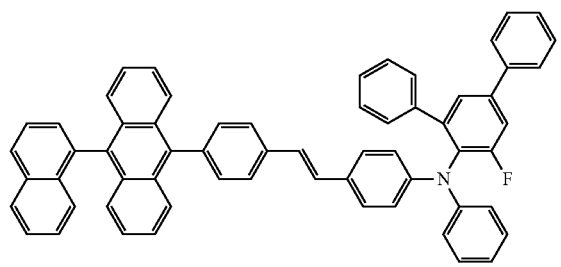
17
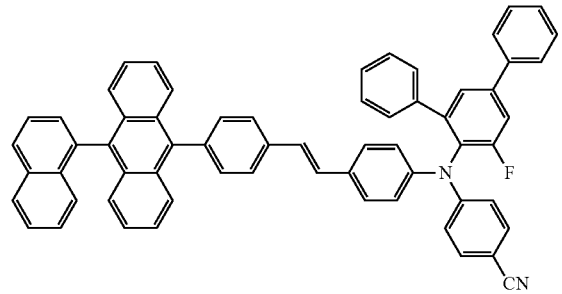
18
19
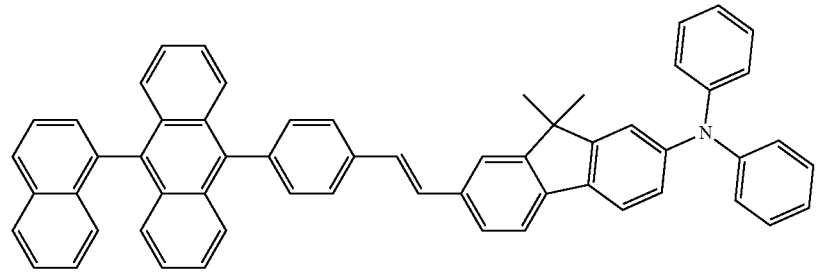
20
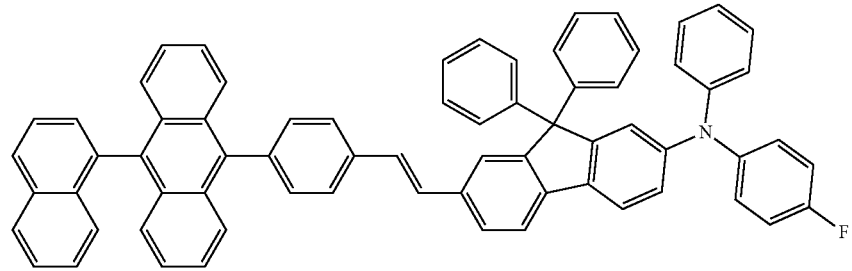
21
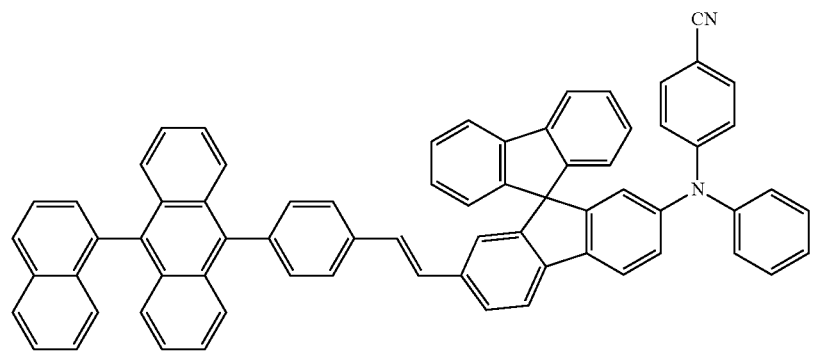

-continued
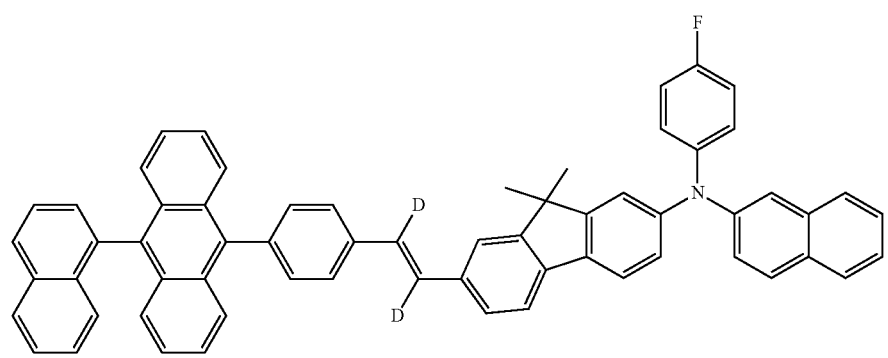
22
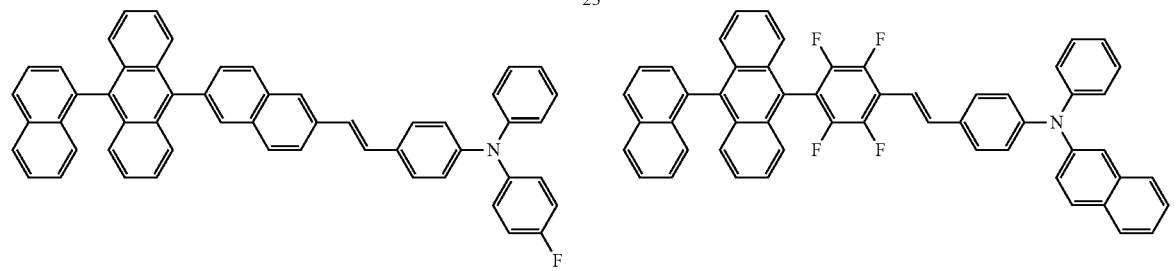
23
24
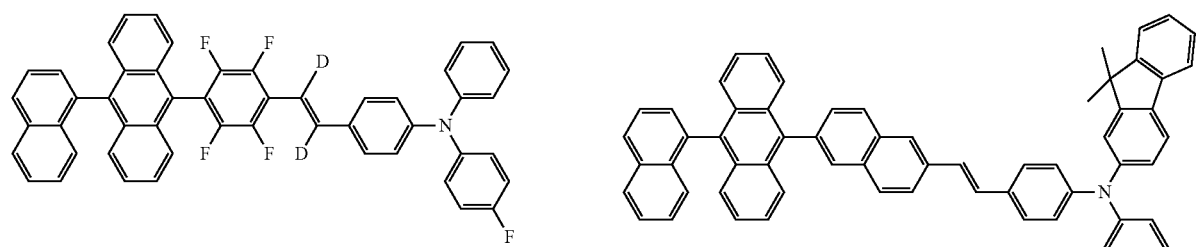
25
26
27
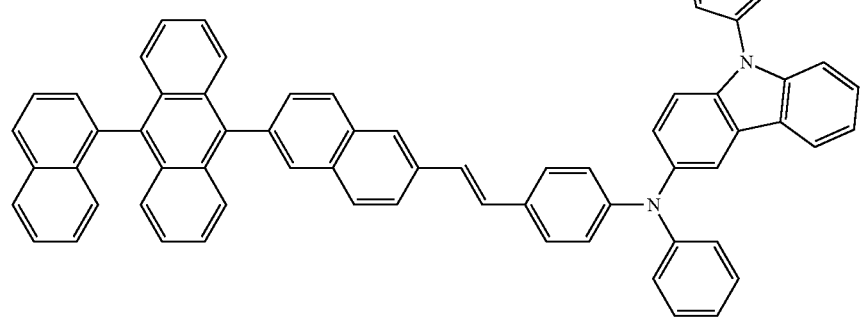
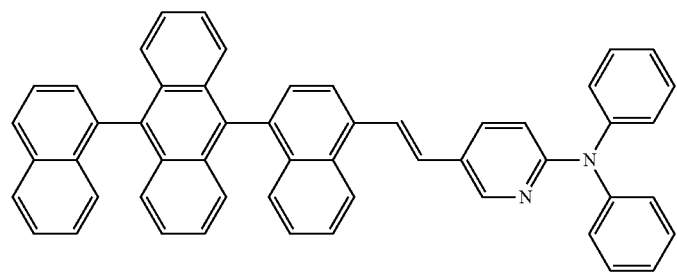
28

29
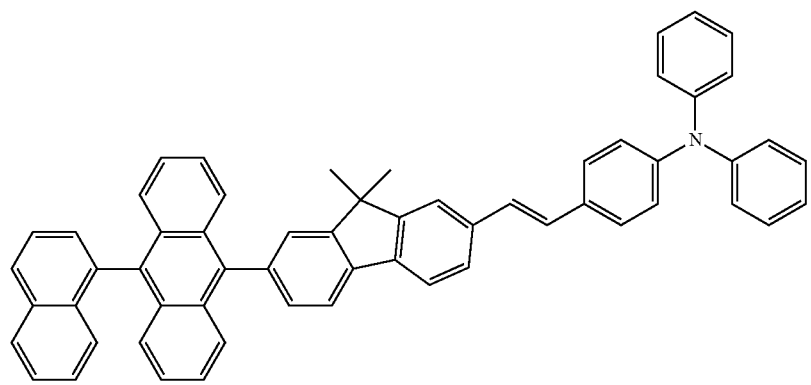
30
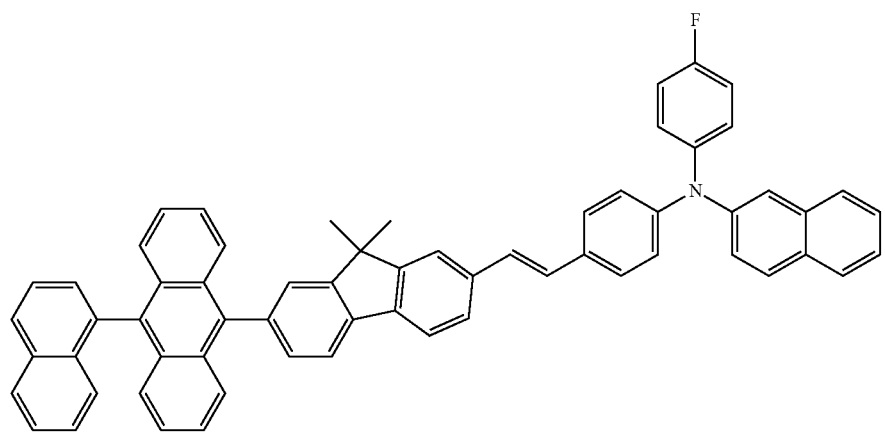
31
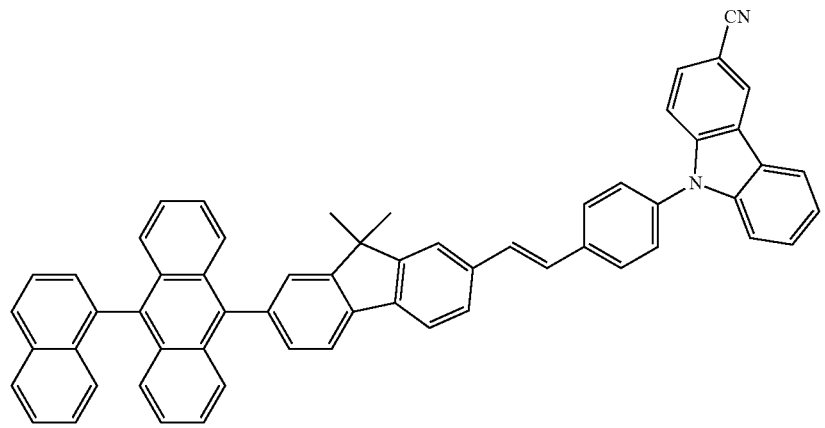

-continued
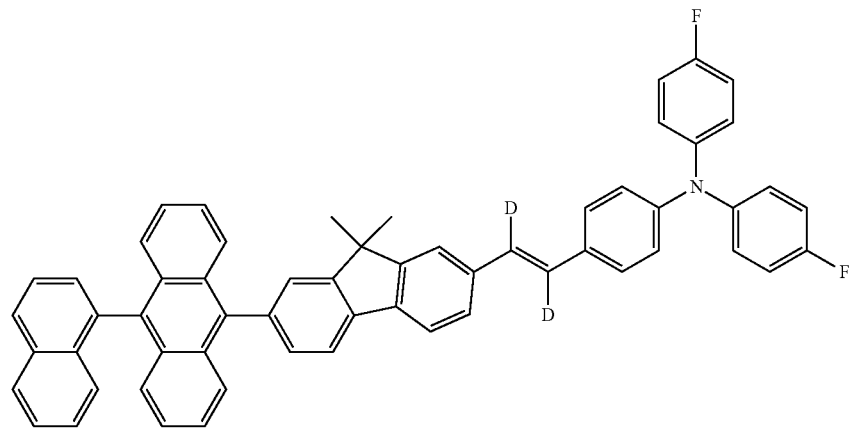
32
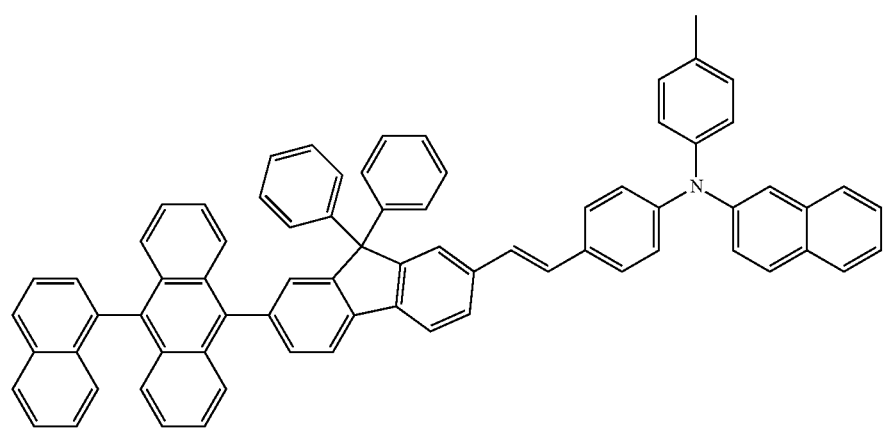
33
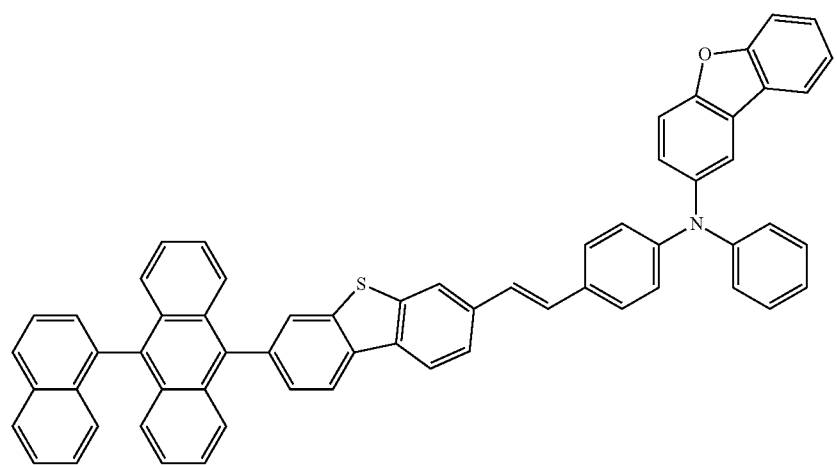
34

35
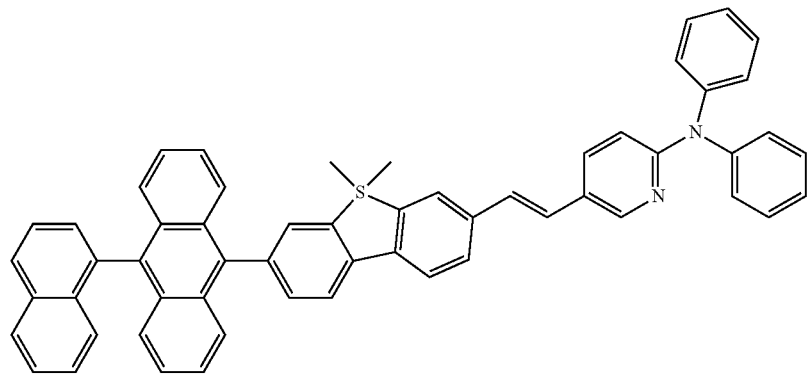
36
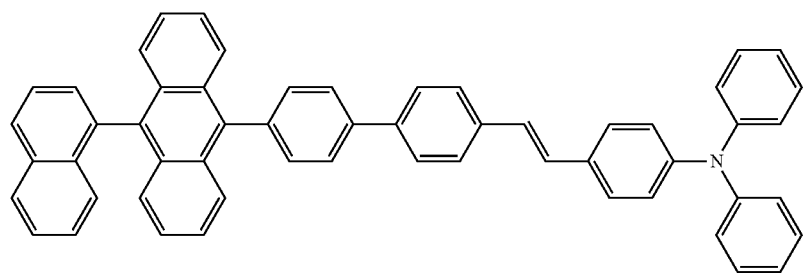
37
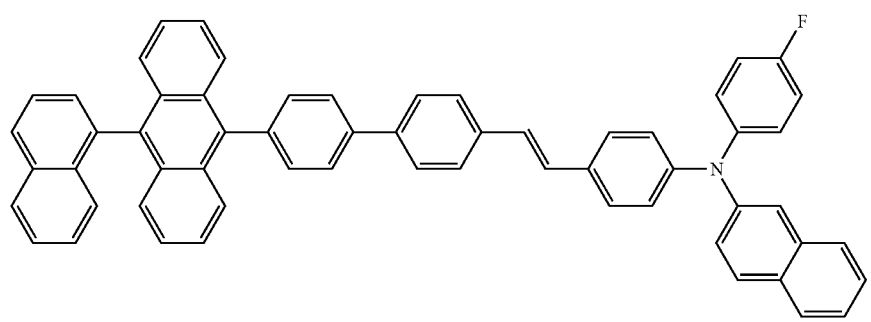
38
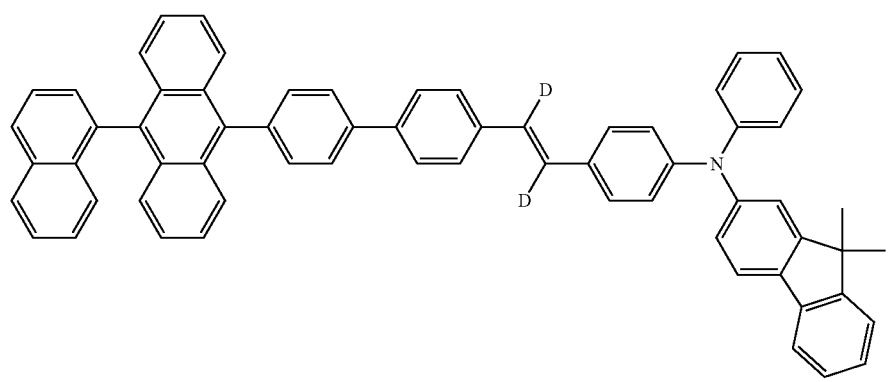
39
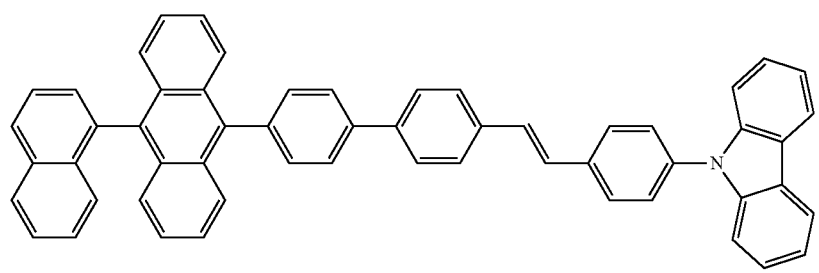

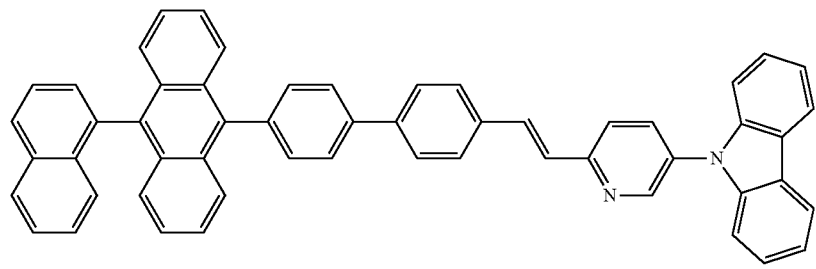
40
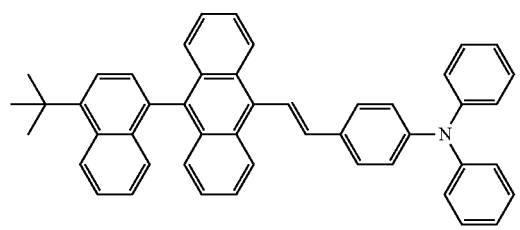
41
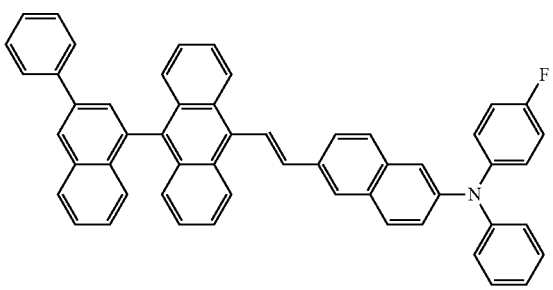
42
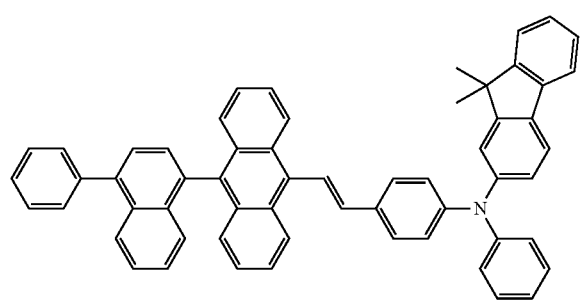
43
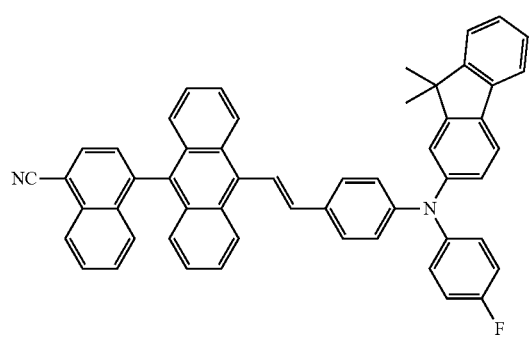
44
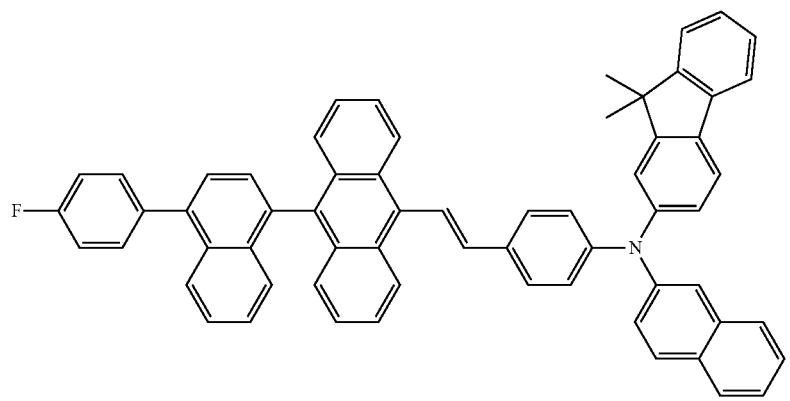
45

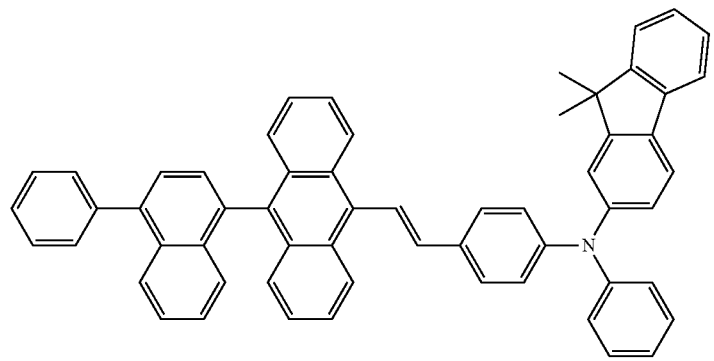
46
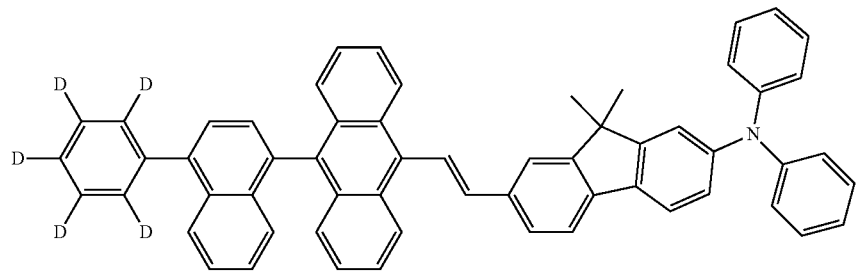
47
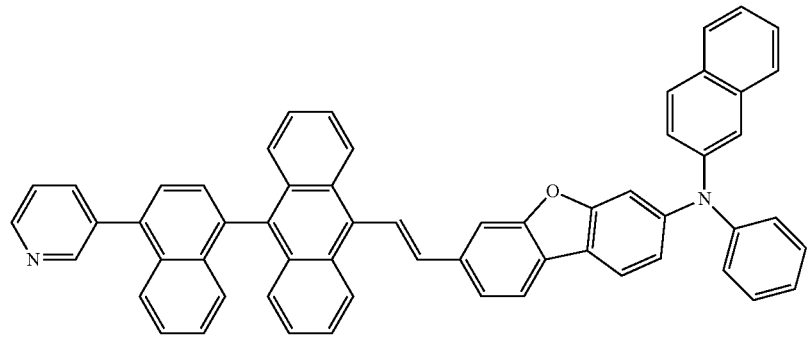
48
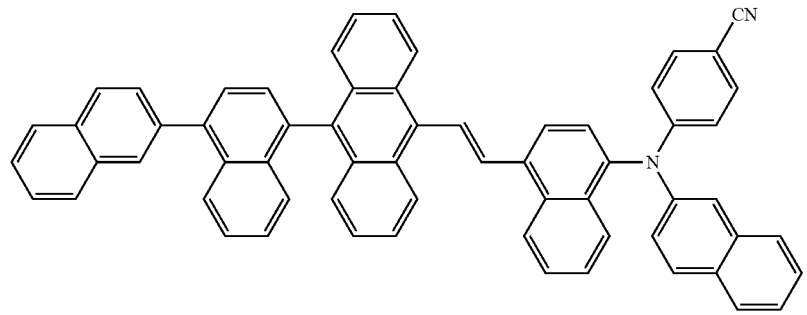
49
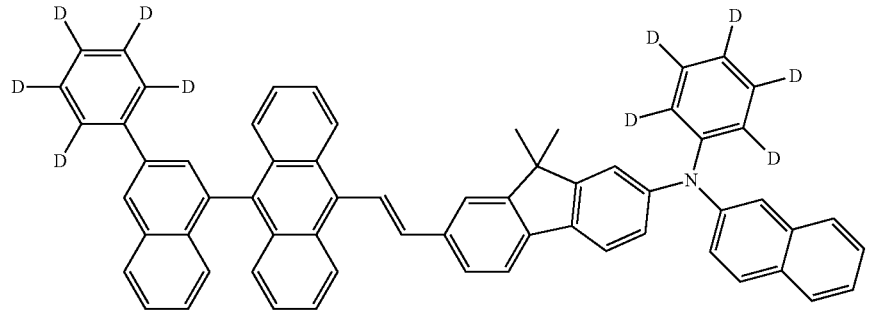
50

51
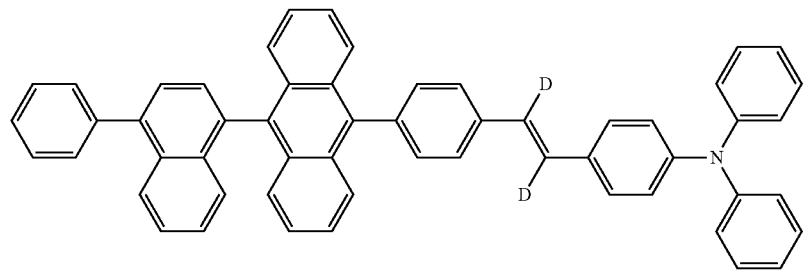
52
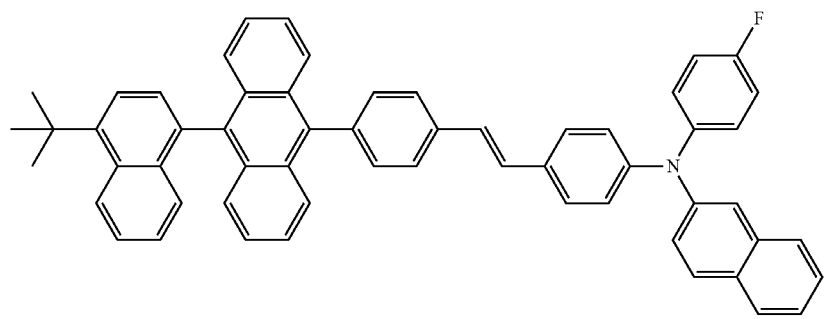
53
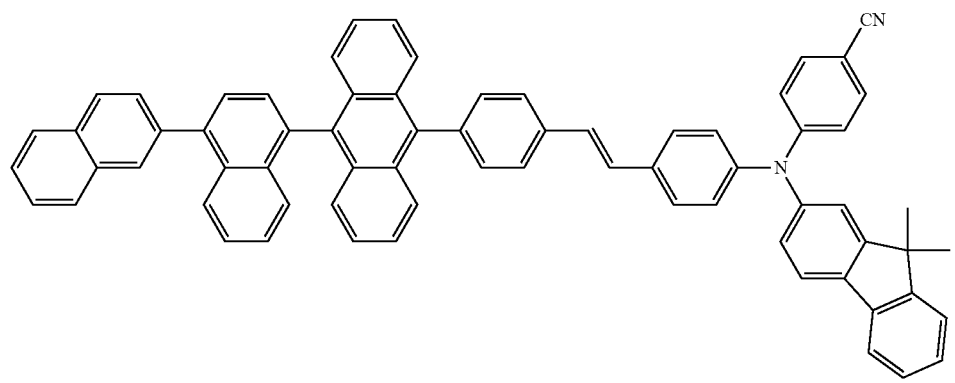
54
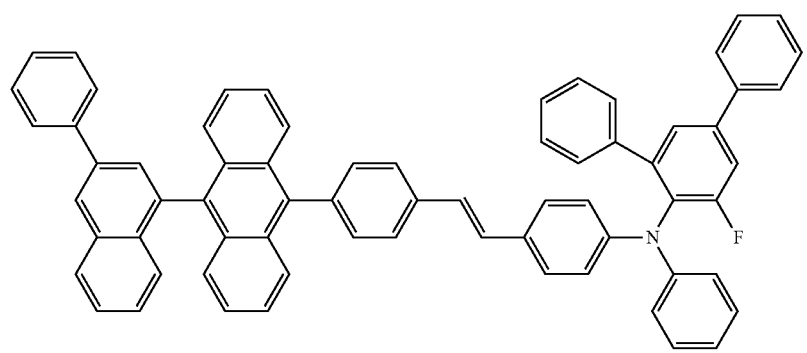

55
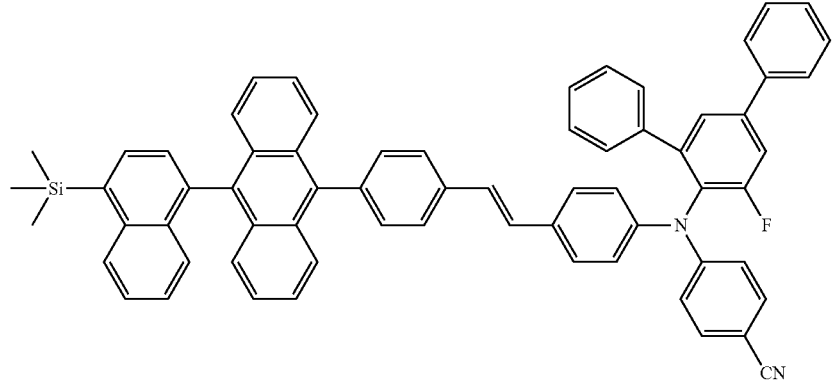
56
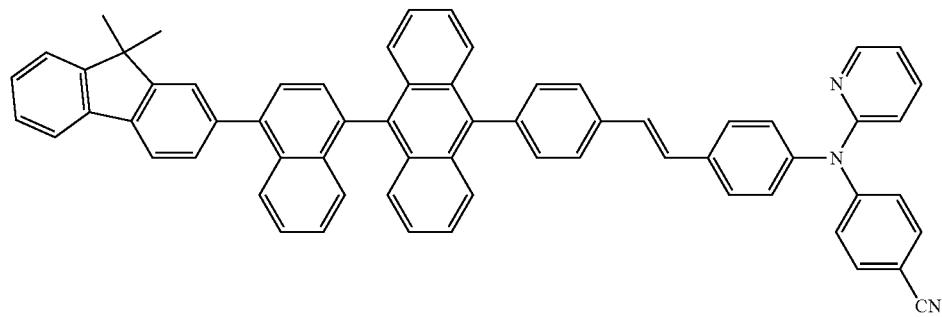
57
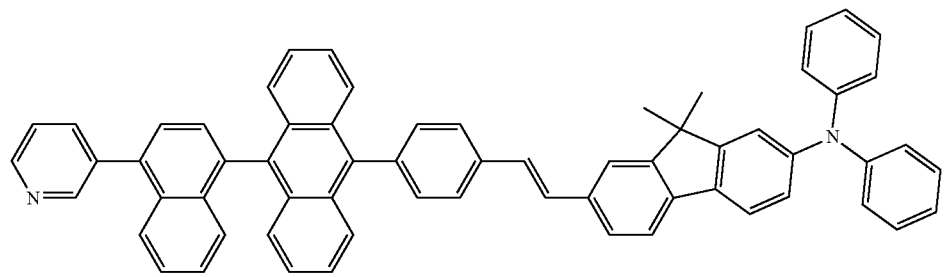
58
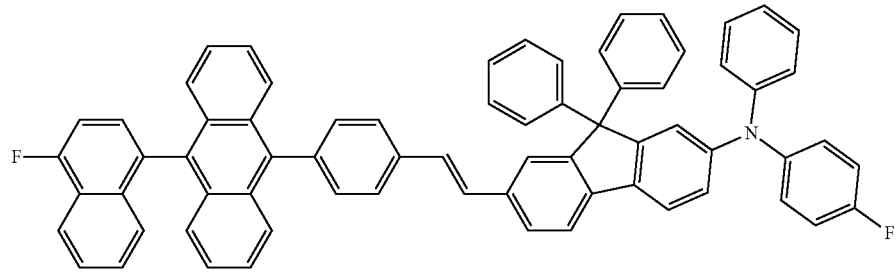
59
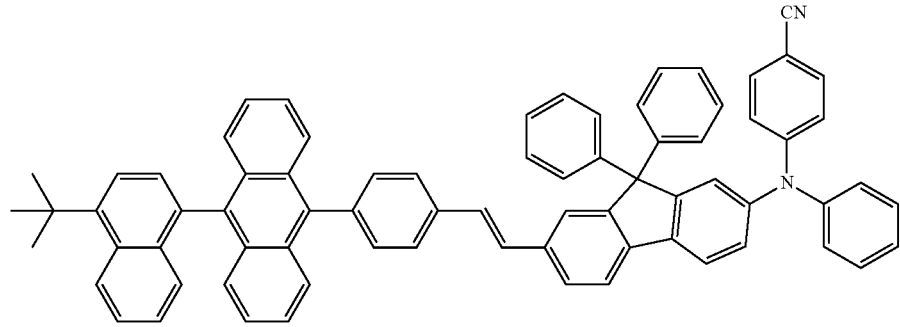

60
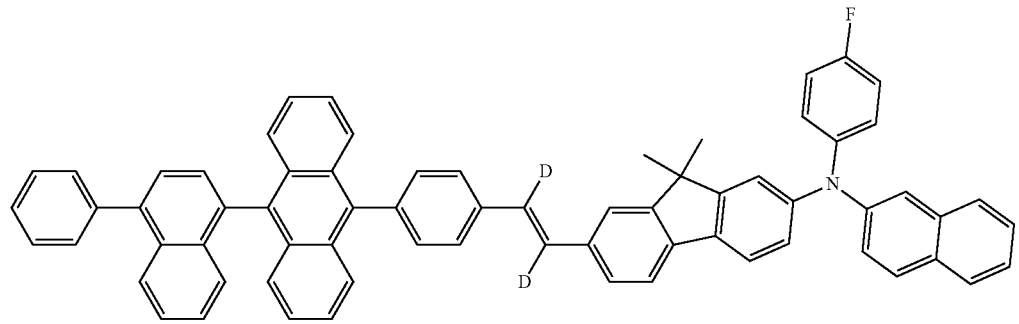
61
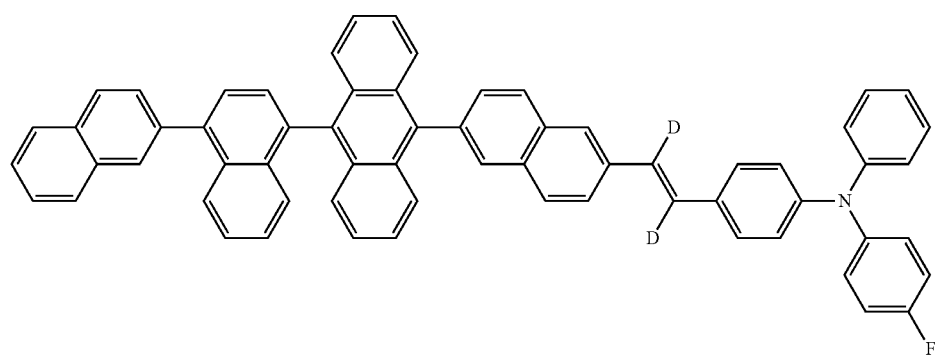
62
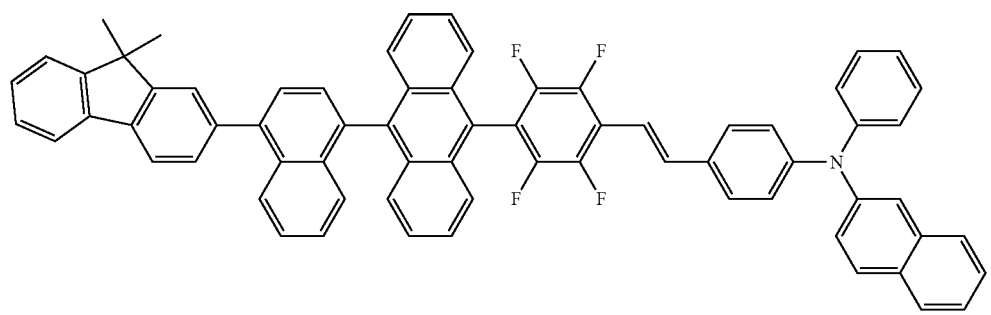
63
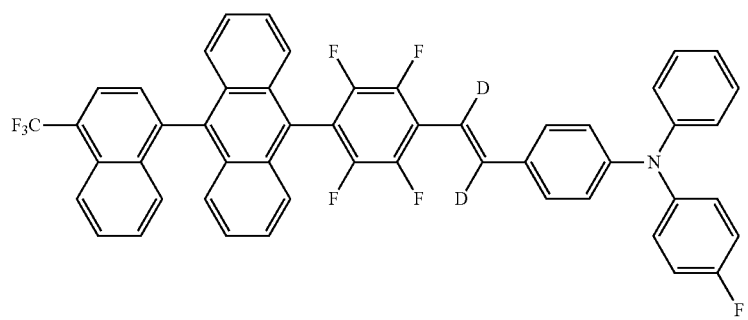

64
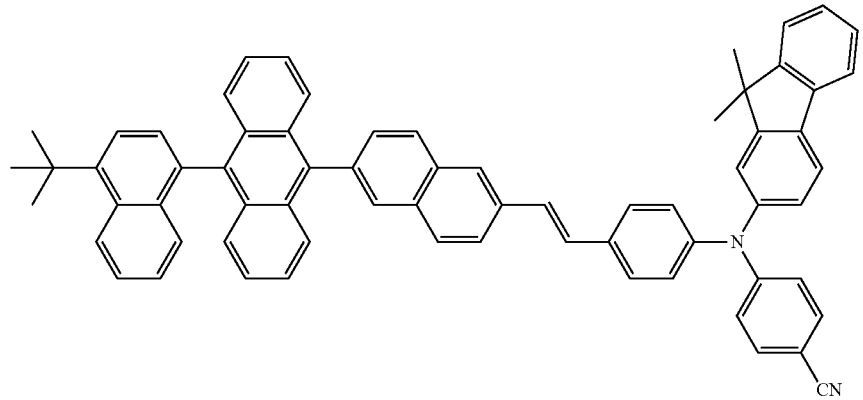
65
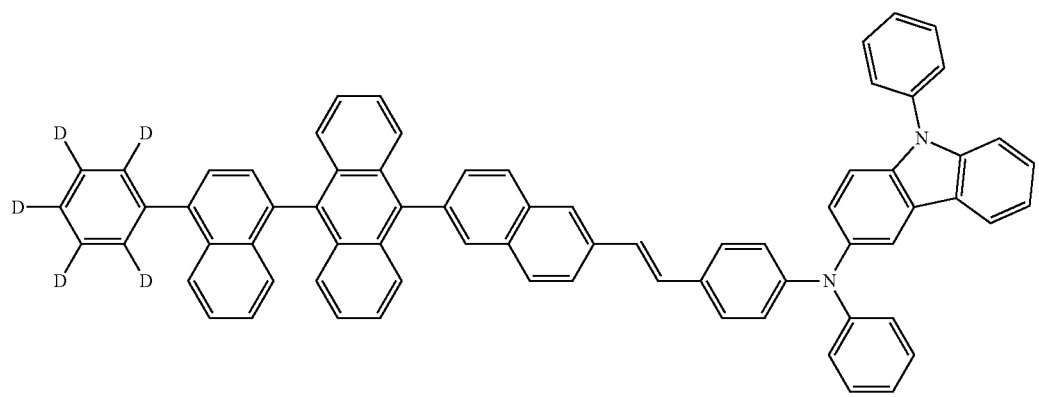
66
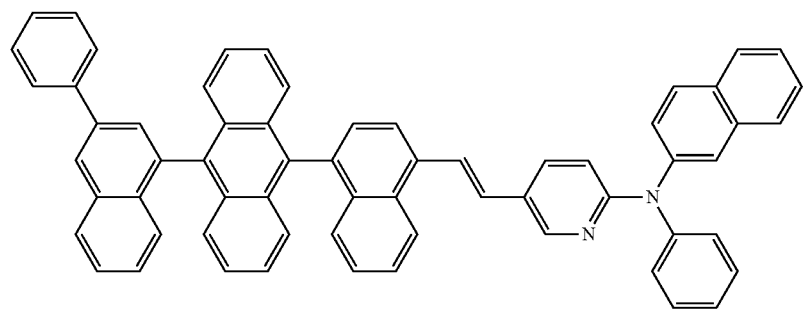
67
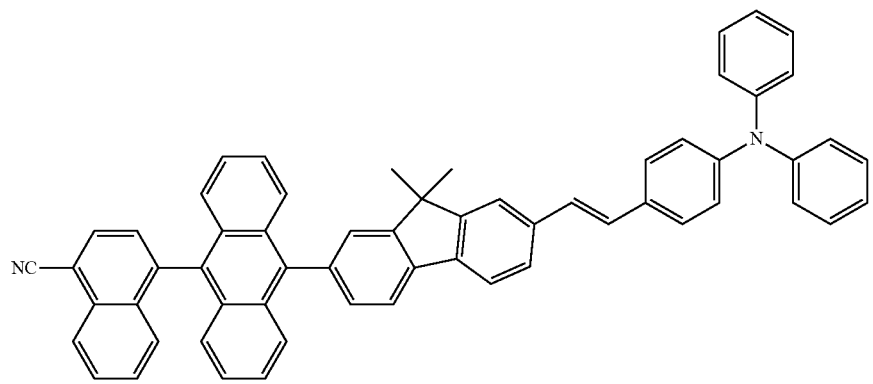

68
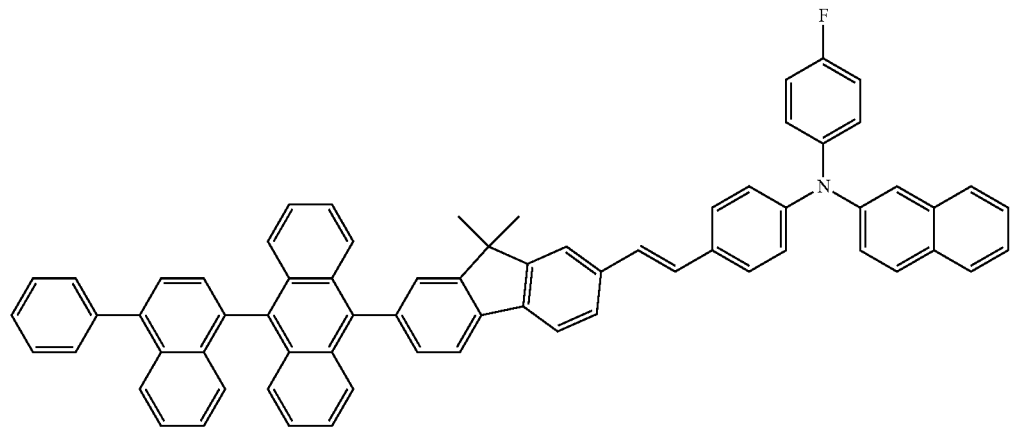
69
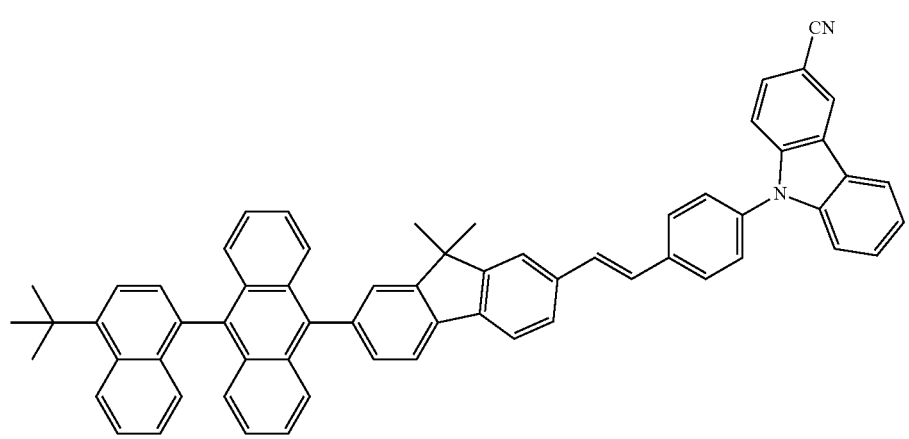
70
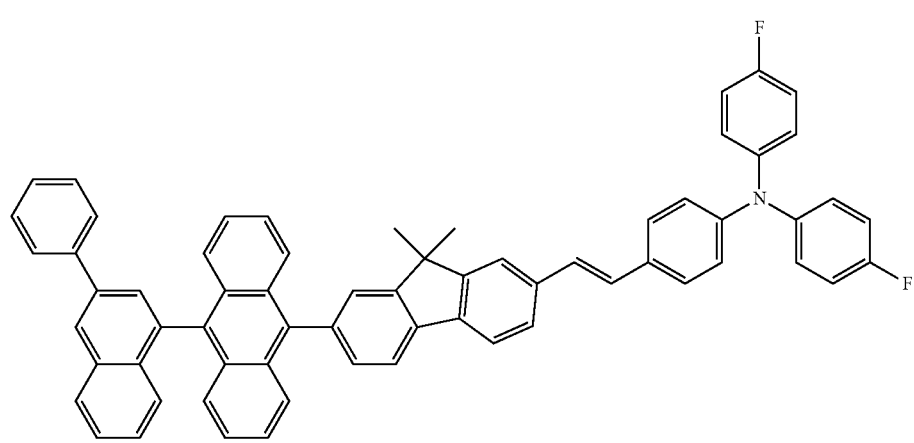

-continued
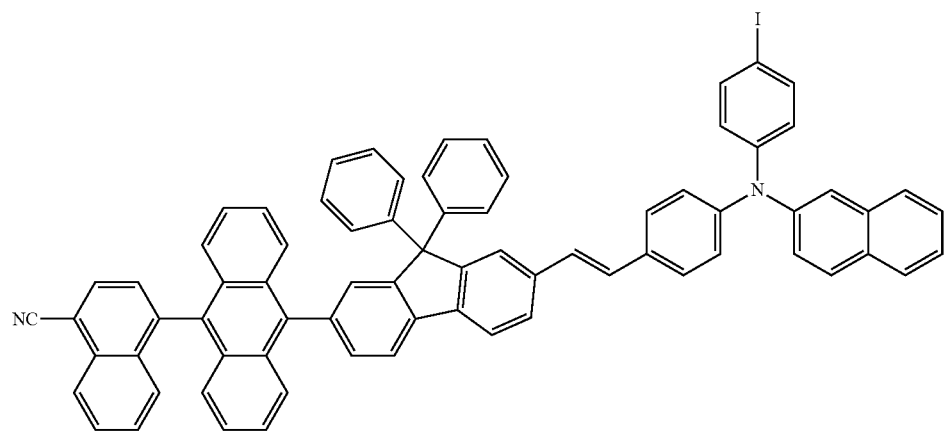
71
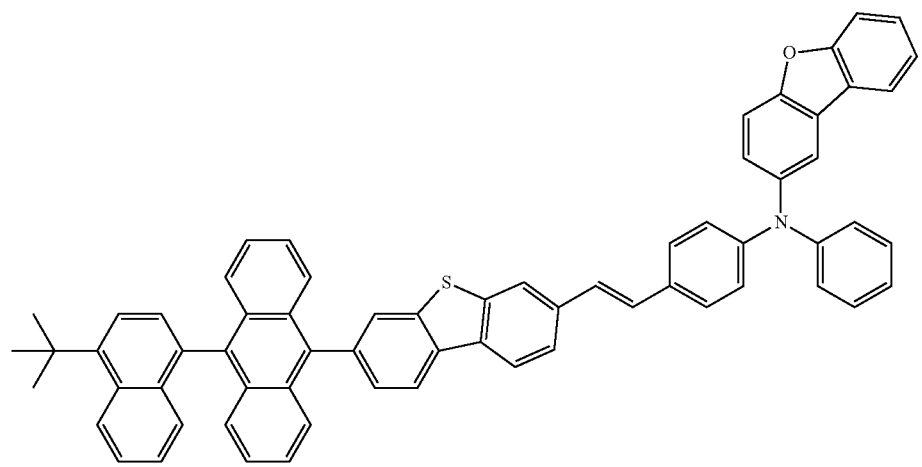
72
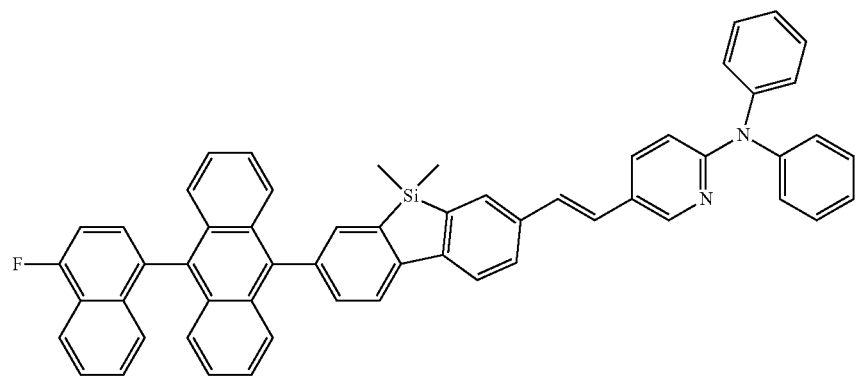
73
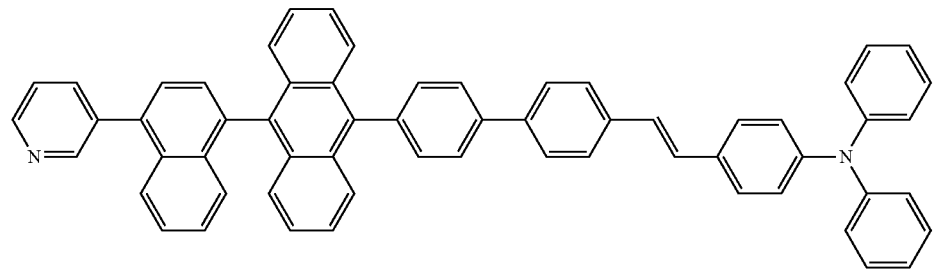
74

-continued

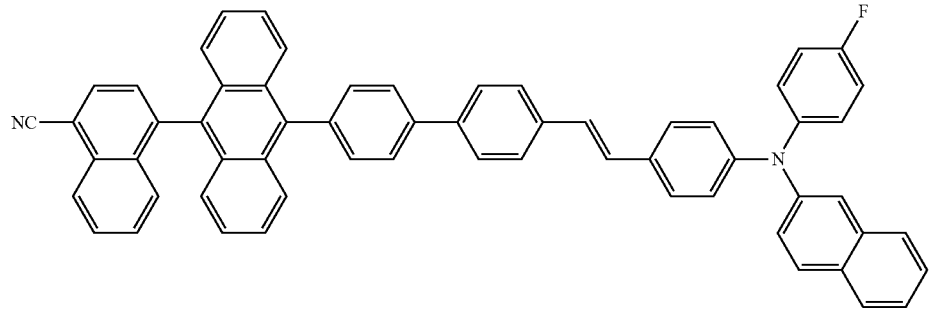

75

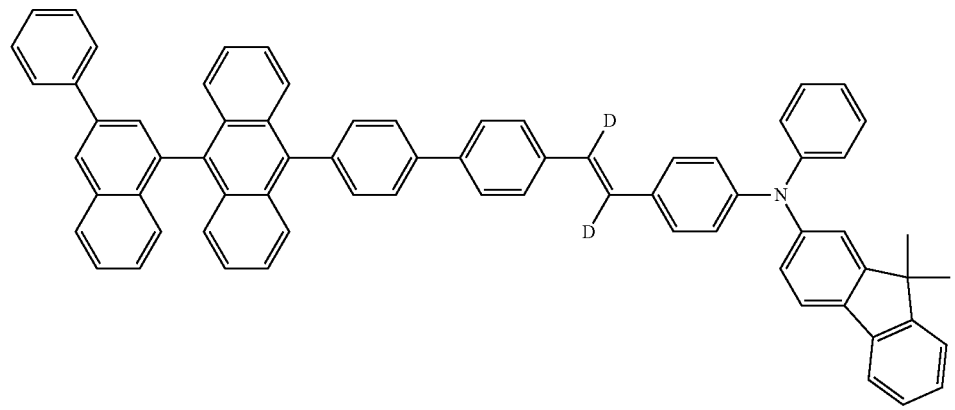

76

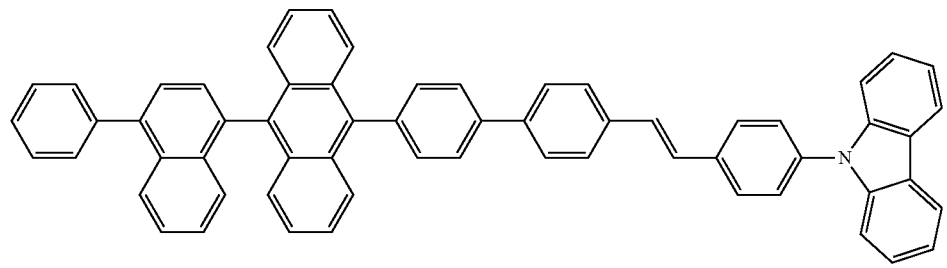

77

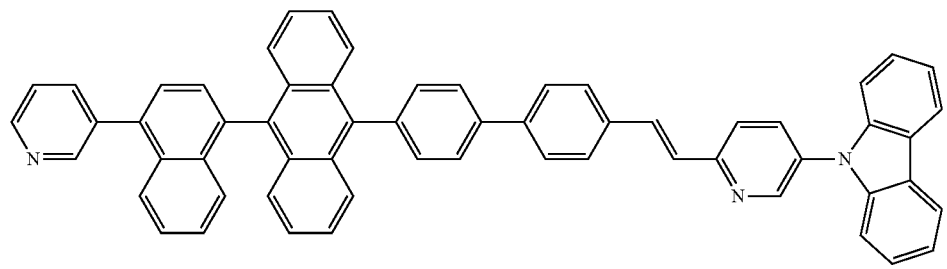

78

In Formula 1, an anthracene ring that is substituted with a 1-naphthyl group is bonded to an amino group via a styryl-based group therebetween. Here, a linking group $L_1$ may be optionally exist (e.g., be present) between the anthracene ring and the styryl-based group in Formula 1, and $L_2$ may be optionally exist (e.g., be present) between the styryl-based group and the amino group.

Since the 1-naphthyl group may be substituted in the anthracene ring in Formula 1, stacking between molecules of the compound represented by Formula 1 may be reduced due to a 3D structural (e.g., steric) repulsion between molecules (e.g., a stacking distance between the molecules may be increased), and thus a wavelength interference effect between the molecules may be reduced. For example, a virtual (e.g., prophetic) compound having the same structure as the styryl-based compound represented by Formula 1, except that a 2-naphthyl group is substituted in the virtual compound instead of a 1-naphthyl group (e.g., see Compound A of Comparative Example 2 below), may emit long-wavelength light and have a low blue light-emitting efficiency due to the wavelength interference between the molecules as a result of the closer packing or stacking of the molecules (as compared to the styryl-based compound).

Also, since Formula 1 includes the styryl-based group and the amino group as well as the anthracene ring that is substituted with a 1-naphthyl group at the same time, the compound of Formula 1 may have excellent pi-conjugation characteristics and thus may provide a high light-emitting efficiency. For example, a virtual (e.g., prophetic) compound having the same structure with the styryl-based compound represented by Formula 1, except that the virtual compound does not include one of the styryl-based group and the amino group (e.g., see Compound B of Comparative Example 3 and Compound C of Comparative Example 4 below) may have a lower light-emitting efficiency (e.g., a low light-emitting efficiency).

Therefore, an organic light-emitting diode (OLED) including the styryl-based compound represented by Formula 1 may have excellent color purity characteristics as well as low driving voltage, high efficiency, high brightness, and long lifetime.

According to embodiments of the present invention, the styryl-based compound having Formula 1 may be synthesized by using a known organic synthesis method. Embodiments of the synthesis method of the styryl-based compound may be easily understood by one of ordinary skill in the art with reference to the Examples herein, which will be described later.

The styryl-based compound of Formula 1 may be used between a pair of electrodes of an OLED. For example, the styryl-based compound of Formula 1 may be used in an emission layer (EML).

Thus, according to embodiments of the present invention there is provided an OLED including a first electrode, a second electrode facing the first electrode, and an organic layer disposed between the first electrode and the second electrode, wherein the organic layer includes at least one of the styryl-based compounds of Formula 1 described above. Here, the organic layer includes a hole transporting region between the first electrode and the EML, and an electron transporting region between the EML and the second electrode. The styryl-based compound may be included in the EML.

As used herein, the expression "(the organic layer) may include at least one of the styryl-based compounds of Formula 1" may be understood as "(the organic layer) may include one of the styryl-based compounds represented by Formula 1 or at least two different compounds selected from the styryl-based compounds represented by Formula 1".

For example, the organic layer may include only Compound 3 as the styryl-based compound. In this regard, Compound 3 may be included in an EML of the OLED. Also, the organic layer may include Compound 3 and Compound 19 as the styryl-based compound. In this regard, Compounds 3 and 19 may be included in the same layer (e.g., in an EML) or in different layers.

The hole transporting region of the organic layer may include at least one of a hole injection layer (HIL), a hole transport layer (HTL), a functional layer having hole injection and transport abilities (hereinafter, referred to as "H-functional layer"), a buffer layer, and an electron blocking layer (EBL), and the electron transporting region of the organic layer may include at least one of a hole blocking layer (HBL), an electron transport layer (ETL), and an electron injection layer (EIL).

As used here, the term "organic layer" refers to a single layer and/or multiple layers disposed between the first electrode and the second electrode.

FIG. 1 is a schematic cross-sectional view of an OLED 10 according to an embodiment of the present invention. Hereinafter, a structure and a manufacturing method of an OLED will be described in more detail with reference to FIG. 1.

A substrate 11 may be a substrate used in a general OLED, and may be a glass substrate or a transparent plastic substrate having excellent mechanical strength, thermal stability, transparency, surface smoothness, ease of handling, and waterproofness.

A first electrode 13 may be formed by applying a first electrode material on the substrate 11 by deposition or sputtering. When the first electrode 13 is an anode, the first electrode material may be selected from materials having a high work function so as to facilitate hole injection. The first electrode 13 may be a reflective electrode or a transparent electrode. Examples of the first electrode material may include indium-tin oxide (ITO), indium-zinc-oxide (IZO), tin oxide ($SnO_2$), and zinc oxide (ZnO). Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 13 may be formed as a reflective electrode.

The first electrode 13 may be formed as a single layer or have a multi-layered structure having at least two layers. For example, the first electrode 13 may have a three-layered structure, e.g., ITO/Ag/ITO, but is not limited thereto.

An organic layer 15 is formed on the first electrode 13.

The organic layer 15 may include a hole transporting region sequentially including a HIL and a HTL; and an electron transport region sequentially including an ETL and an EIL.

The HIL may be formed on the first electrode 13 by using various methods such as vacuum deposition, spin coating, casting, or LB deposition.

When the HIL is formed by vacuum deposition, the deposition conditions may vary according to a compound used as a material for forming the HIL and a structure and thermal characteristics of a desired HIL. For example, the deposition condition may be, but is not limited to, a deposition temperature in a range of about 100 to about 500° C., a degree of vacuum in a range of about $10^{-8}$ to about $10^{-3}$ torr, and a deposition speed in a range of about 0.01 to about 100 Å/sec.

When the HIL is formed by spin coating, the coating condition may vary according to a compound used as a material for forming the HIL, a structure of a desired HIL, and thermal characteristics. For example, the coating condition may be, but is not limited to, a coating speed in a range of about 2,000 to about 5,000 rpm and a heat treatment temperature for removing a solvent after coating in a range of about 80 to about 200° C.

The material for forming the HIL may be a known hole injection material. Examples of the known hole injection material include, but are limited to, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), and polyaniline/poly(4-styrenesulfonate) (PANI/PSS):

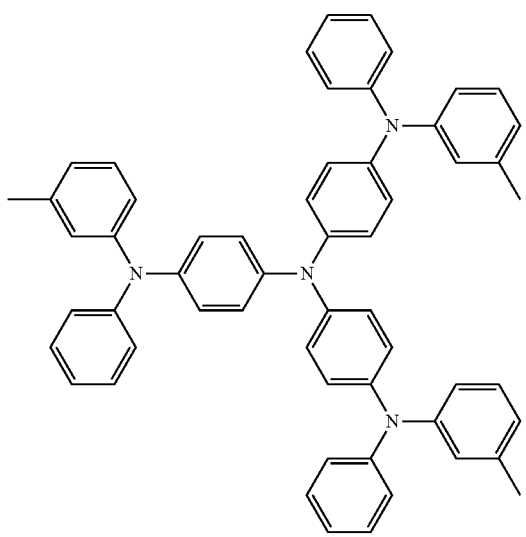

m-MTDATA

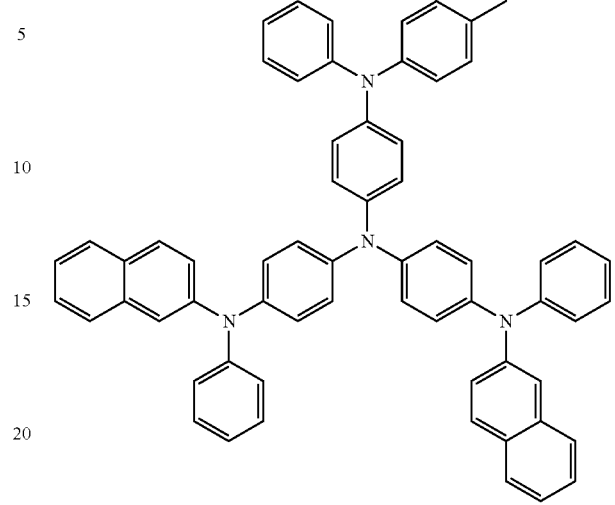

2-TNATA

The thickness of the HIL may be in a range of about 100 Å to about 10,000 Å, for example, in a range of about 100 Å to about 1,000 Å. When the thickness of the HIL is within either of the foregoing ranges, satisfactory hole injection properties may be obtained without a substantial increase in driving voltage.

Next, an HTL may be formed on the HIL by using various methods such as vacuum deposition, spin coating, casting, or LB deposition. When the HTL is formed by vacuum deposition or spin coating, the deposition and coating conditions vary according to a compound used for the HTL. However, in general, the condition may be almost the same (e.g., substantially the same) as the condition for forming the HIL.

Examples of a material for forming the HTL include, but not limited to, carbazole derivatives such as N-phenylcarbazole and polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine (NPB).

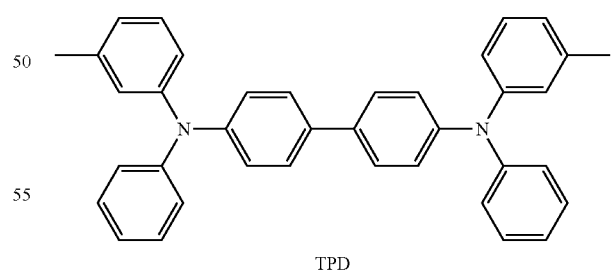

TPD

The thickness of the HTL may be in a range of about 50 Å to about 2,000 Å, for example, in a range of about 100 Å to about 1,500 Å. When the thickness of the HTL is within either of the foregoing ranges, satisfactory hole transport properties may be obtained without a substantial increase in driving voltage.

The OLED 10 may include a H-functional layer, instead of the HIL and the HTL. At least one of the hole injection

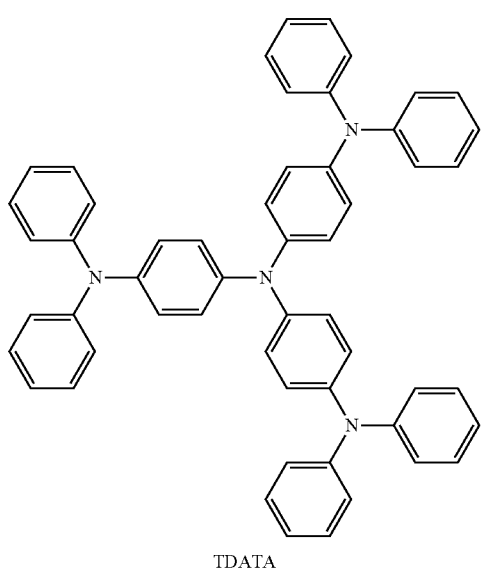

TDATA material and the hole transporting material described above may be included in the H-functional layer. The thickness of the H-functional layer may be in a range of about 100 Å to about 10,000 Å, for example, in a range of about 100 Å to about 1,000 Å. When the thickness of the H-functional layer is within either of the foregoing ranges, satisfactory hole injection and transport properties may be obtained without a substantial increase in driving voltage.

At least one of the HIL, the HTL, and the H-functional layer may include at least one of a compound represented by Formula 300 below and a compound represented by Formula 301 below:

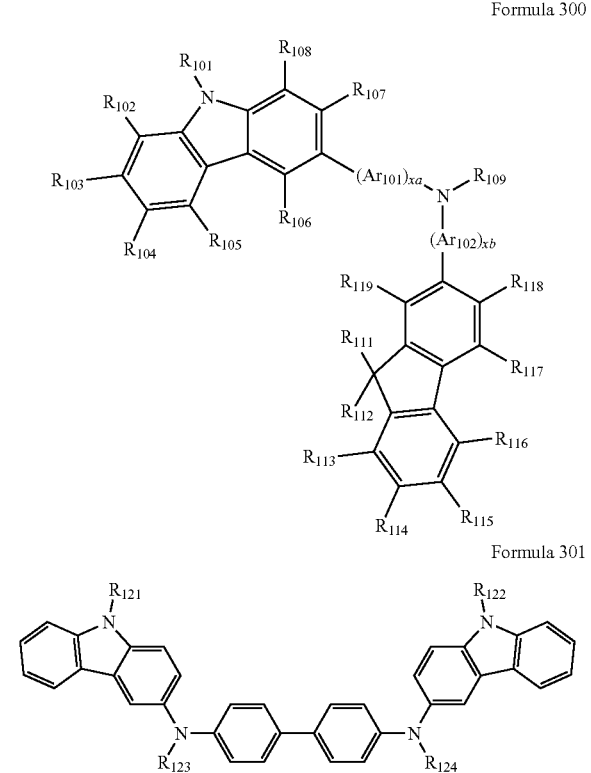

Formula 300

Formula 301

In Formula 300, $Ar_{101}$ and $Ar_{102}$ may be each independently a substituted or unsubstituted $C_6$-$C_{60}$ arylene group.

For example, $Ar_{101}$ and $Ar_{102}$ may be each independently selected from:

a phenylene group, a pentalenylene group, an indenylene group, a naphthylene group, an azulenylene group, a heptalenylene group, an acenaphthylene group, a fluorenylene group, phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, and a pentacenylene group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, but are not limited thereto.

In Formula 300, xa and xb may be each independently an integer from 0 to 5, for example, 0, 1, or 2. For example, xa may be 1, and xb may be 0, but they are not limited thereto.

In Formulae 300 and 301, $R_{101}$ through $R_{108}$, $R_{111}$ through $R_{119}$, and $R_{121}$ through $R_{124}$ may be each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, and a substituted or unsubstituted $C_6$-$C_{60}$ arylthio group.

For example, $R_{101}$ through $R_{108}$, $R_{111}$ through $R_{119}$, and $R_{121}$ through $R_{124}$ may be each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, a hexyl group, etc.), and a $C_1$-$C_{10}$ alkoxy group (e.g., a methoxy group, an ethoxy group, a propoxy group, a butoxy group, a pentoxy group, etc.);

a $C_1$-$C_{10}$ alkyl group and a $C_1$-$C_{10}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, substituted with at least one of a $C_1$-$C_{10}$ alkyl group and a $C_1$-$C_{10}$ alkoxy group, but are not limited thereto.

In Formula 300, $R_{109}$ may be selected from, a phenyl group, a naphthyl group, an anthracenyl group, a biphenyl group, and a pyridinyl group; and a phenyl group, a naphthyl group, an anthracenyl group, a biphenyl group, and a pyridinyl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a substituted or unsubstituted $C_1$-$C_{20}$ alkyl group, and a substituted or unsubstituted $C_1$-$C_{20}$ alkoxy group.

In some embodiments, the compound of Formula 300 may be represented by Formula 300A below, but is not limited thereto:

Formula 300A

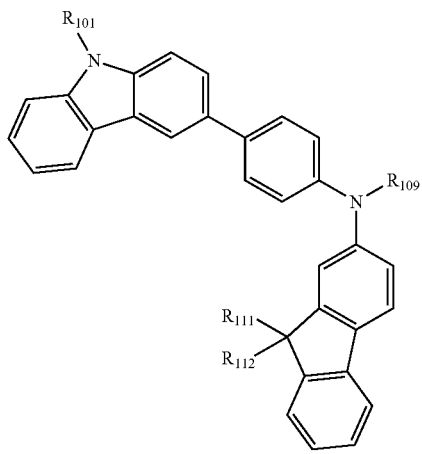

In Formula 300A, detailed descriptions of $R_{101}$, $R_{111}$, $R_{112}$, and $R_{109}$ are the same as those already provided above.

For example, at least one of the HIL, the HTL, and the H-functional layer may be include at least one of Compounds 301 through 320 below, but is not limited thereto:

301

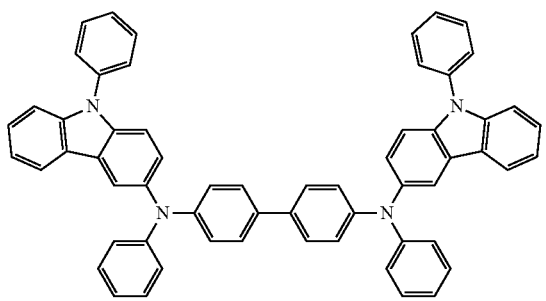

302

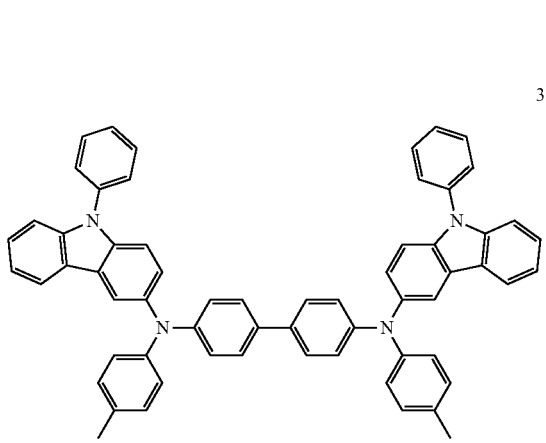

303

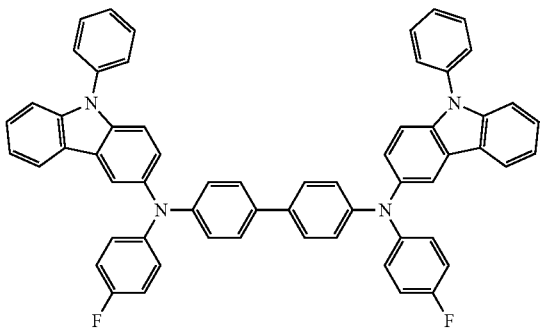

304

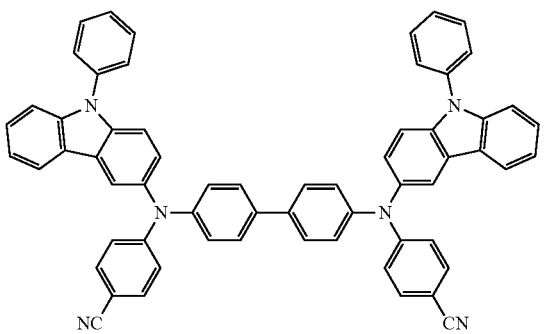

305

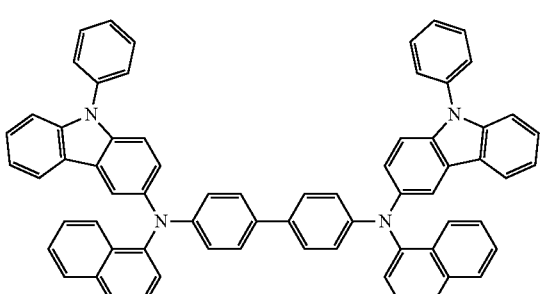

306

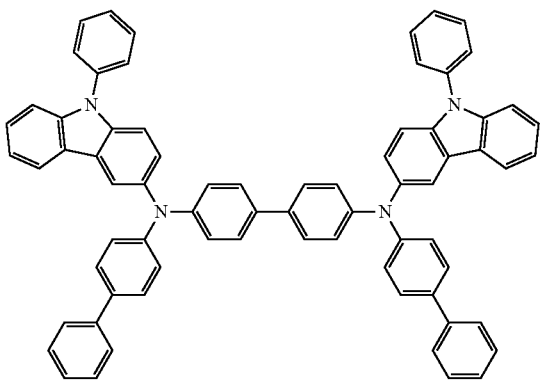

307
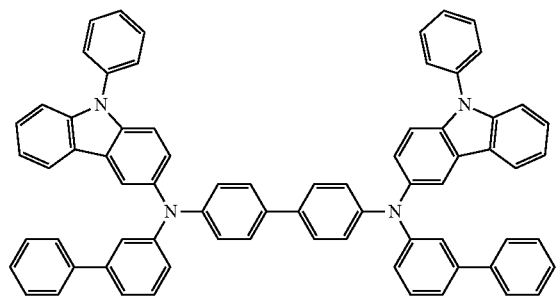
308
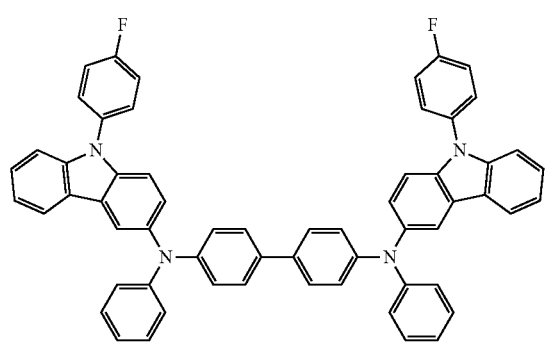
310
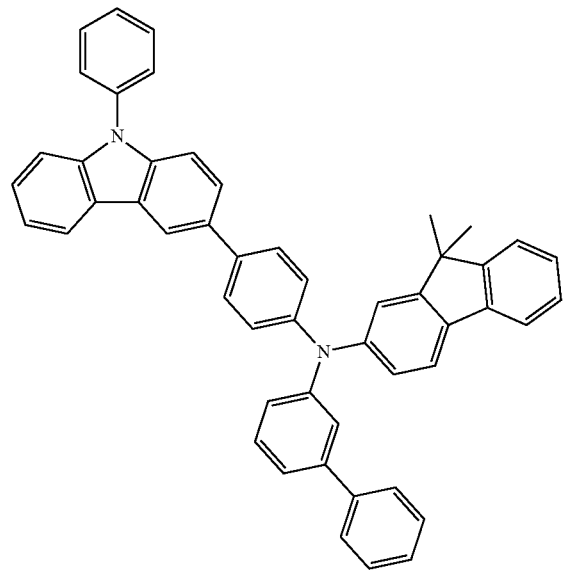
311
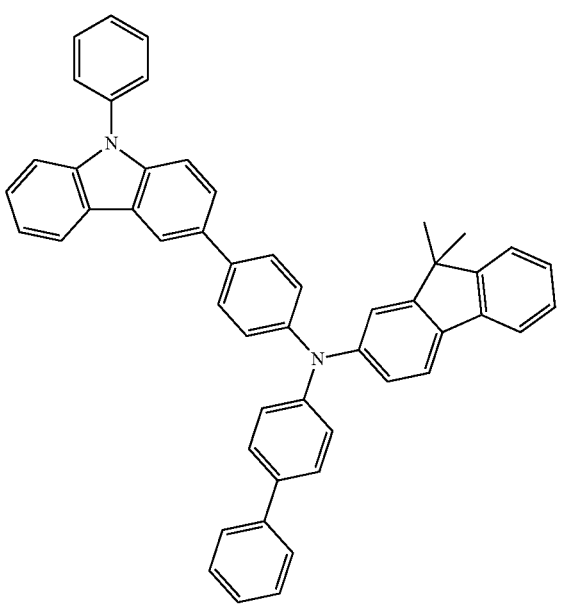

312
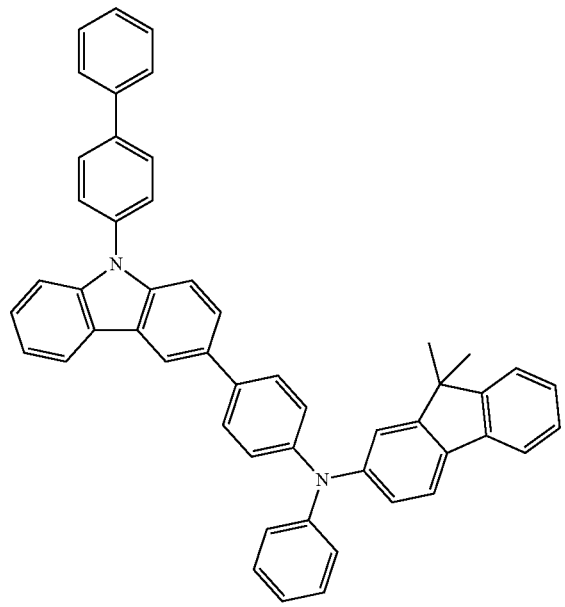
313
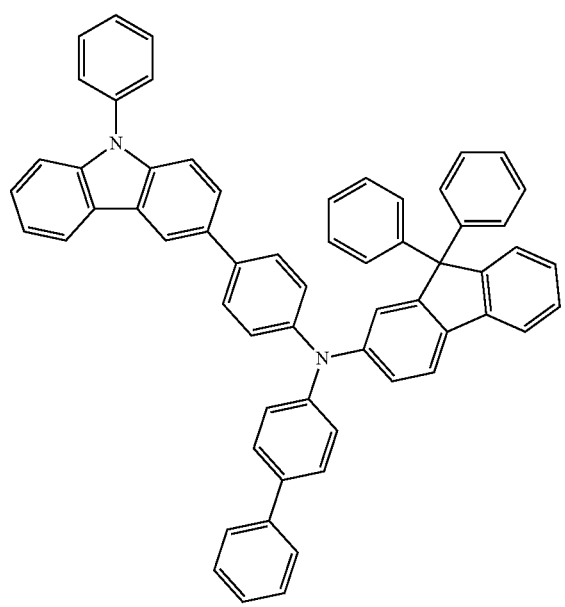
314
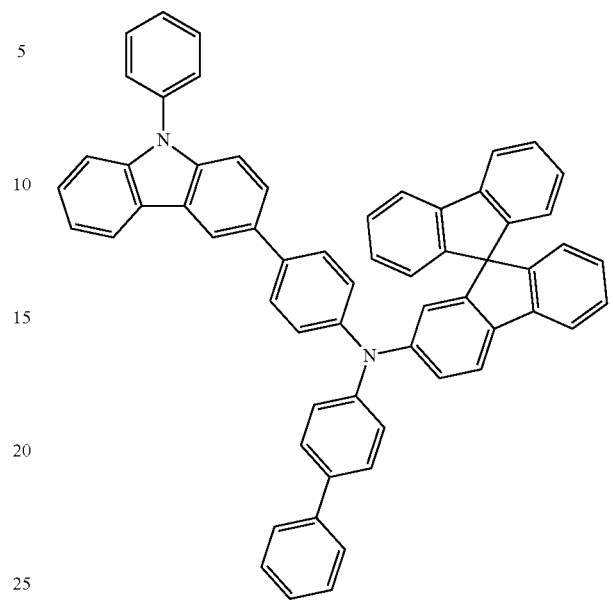
315
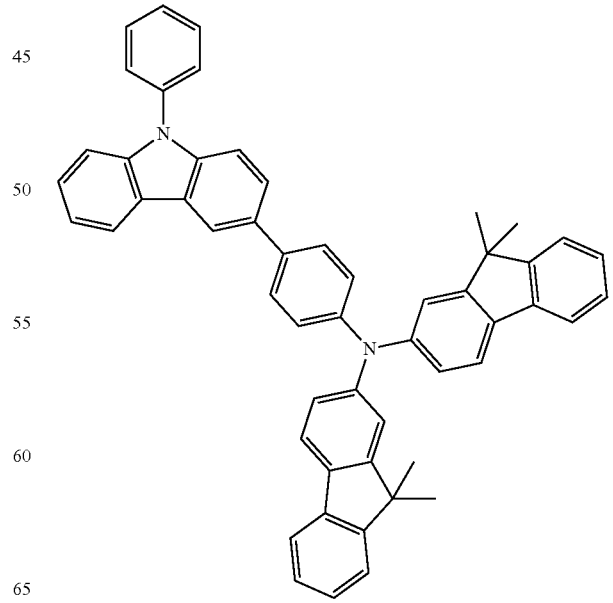

316

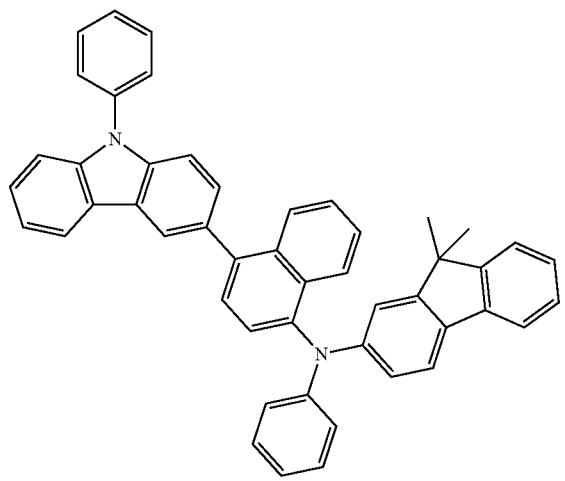

317

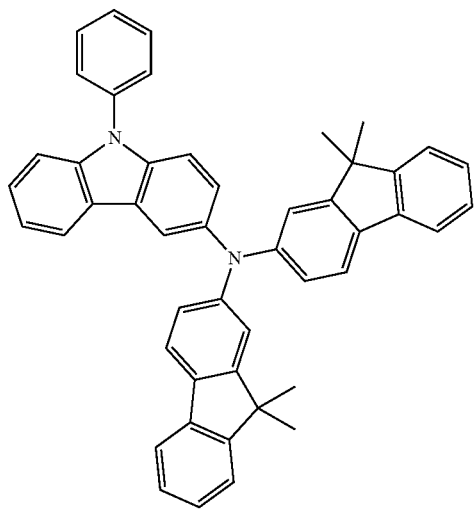

318

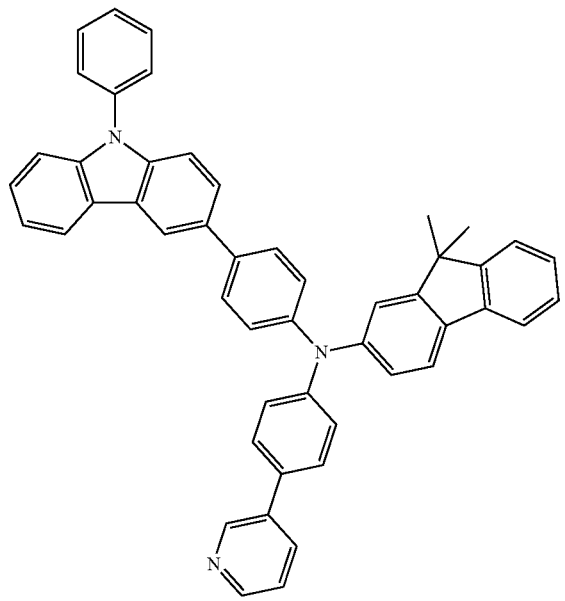

319

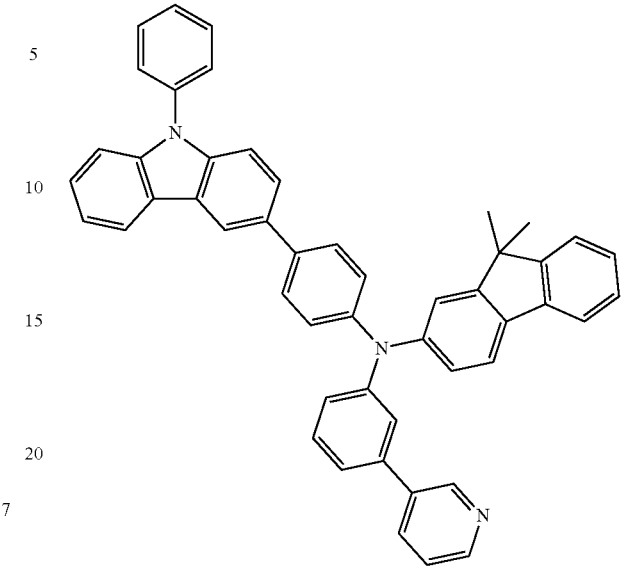

320

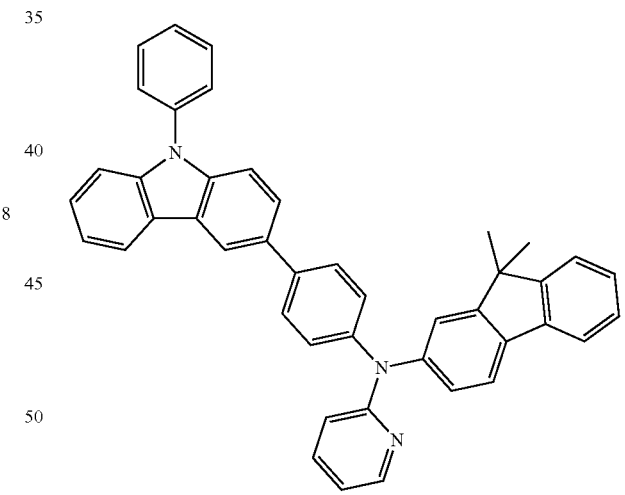

The hole transporting region may further include a charge-generating material so as to increase the conductive of the layers, in addition to the known hole injection material and/or the known hole transporting material.

The charge-generating material may be, for example, a p-dopant. The p-dopant may be one of a quinine derivative, a metal oxide, and a cyano-containing compound, but is not limited thereto. Examples of the p-dopant may include, but not limited to, quinone derivatives such as tetra-cyanoquinodimethane (TCNQ) and 2,3,5,6-tetrafluoro-tetracyano-1,4-benzoquinodimethane (F4-TCNQ); metal oxides such as an tungsten oxide and a molybdenum oxide; and cyano-containing compounds such as Compound 200 below.

Compound 200

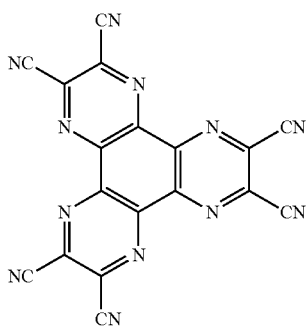

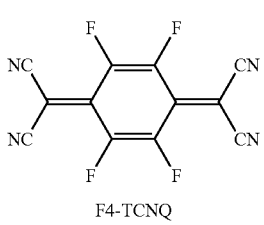

F4-TCNQ

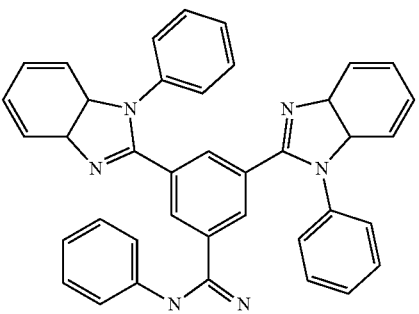

TPBI

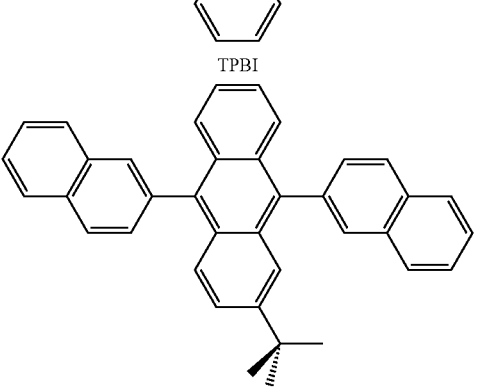

TBADN

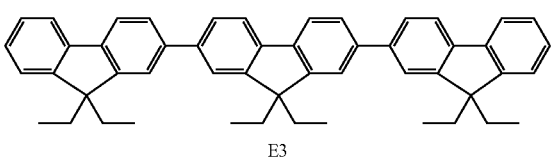

E3

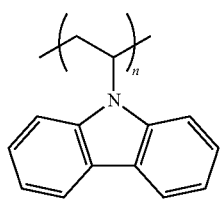

PVK

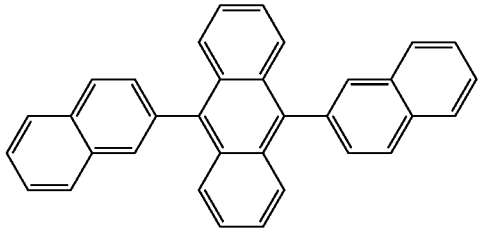

DNA

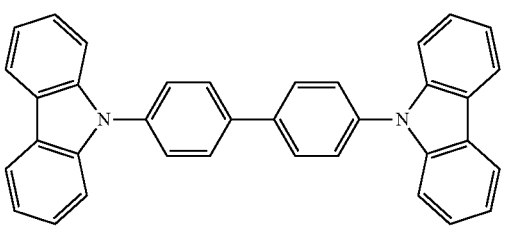

CBP

When the hole transporting region further includes the charge-generating material, the charge-generating material may be homogeneously or inhomogeneously dispersed in the hole transporting region.

The hole transporting region may further include a buffer layer disposed between the HTL and the EML (or between the H-functional layer and the EML).

The buffer layer increases efficiency by compensating for an optical resonance distance according to the wavelength of light emitted from the EML. The buffer layer may include a known hole injection material and a known hole transporting material. Also, the buffer layer may include the same (or substantially the same) material as one of the materials included in the HTL (or the H-functional layer).

An EML may be formed on the hole transporting region by vacuum deposition, spin coating, casting, or LB deposition. When the EML is formed by vacuum deposition or spin coating, the deposition and coating conditions vary according to a compound used for the EML. However, in general, the condition may be almost the same (e.g., substantially the same) as the condition for forming the HIL.

The EML may include a host and a dopant.

Examples of the host may include, but not limited to, $Alq_3$, 4,4'-N,N'-dicabarzole-biphenyl (CBP), poly(n-vinylcarbazole) (PVK), 9,10-di(naphthalene-2-yl)anthracene (DNA), TCTA, 1,3,5-tris(N-phenylbenzimidazole-2-yl)benzene (TPBI), 3-tert-butyl-9,10-di(naphth-2-yl) anthracene (TBADN), E3, and distyrylarylene (DSA), dmCBP (refer to Formula below), and Compounds 501 through 509 below.

69
-continued
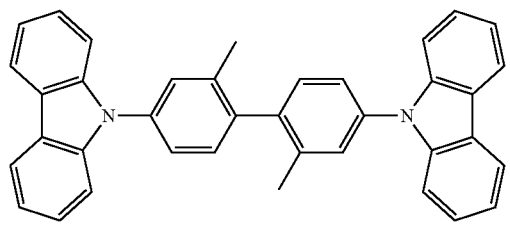
dmCBP
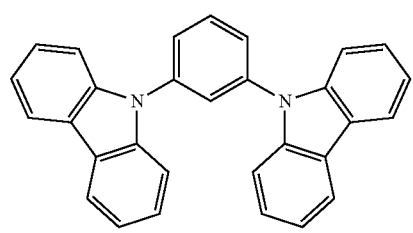
501
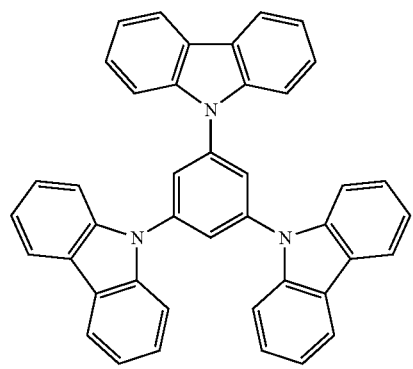
502
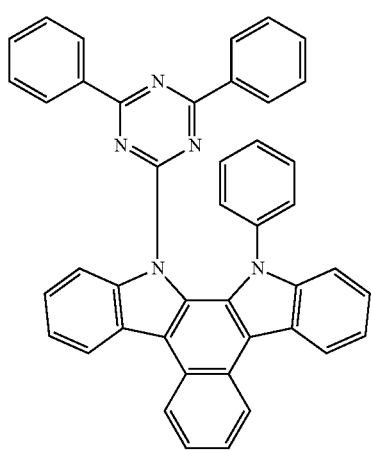
503
70
-continued
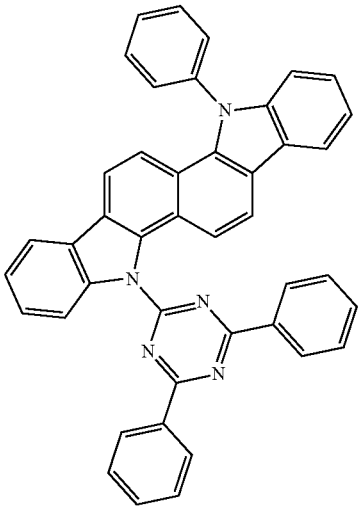
504
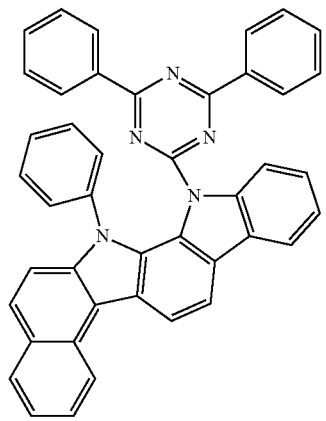
505
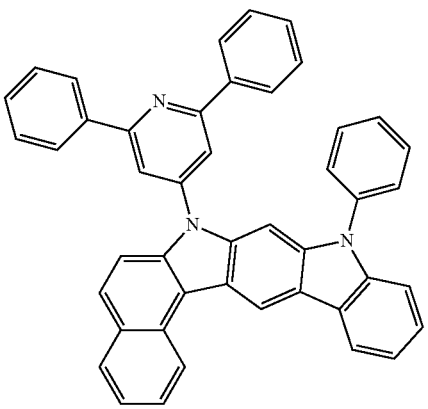
506

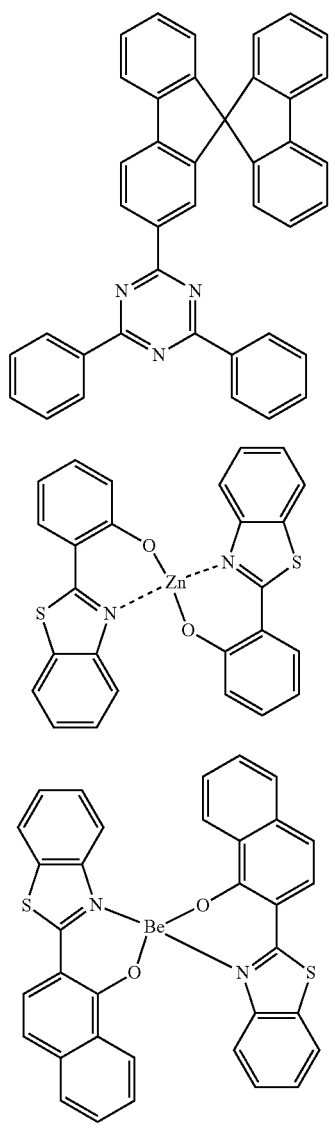

Also, the host may be an anthracene-based compound represented by Formula 400 below:

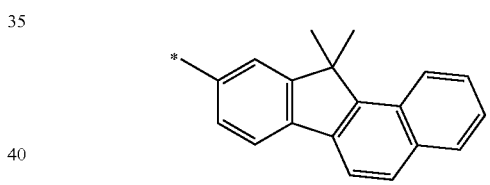

Formula 400

In Formula 400, $Ar_{111}$ and $Ar_{112}$ may be each independently a substituted or unsubstituted $C_6$-$C_{60}$ arylene group; $Ar_{113}$ through $Ar_{116}$ may be each independently selected from a substituted or unsubstituted $C_1$-$C_{10}$ alkyl group and a substituted or unsubstituted $C_5$-$C_{60}$ aryl group; and g, h, i, and j may be each independently an integer from 0 to 4.

For example, in Formula 400, $Ar_{111}$ and $Ar_{112}$ may be each independently selected from, a phenylene group, a naphthylene group, a phenanthrenylene group, and a pyrenylene group; and a phenylene group; and a phenylene group, a naphthylene group, a phenanthrenylene group, a fluorenyl group, and a pyrenylene group, substituted with at least one of a phenyl group, a naphthyl group, and an anthracenyl group, but are not limited thereto.

In Formula 400, g, h, i, and j may be each independently 0, 1, or 2.

In Formula 400, $Ar_{113}$ through $Ar_{116}$ may be each independently selected from, a $C_1$-$C_{10}$ alkyl group substituted with at least one of a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

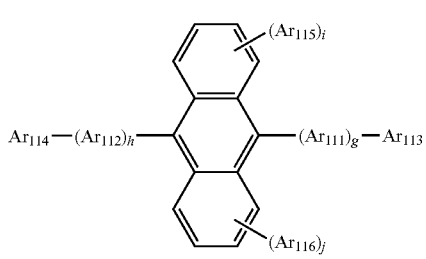

(wherein * is a binding site for a neighboring atom), but are not limited thereto.

For example, the anthracene-based compound of Formula 400 may be, but not limited to, one of the compounds below:

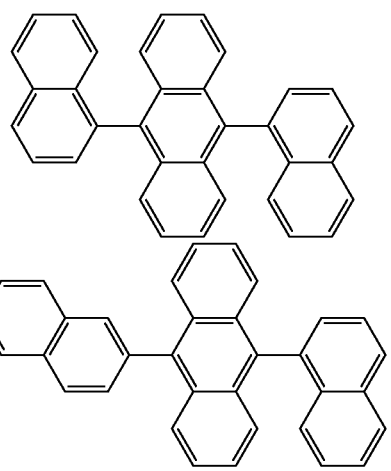

-continued
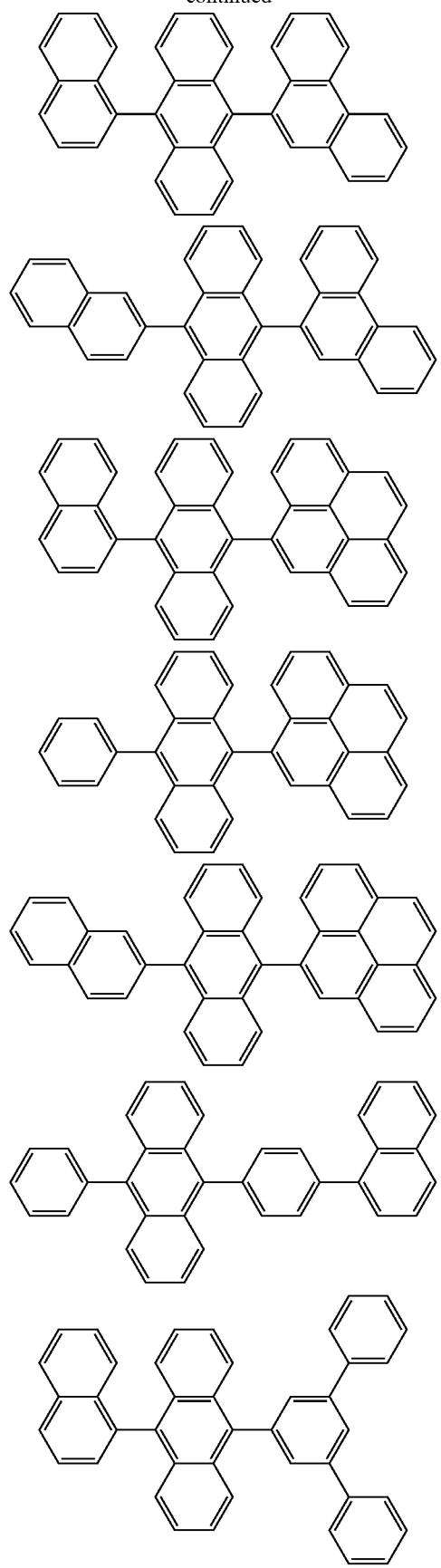
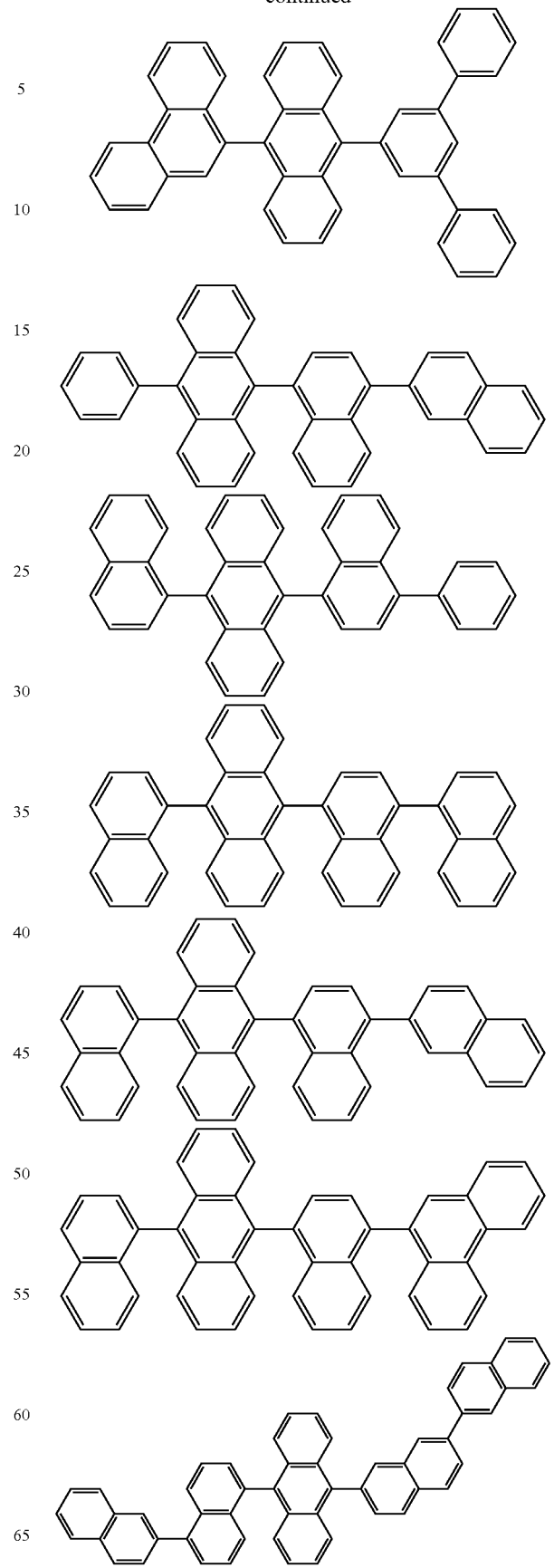

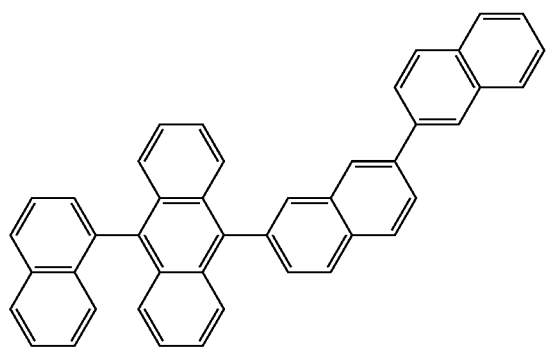
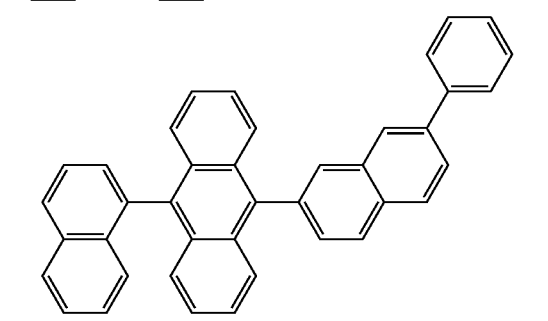
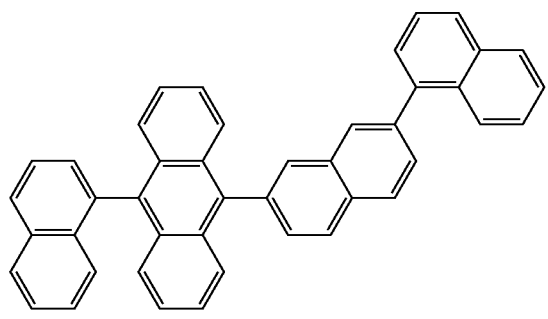
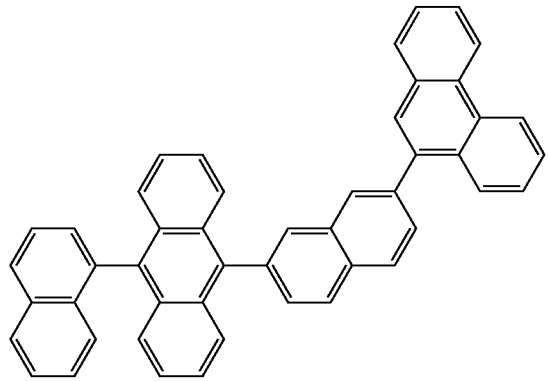
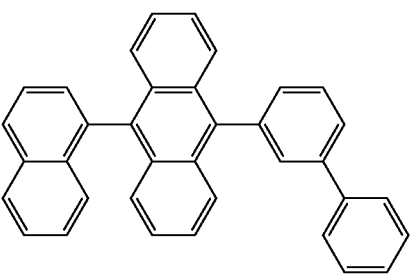
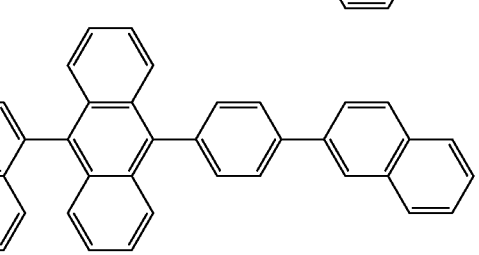
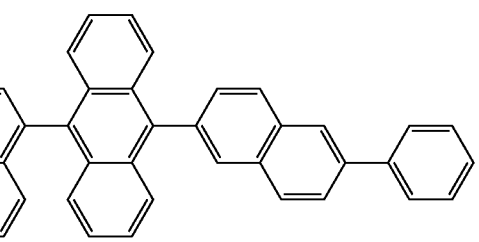
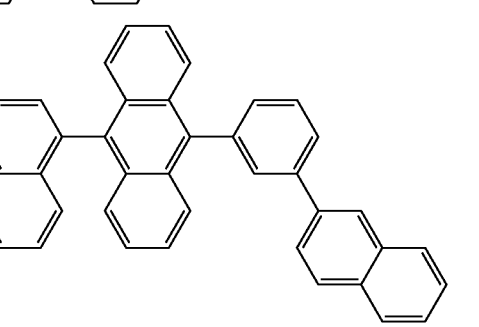
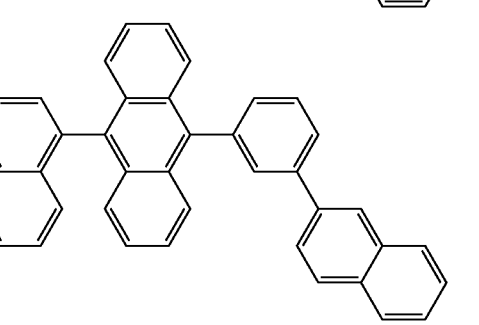
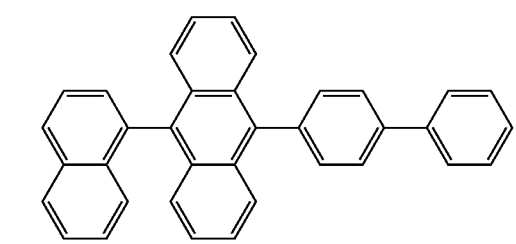
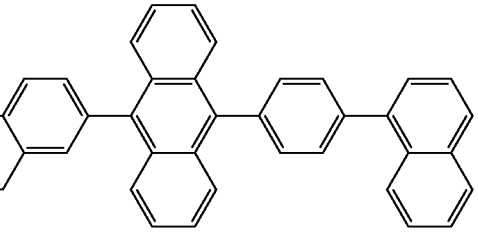

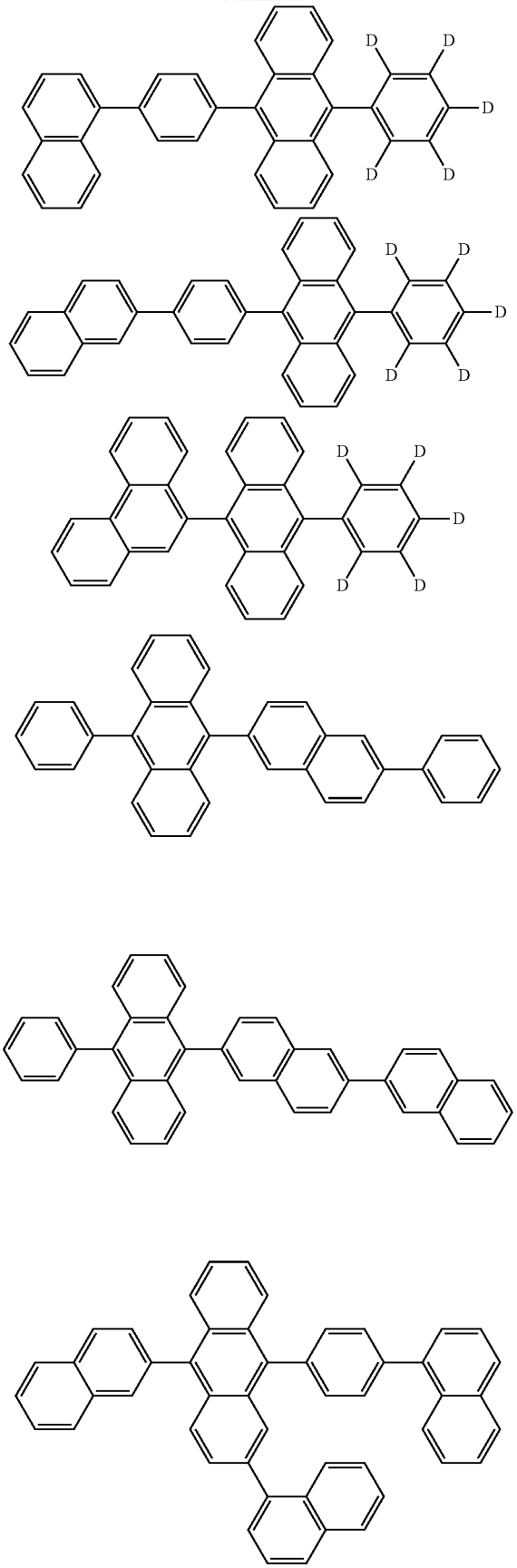

-continued

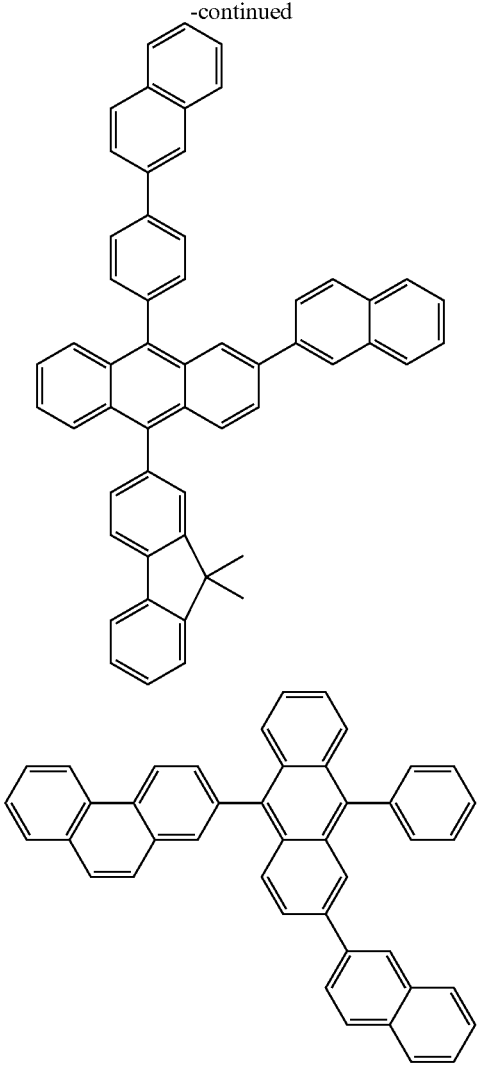

Also, an anthracene-based compound represented by Formula 401 below may be used as the host:

Formula 401

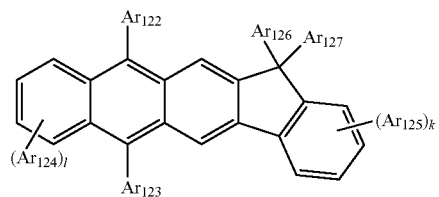

In Formula 401, detailed descriptions of $Ar_{122}$ through $Ar_{125}$ are the same as those provided for the description of $Ar_{113}$ of Formula 400 above.

In Formula 401, $Ar_{126}$ and $Ar_{127}$ may be each independently a $C_1$-$C_{10}$ alkyl group (e.g., a methyl group, an ethyl group, or a propyl group).

In Formula 401, k and l may be each independently an integer from 0 to 4. For example, k and l may be each independently 0, 1, or 2.

For example, the anthracene-based compound of Formula 401 may be, but is not limited to, one of the following compounds:

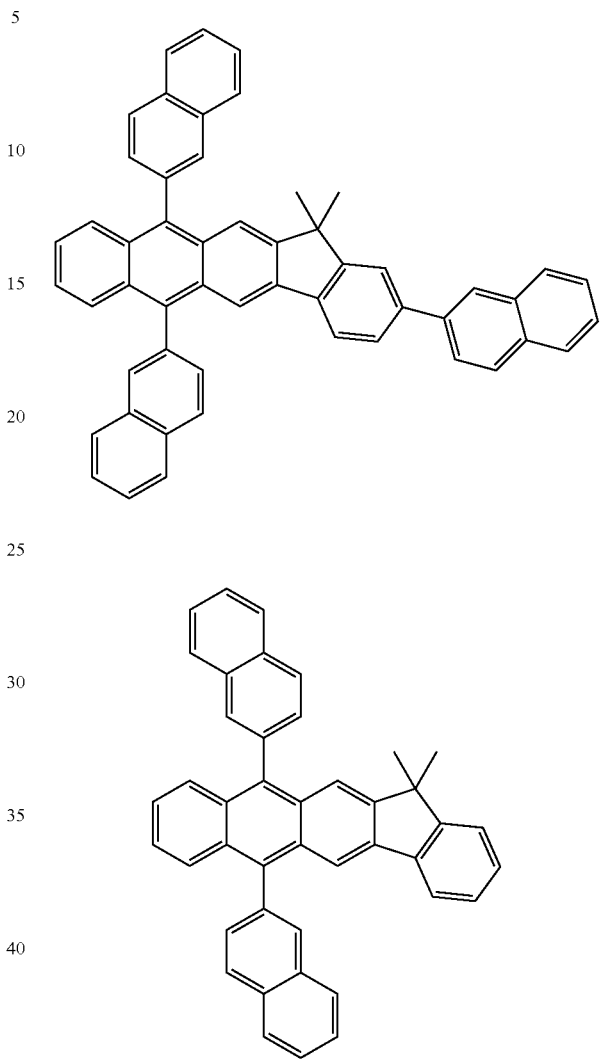

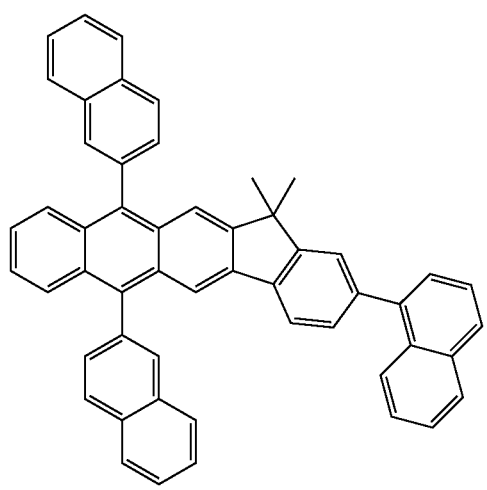

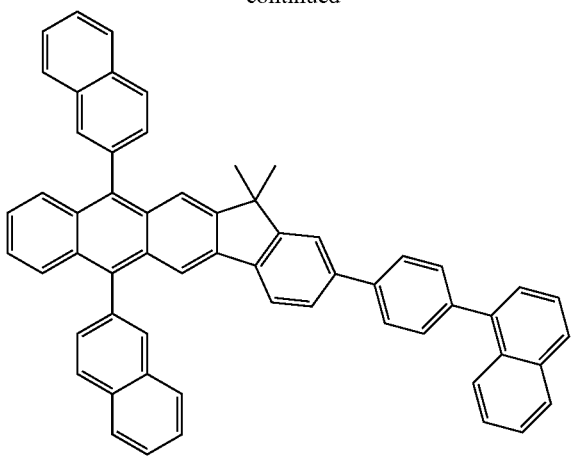

if the OLED is a full-color OLED, the EML may be patterned as a red EML, a green EML, and a blue EML. Alternatively the EML may have a structure in which a red EML, a green EML, and/or a blue EML are stacked so as to emit white light.

A dopant in the EML may be the styryl-based compound represented by Formula 1. Here, the styryl-based compound may serve as a fluorescent dopant for emitting light according to a fluorescence emitting mechanism. For example, the styryl-based compound may serve as a fluorescent dopant for emitting blue light, but is not limited thereto.

The EML may further include the following dopants as a known dopant as well as the styryl-based compound represented by Formula 1.

For example, the compounds below may be used as a blue dopant, but the dopant is not limited thereto.

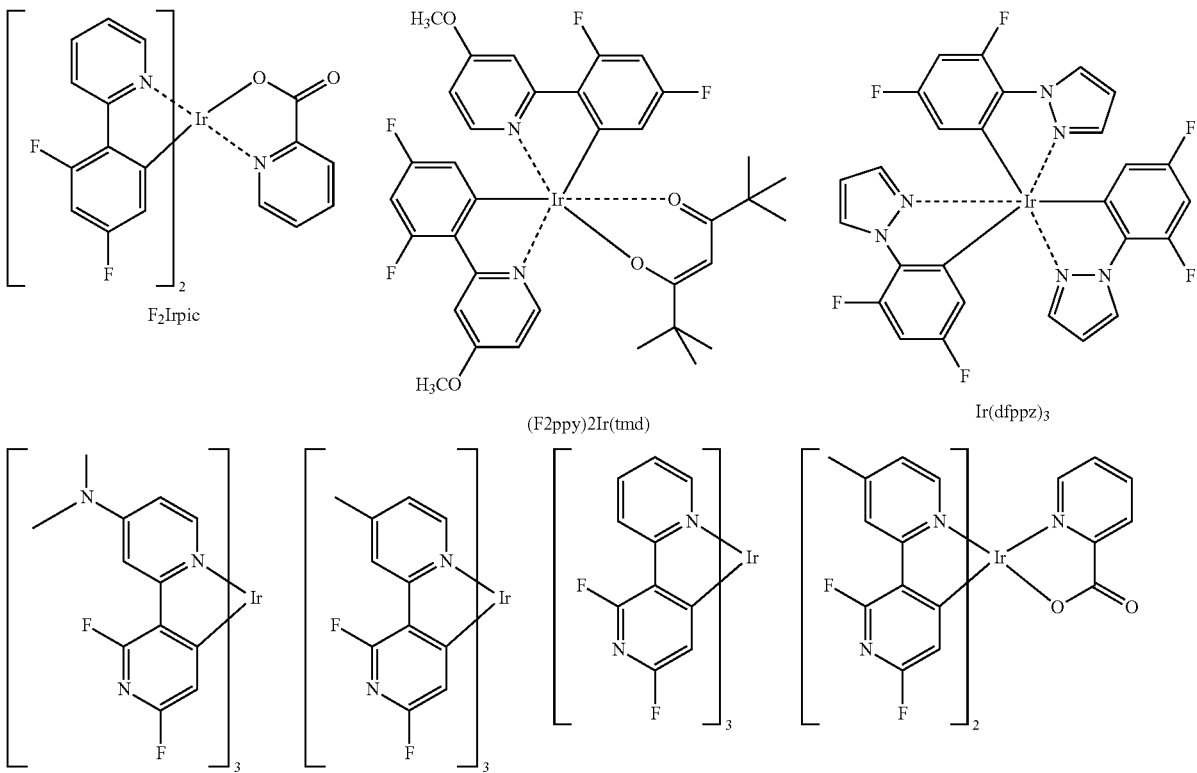

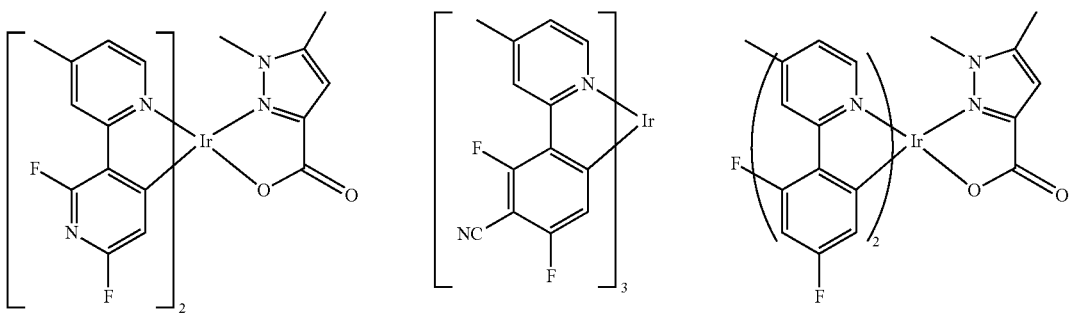

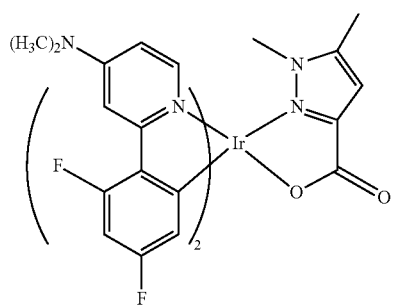
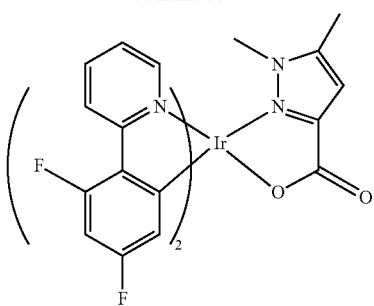
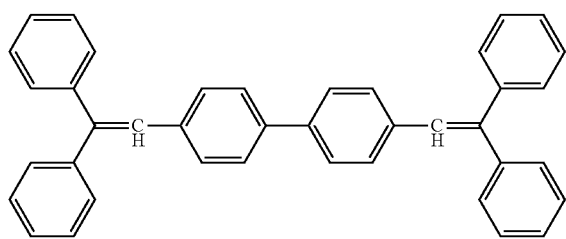
DPVBi
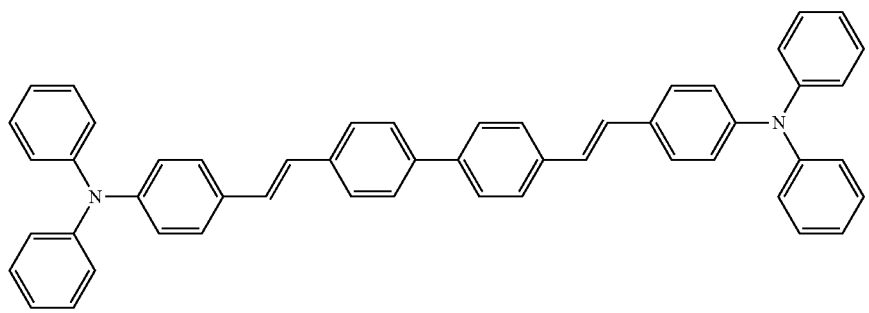
DPAVBi
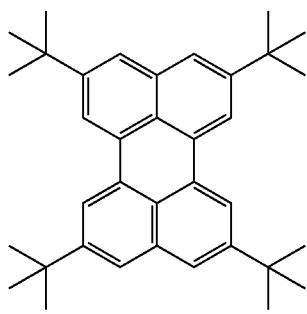
TBPe

For example, the compounds below may be used as a red dopant, but the dopant is not limited thereto. In addition, DCM or DCJTB below may be used as the red dopant.
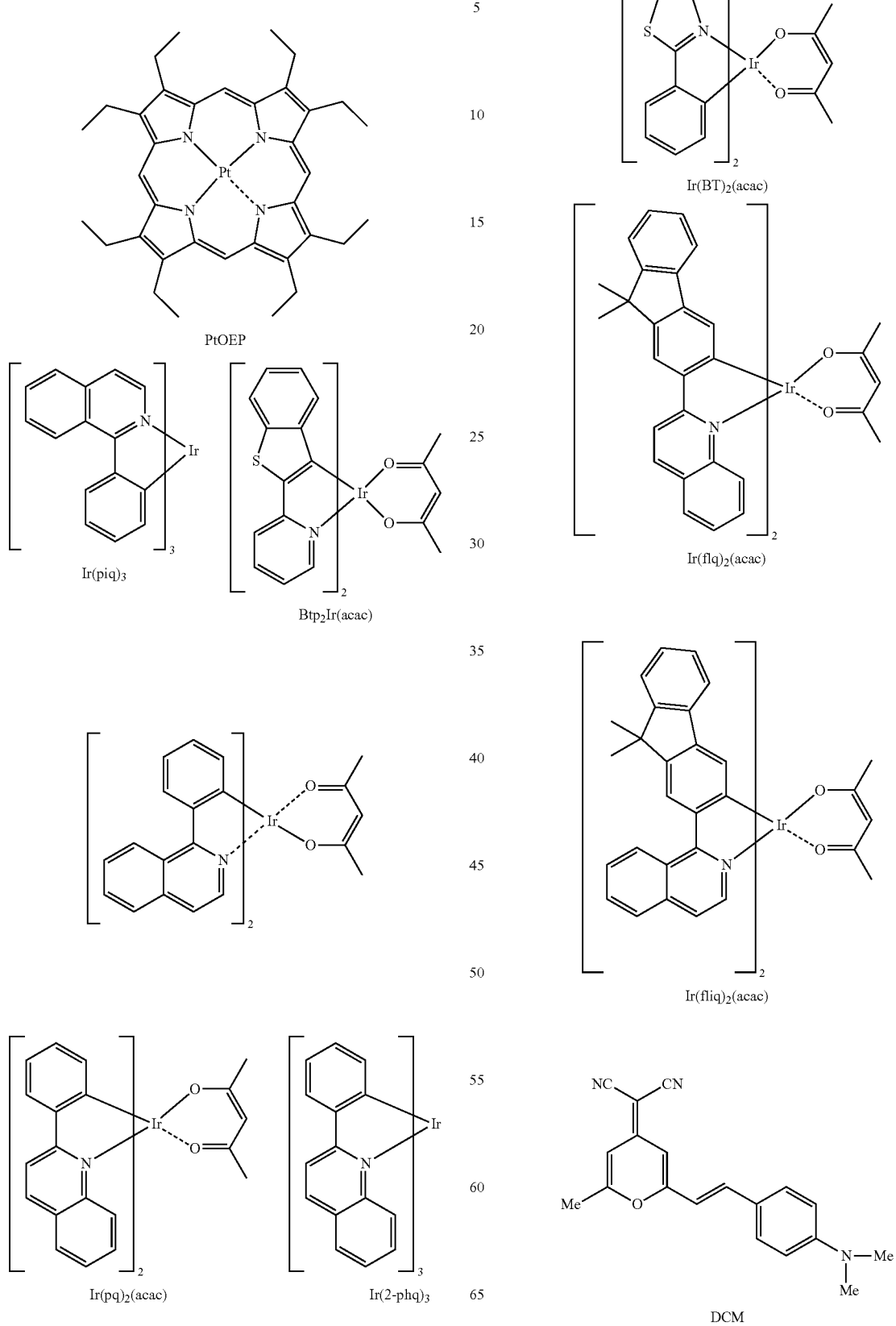

DCJTB

For example, the compounds described below may be used as a green dopant, but the dopant is not limited thereto. C545T below may be used as the green dopant.

Ir(ppy)₃

Ir(ppy)₂(acac)       Ir(mpyp)₃

C545T

Examples of the dopant included in the EML include the complexes below, but the dopant is not limited thereto.

-continued
D-7
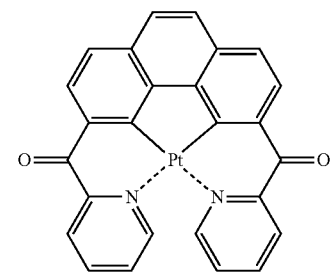
D-8
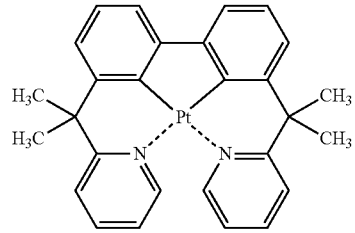
D-9
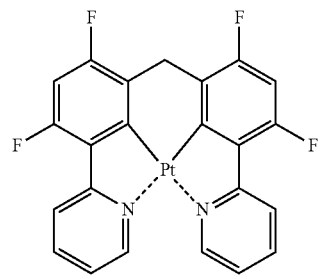
D-10
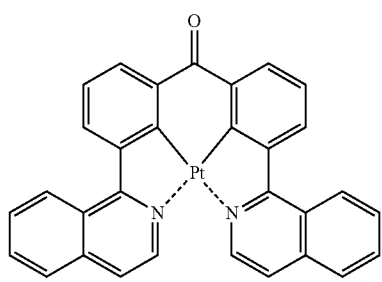
D-11
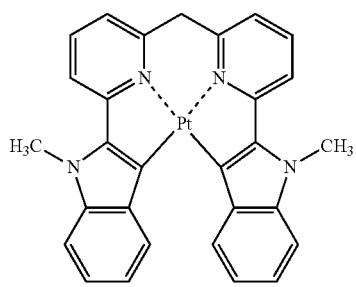
D-12
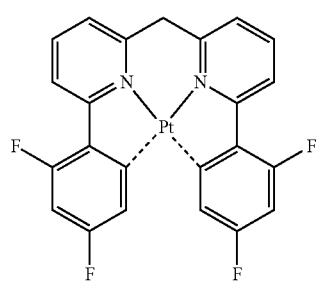
-continued
D13
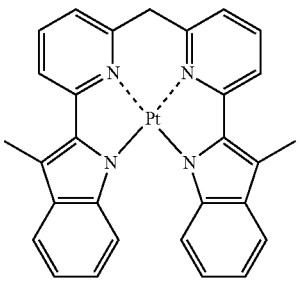
D14
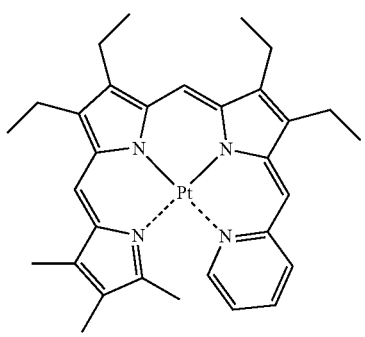
D15
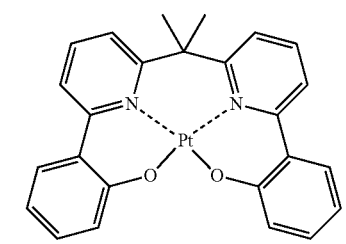
D16
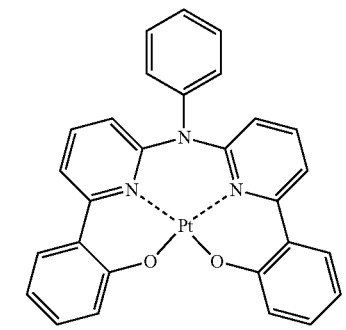
D17
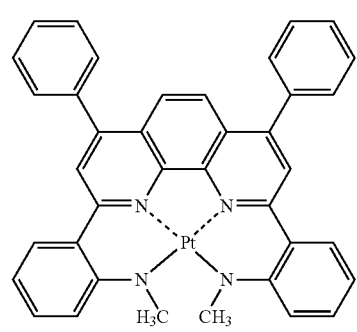

D18 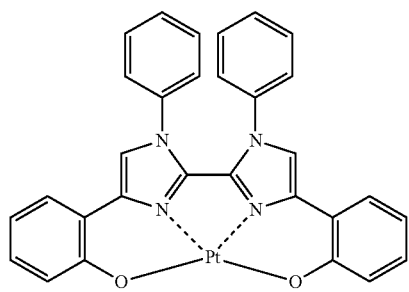
D19 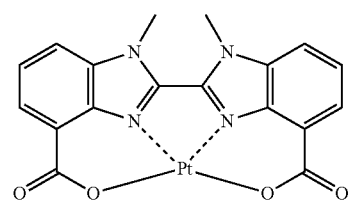
D20 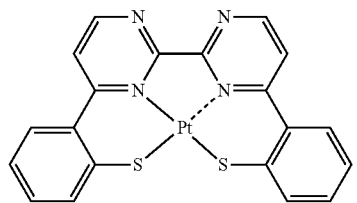
D21 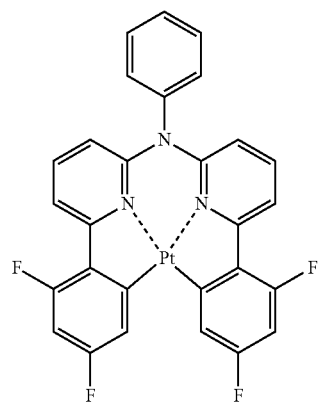
D22 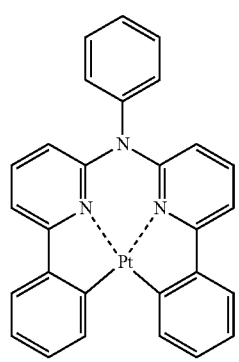
D23 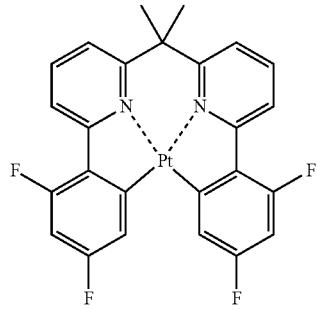
D24 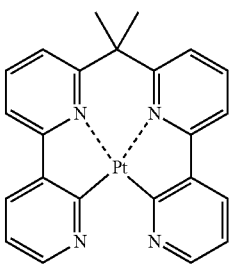
D25 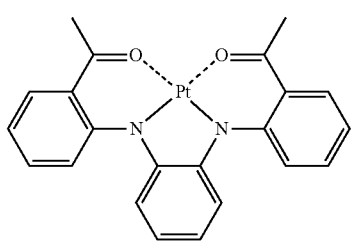
D26 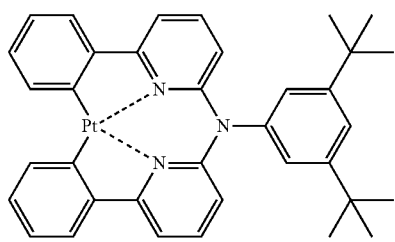
D27 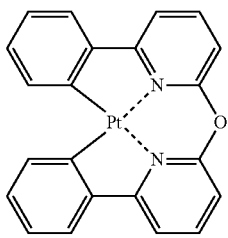
D28 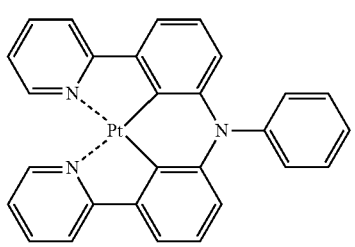

D29
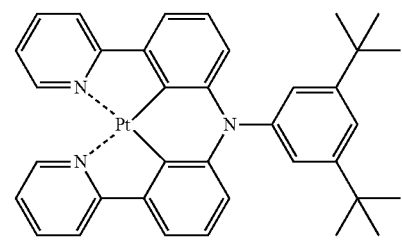
D30
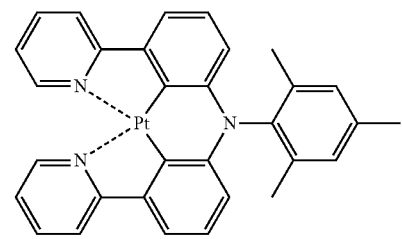
D31
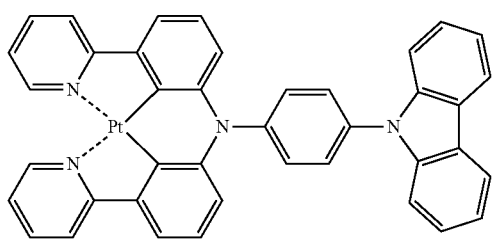
D32
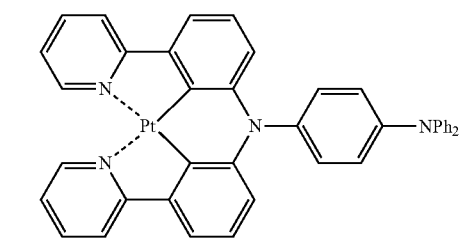
D33
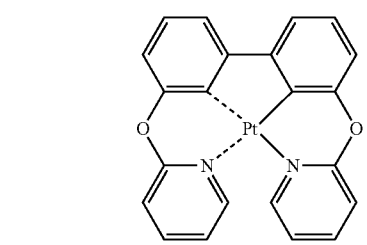
D34
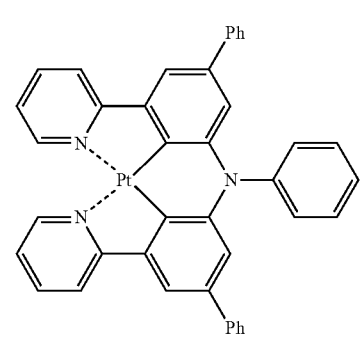
D35
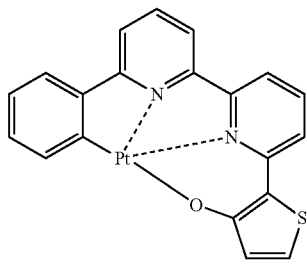
D36
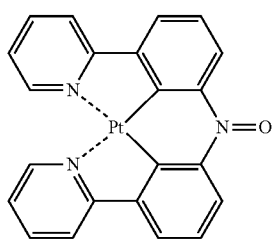
D37
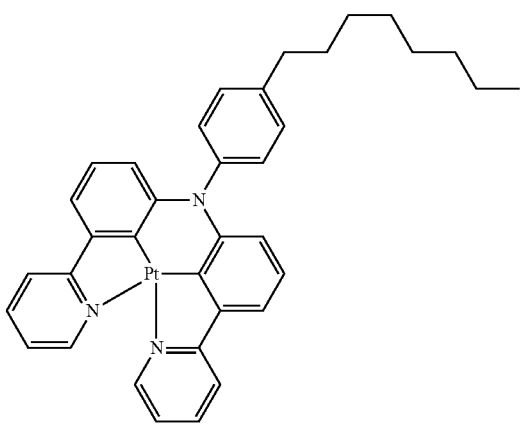
D38
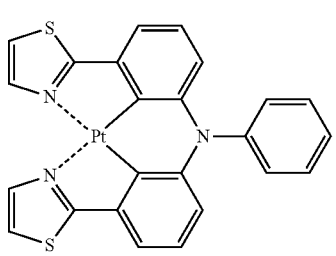
D39
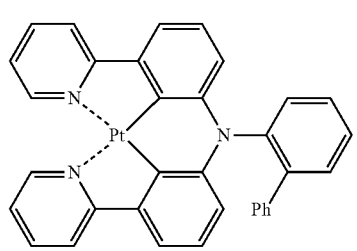

-continued
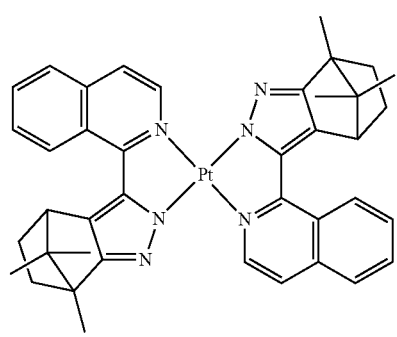
D40
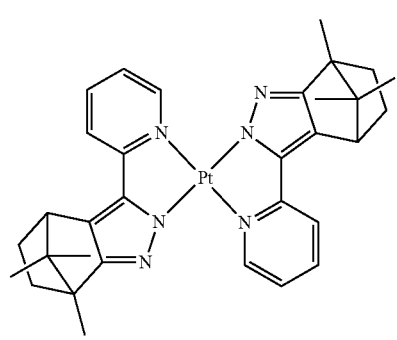
D41
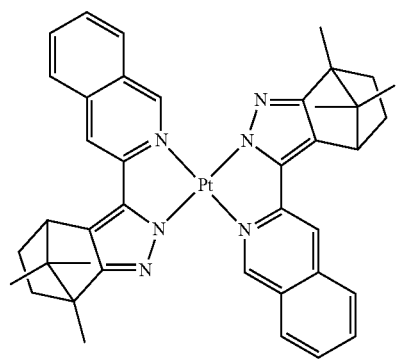
D42
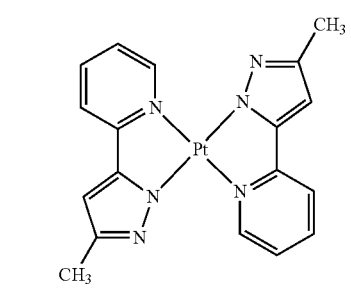
D43
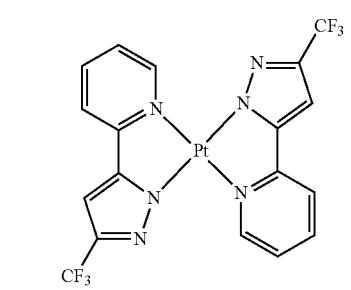
D44
-continued
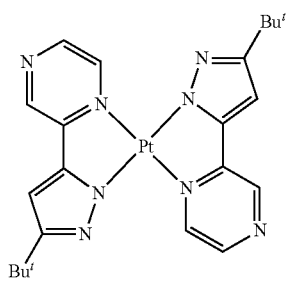
D45
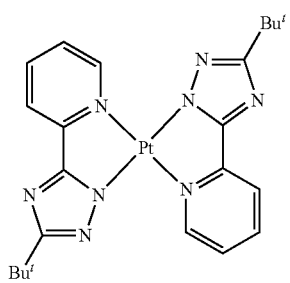
D46
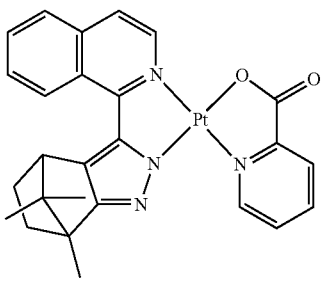
D47
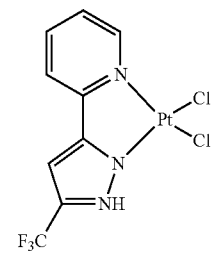
D48
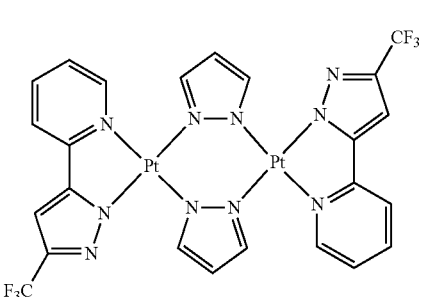
D49

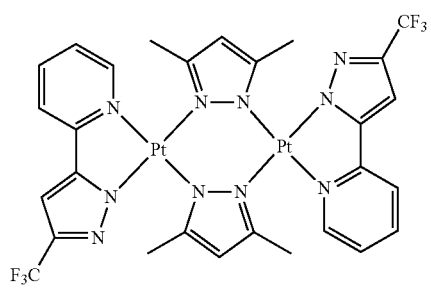

D50

Also, examples of the dopant included in the EML include, but the dopant is not limited to, the following Os-complexes.

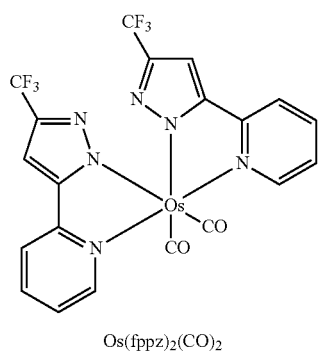

Os(fppz)₂(CO)₂

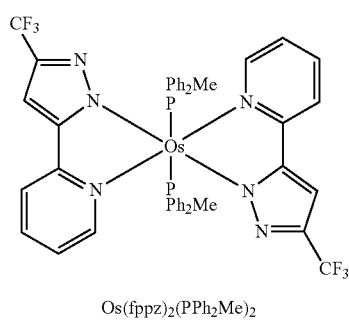

Os(fppz)₂(PPh₂Me)₂

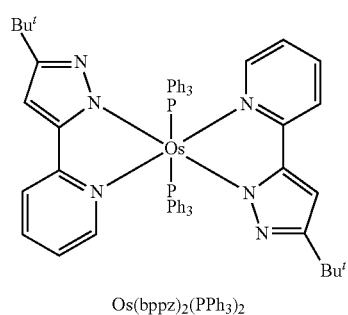

Os(bppz)₂(PPh₃)₂

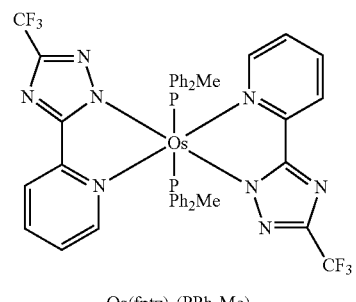

Os(fptz)₂(PPh₂Me)₂

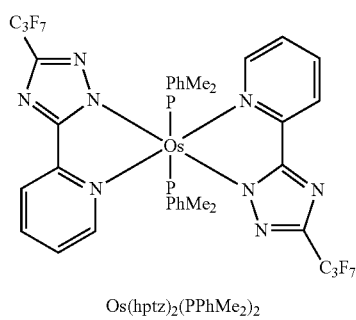

Os(hptz)₂(PPhMe₂)₂

When the EML includes a host and a dopant, the amount of the dopant in the EML may be generally in a range of about 0.01 to about 15 parts by weight based on 100 parts by weight of the host, but is not limited thereto.

The thickness of the EML may be in a range of about 100 Å to about 1,000 Å, for example, in a range of about 200 Å to about 600 Å. When the thickness of the EML is within either of the foregoing ranges, excellent luminescent properties may be obtained without a substantial increase in driving voltage.

Next, an ETL may be formed using various methods such as vacuum deposition, spin coating, or casting. When the ETL is formed by vacuum deposition or spin coating, the deposition and coating conditions vary according to a compound used for the ETL. However, in general, the condition may be almost the same (e.g., substantially the same) as the condition for forming the HIL.

A material for forming the ETL may be a known electron transporting material that stably transports electrons injected from a cathode. Examples of the known electron transporting material may include, but are not limited to, a quinoline derivative, such as tris(8-quinolinolate)aluminum (Alq₃), TAZ, Balq, beryllium bis(benzoquinolin-10-olate (Bebq₂), ADN, and known materials such as Compound 201, Compound 202, and TmPyPB below.

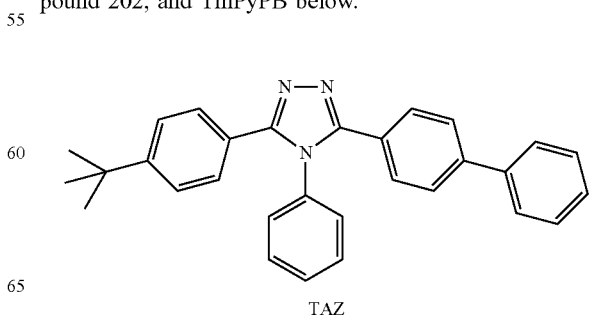

TAZ

-continued

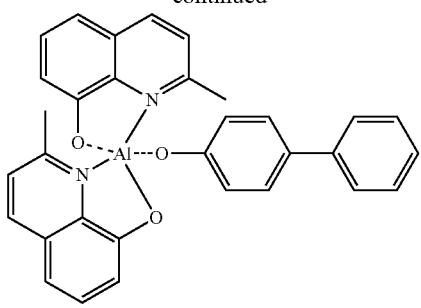

BAlq

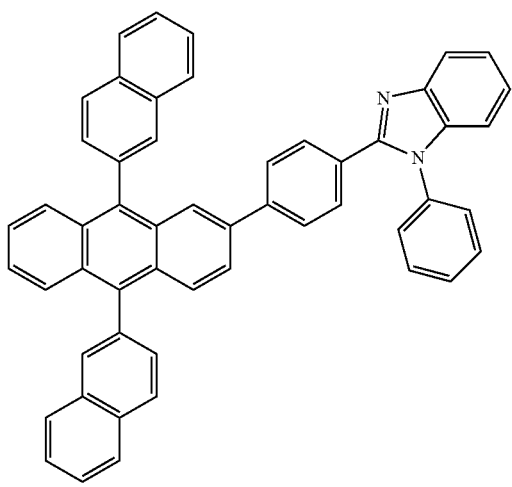

Compound 202

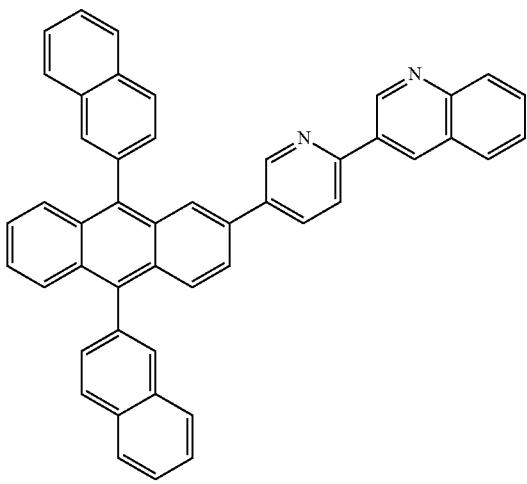

BCP

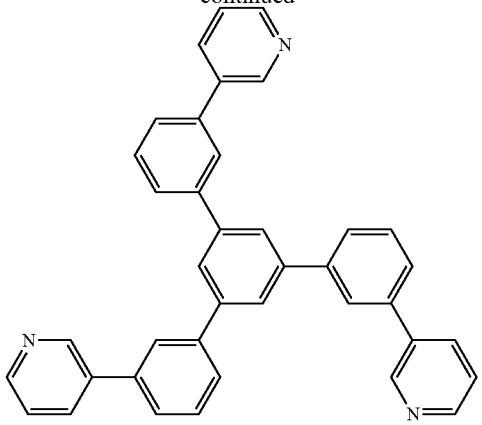

TmPyPB

The thickness of the ETL may be in a range of about 100 Å to about 1,000 Å, for example, in a range of about 150 Å to about 500 Å. When the thickness of the ETL is within either of the foregoing ranges, satisfactory electron transport properties may be obtained without a substantial increase in driving voltage.

The ETL may further include a metal-containing material, in addition to the styryl-based compound described above.

The metal-containing material may include a Li-complex. Examples of the Li-complex may include lithium quinolate (LiQ) and Compound 203 below:

Compound 203

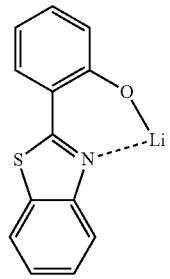

Also, an EIL, which facilitates electron injection from a cathode, may be formed on the ETL, and a material for forming the EIL is not particularly limited.

The material for forming the EIL may include a known material for forming an EIL, such as LiF, NaCl, CsF, $Li_2O$, or BaO. The deposition condition of the EIL may vary according to a compound used for the EIL. However, in general, the condition may be almost the same (e.g., substantially the same) as the condition for forming the HIL.

The thickness of the EIL may be in a range of about 1 Å to about 100 Å, for example, in a range of about 3 Å to about 90 Å. When the thickness of the EIL is within either of the foregoing ranges, satisfactory electron injection properties may be obtained without a substantial increase in driving voltage.

A second electrode 17 is formed on the organic layer 15. The second electrode 17 may be a cathode, which is an electron injection electrode. In this regard, a metal for forming the second electrode 17 may include a metal having low work function, such as metal, an alloy, an electric conducting compound, and mixtures thereof. In particular, the second electrode 17 may be formed as a thin film by using lithium (Li), magnesium (Mg), aluminum (Al), aluminum-lithium (Al—Li), calcium (Ca), magnesium-indium (Mg—In), or magnesium-silver (Mg—Ag), thus being transparent. In order to obtain a top-emission type OLED, the second electrode 17 may be formed as a transparent electrode by using ITO or IZO.

The OLED has been described with reference to FIG. 1, but it is not limited thereto.

Also, when a phosphorescent dopant is included in the EML, a HBL may be formed between the ETL and the EML or between the H-functional layer and the EML by vacuum deposition, spin coating, casting or LB deposition so as to prevent triplet excitons or holes from being diffused to the ETL. When the HBL is formed by vacuum deposition or spin coating, the conditions thereof may vary according to a compound used for the HBL. However, in general, the conditions may be almost the same (e.g., substantially the same) as the condition for forming the HIL. The HBL may include a known hole blocking material. Examples of the known hole blocking material may include an oxadiazole derivative, a triazole derivative, and a phenanthroline derivative. For example, BCP may be used as a hole blocking material.

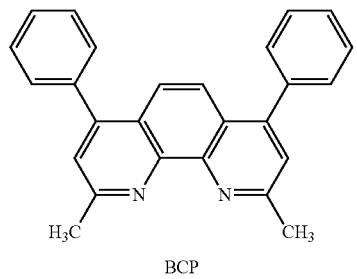 [SMILES: Cc1cc(-c2ccccc2)c2ccc3c(-c4ccccc4)cc(C)nc3c2n1 ; "BCP"]

BCP

The thickness of the HBL may be in a range of about 20 Å to about 1,000 Å, for example, in a range of about 30 Å to about 300 Å. When the thickness of the HBL is within either of the foregoing ranges, excellent hole blocking properties may be obtained without a substantial increase in driving voltage.

The OLED may be included in an organic light-emitting device. Thus, according to another aspect, an organic light-emitting device including the OLED and a transistor may be provided. The transistor may include an active layer, source and drain electrodes, a gate electrode, and a gate insulating layer, wherein one of the first and second electrodes of the OLED may be electrically connected to one of the source and drain electrodes of the transistor. The active layer of the transistor may be one selected from known active layers, such as amorphous silicon, crystalline silicon, oxide semiconductors, and organic compound semiconductors.

As used herein, examples of the unsubstituted $C_1$-$C_{60}$ alkyl group (or $C_1$-$C_{60}$ alkyl group) include linear or branched $C_1$-$C_{60}$ alkyl groups such as methyl, ethyl, propyl, isobutyl, sec-butyl, pentyl, iso-amyl, hexyl, and the like. At least one substituent of the substituted $C_1$-$C_{60}$ alkyl group may be selected from, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{60}$ alkenyl group, a $C_2$-$C_{60}$ alkynyl group, and a $C_1$-$C_{60}$ alkoxy group;

a $C_1$-$C_{20}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$) and —Si($Q_{13}$)($Q_{14}$)($Q_{15}$) (here, $Q_{11}$ through $Q_{15}$ are each independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group), but is not limited thereto.

As used herein, the unsubstituted $C_1$-$C_{60}$ alkoxy group (or $C_1$-$C_{60}$ alkoxy group) has a formula of —OA (in this regard, A is the unsubstituted $C_1$-$C_{60}$ alkyl group as described above) and examples thereof include methoxy, ethoxy, isopropyloxy, and the like. In the substituted $C_1$-$C_{60}$ alkoxy group, at least one hydrogen atom of the unsubstituted $C_1$-$C_{60}$ alkoxy group may be substituted with the same substituents as those described above with respect to the substituted $C_1$-$C_{60}$ alkyl group.

As used herein, the unsubstituted $C_2$-$C_{60}$ alkenyl group (or $C_2$-$C_{60}$ alkenyl group) is interpreted to contain at least one carbon-carbon double bond in the body (e.g., the center) or at a terminal end of the unsubstituted $C_2$-$C_{60}$ alkyl group. Examples of the unsubstituted $C_2$-$C_{60}$ alkenyl group include ethenyl, propenyl, butenyl, and the like. In the substituted $C_2$-$C_{60}$ alkenyl group, at least one hydrogen atom of the unsubstituted $C_2$-$C_{60}$ alkenyl group may be substituted with the same substituents as those described above with respect to the substituted $C_1$-$C_{60}$ alkyl group.

As used herein, the unsubstituted $C_2$-$C_{60}$ alkynyl group (or $C_2$-$C_{60}$ alkynyl group) is interpreted to contain at least one carbon-carbon triple bond in the body (e.g., the center) or at a terminal end of the $C_2$-$C_{60}$ alkyl group defined above. Examples of the unsubstituted $C_2$-$C_{60}$ alkynyl group include ethynyl, propynyl, and the like. In the substituted $C_1$-$C_{60}$ alkynyl group, at least one hydrogen atom of the unsubstituted $C_2$-$C_{60}$ alkynyl group may be substituted with the same substituents as those described above with respect to the substituted $C_1$-$C_{60}$ alkyl group.

As used herein, the unsubstituted $C_6$-$C_{60}$ aryl group indicates a monovalent group having an aromatic carbocyclic system that has 6 to 60 carbon atoms and at least one aromatic ring and the unsubstituted $C_6$-$C_{60}$ arylene group indicates a divalent group having an aromatic carbocyclic system that has 6 to 60 carbon atoms and at least one aromatic ring. If the $C_6$-$C_{60}$ aryl group and the $C_6$-$C_{60}$ arylene group each independently have two or more aromatic rings, the rings may be fused with each other. In the substituted $C_6$-$C_{60}$ aryl group and the substituted $C_5$-$C_{60}$ arylene group, at least one hydrogen atom of each of the unsubstituted $C_6$-$C_{60}$ aryl group and the unsubstituted $C_6$-$C_{60}$ arylene group, respectively, may be substituted with the same substituents as those described above with respect to the substituted $C_1$-$C_{60}$ alkyl group.

As used herein, examples of the substituted or unsubstituted $C_6$-$C_{60}$ aryl group include, but are not limited to, a phenyl group, a $C_1$-$C_{10}$ alkylphenyl group (e.g., an ethylphenyl group), a $C_1$-$C_{10}$ alkylbiphenyl group (e.g., an ethylbiphenyl group), a halophenyl group (e.g., an o-, m- and p-fluorophenyl group, and a dichlorophenyl group), a dicyanophenyl group, a trifluoromethoxyphenyl group, an o-, m-, and p-tolyl group, an o-, m- and p-cumenyl group, a mesityl group, a phenoxyphenyl group, an (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (e.g., a fluoronaphthyl group), a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, a heptalenyl group, an acenaphthylenyl group, a phenalenyl group, a fluorenyl group, an anthraquinolinyl group, a methylanthracenyl group, a phenanthrenyl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl, a pyranthrenyl group, and an ovalenyl group. Examples of the substituted $C_6$-$C_{60}$ aryl group may be easily understood with reference to the examples of the unsubstituted $C_6$-$C_{60}$ aryl group described above and the substituents of the substituted $C_1$-$C_{60}$ alkyl group. Examples of the substituted or unsubstituted $C_6$-$C_{60}$ arylene group may be easily understood with reference to the substituted or unsubstituted $C_6$-$C_{60}$ aryl group described above.

As used herein, the unsubstituted $C_2$-$C_{60}$ heteroaryl group indicates a monovalent group having at least one aromatic ring system including carbon rings and at least one hetero atom selected from the group consisting of N, O, P, Si, and S, and the unsubstituted $C_2$-$C_{60}$ heteroarylene group indicates a divalent group having at least one aromatic ring system including carbon rings and at least one hetero atom selected from the group consisting of N, O, P, Si, and S. In this regard, if the $C_2$-$C_{60}$ heteroaryl group and the $C_2$-$C_{60}$ heteroarylene group each independently have two or more aromatic rings, the rings may be fused with each other. In the substituted $C_2$-$C_{60}$ heteroaryl group and substituted $C_2$-$C_{60}$ heteroarylene group, at least one hydrogen atom of each of the $C_2$-$C_{60}$ heteroaryl group and the unsubstituted $C_2$-$C_{60}$ heteroarylene group, respectively, may be substituted with the same substituents as those described above with respect to the $C_1$-$C_{60}$ alkyl group.

As used herein, examples of the unsubstituted $C_2$-$C_{60}$ heteroaryl group include, but are not limited to, a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{60}$ heteroarylene group may be easily understood with reference to the examples of the substituted or unsubstituted $C_2$-$C_{60}$ arylene group.

The substituted or unsubstituted $C_6$-$C_{60}$ aryloxy group has a formula of —OA$_2$, wherein A$_2$ is the substituted or unsubstituted $C_5$-$C_{60}$ aryl group as described above, and the substituted or unsubstituted $C_6$-$C_{60}$ arylthio group has a formula of —SA$_3$, wherein A$_3$ is the substituted or unsubstituted $C_6$-$C_{60}$ aryl group described above.

Hereinafter, an OLED according to an embodiment of the present invention will now be described in more detail with reference to the following examples. However, these examples are for illustrative purposes only and are not intended to limit the scope of the invention to the Synthesis Examples and Examples below. In the Synthesis Examples, an amount of 'B' used and an amount of 'A' used were the same, based on a molar equivalent, in the expression "B' was used instead of 'A'".

EXAMPLE

Synthesis Example 1

Synthesis of Compound 3

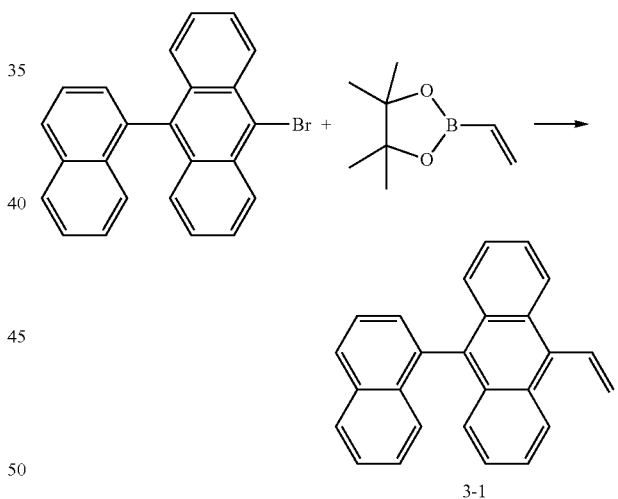

Synthesis of Intermediate 3-1

3.832 g (10 mmol) of 9-bromo-10-naphthalene-anthracene, 1.848 g (12 mmol) of vinyl boronic acid pinacol ester, 0.577 g (0.5 mmol) of Pd(PPh$_3$)$_4$, and 0.207 g (15 mmol) of K$_2$CO$_3$ were dissolved in 100 of a mixed solution of THF/H$_2$O (a volume ratio of 2/1), and stirred at a temperature of 80° C. for 12 hours. After cooling the reaction solution to room temperature, 50 ml of water was added thereto, and the reaction solution was extracted three times with 150 ml of ethyl ether to separate an organic layer. The obtained organic layer was dried with magnesium sulfate, and a solvent was evaporated therefrom to obtain a crude product. The crude product was purified with silica gel column chromatography to obtain 2.577 g (7.8 mmol) of Intermediate 3-1 (yield 78%).

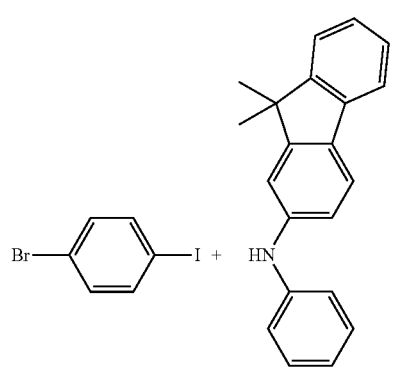

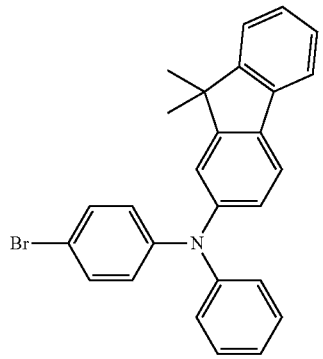

3-2

Synthesis of Intermediate 3-2

2.829 g (10 mmol) of 4-bromoiodobenzene, 2.853 g (10 mmol) of 9,9-dimethylfluorene-phenylamine, 0.452 g (0.5 mmol) of tris(dibenzylideneacetone)dipalladium) (Pd$_2$(dba)$_3$), 0.101 g (0.5 mmol) of P(tBu)$_3$, and 0.961 g (10 mmol) of NaOtBu were dissolved in 150 nil of toluene and stirred at 90° C. for 4 hours. After cooling the obtained reaction solution to room temperature, the reaction solution was extracted three times with 10 ml of water and 50 ml of diethylether. The obtained organic layer was dried with magnesium sulfate and a solvent was evaporated therefrom to obtain a crude product. The crude product was purified with silica gel column chromatography to obtain 3.611 g (8.2 mmol) of Intermediate 3-2 (yield 82%).

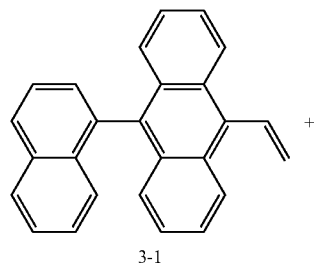

3-1

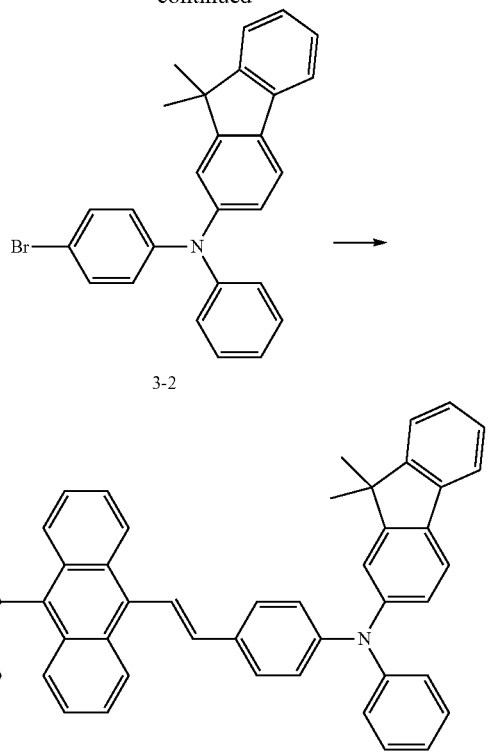

Synthesis of Compound 3

1.652 g (5.0 mmol) of Intermediate 3-1, 2.201 g (5.0 mmol) of Intermediate 3-2, 0.056 g (0.25 mmol) of palladium(II) acetate (Pd(OAc)$_2$), 0.76 g (0.25 mmol) of P(p-toly)$_3$, and 1.019 g (10.0 mmol) of Et$_3$N were dissolved in 50 ml of dimethylacetamide (DMAc) and stirred at 100° C. for 12 hours. The obtained reaction solution was cooled down to room temperature and then extracted three times with 30 ml of water and 30 ml of diethylether. The obtained organic layer was dried with magnesium sulfate and a solvent was evaporated therefrom to obtain a crude product. The crude product was purified with silica gel column chromatography to obtain 1.586 g (2.3 mmol) of Compound 3 (yield 56%). LS/MS and $^1$H NMR data for the synthesized compound are shown in Table 1.

Synthesis Example 2

Synthesis of Compound 19

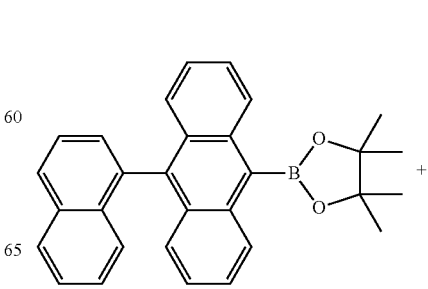

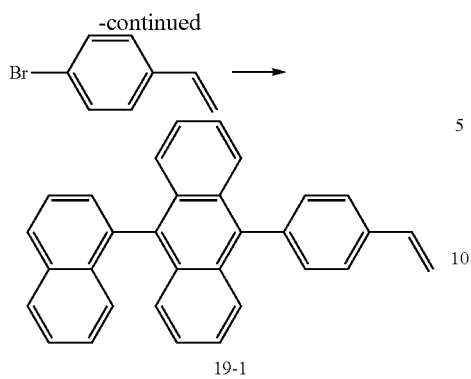

19-1

Synthesis of Intermediate 19-1

Intermediate 19-1 was synthesized in the same manner as in the synthesis of Intermediate 3-1 of Synthesis Example 1, except that 4,4,5,5-tetramethyl-2-(10-(naphthalen-4-yl)anthracen-9-yl)-1,3,2-dioxaborolane and 4-bromostyrene were used instead of 9-bromo-10-naphthalen-anthracene and vinyl boronic acid pinacol ester, respectively.

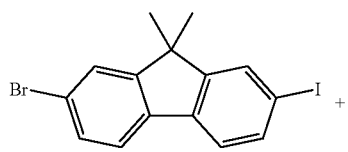

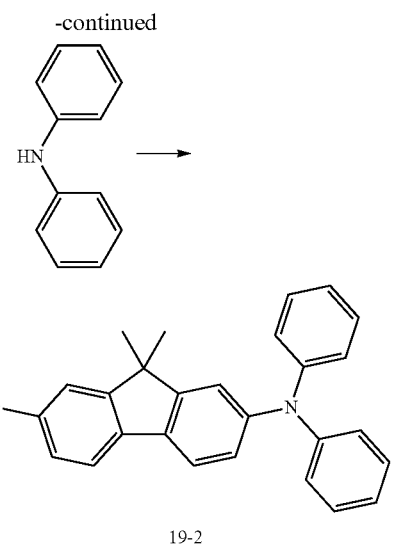

19-2

Synthesis of Intermediate 19-2

Intermediate 19-2 was synthesized in the same manner as in the synthesis of Intermediate 32 of Synthesis Example 1, except that 2-bromo-7-iodo-9,9-dimethylfluorene and diphenylamine were used instead of 4-bromoiodobenzene and 9,9-dimenthylfluoren-phenylamine, respectively.

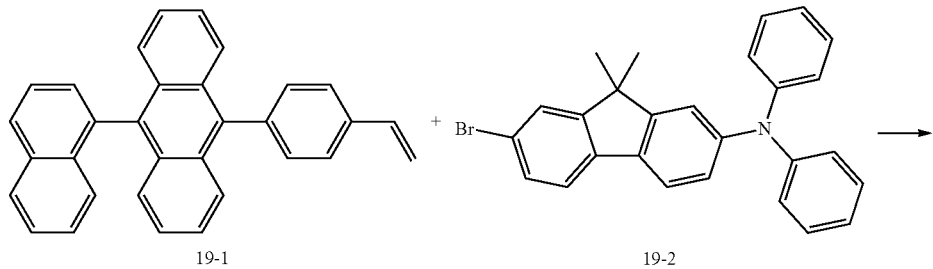

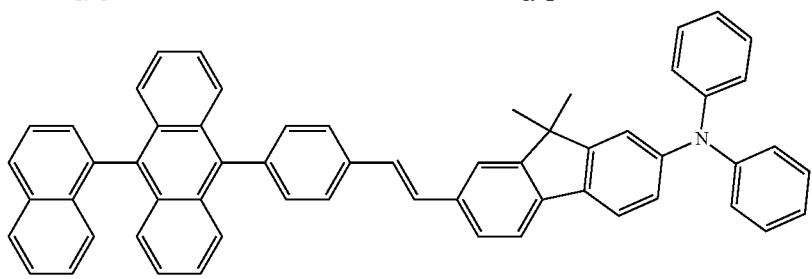

19

Synthesis of Compound 19

1.225 g (1.6 mmol) of Compound 19 (yield 53%) was synthesized in the same manner as in the synthesis of Compound 3 of Synthesis Example 1, except that Intermediate 19-1 and Intermediate 19-2 were used instead of Intermediate 3-1 and Intermediate 3-2, respectively. LS/MS and $^1$H NMR data for the synthesized compound are shown in Table 1.

Synthesis Example 3

Synthesis of Compound 30

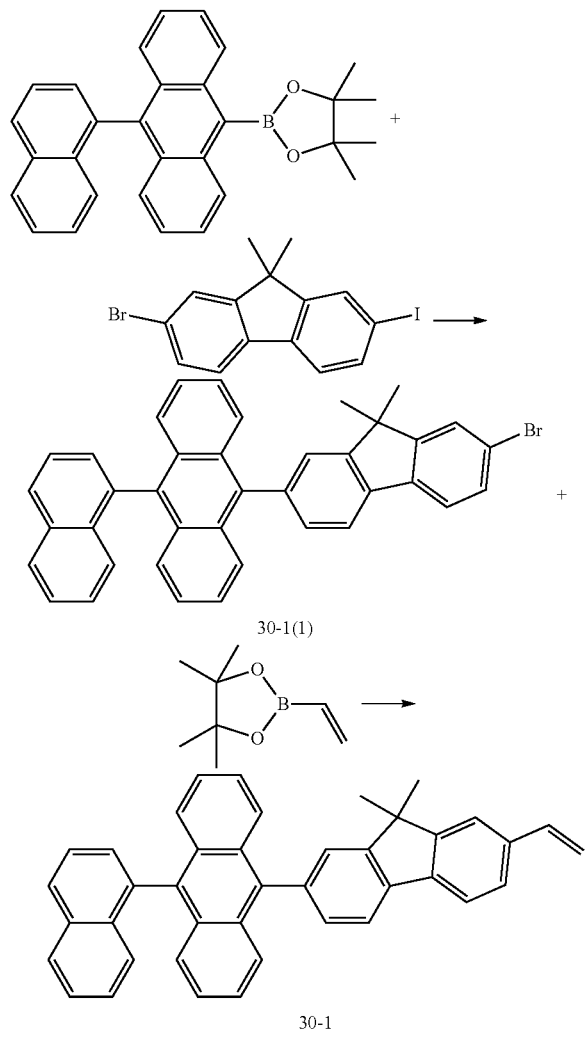

30-1(1)

30-1

Synthesis of Intermediate 30-1(1)

Intermediate 30-1(1) was synthesized in the same manner as in the synthesis of Intermediate 19-1 of Synthesis Example 2, except that 2-bromo-7-iodo-9,9-dimethylfluorene was used instead of 4-bromostyrene.

Synthesis of Intermediate 30-1

Intermediate 30-1 was synthesized in the same manner as in the synthesis of Intermediate 3-1 of Synthesis Example 1, except that Intermediate 30-1(1) was used instead of 9-bromo-10-naphthalen-anthracene.

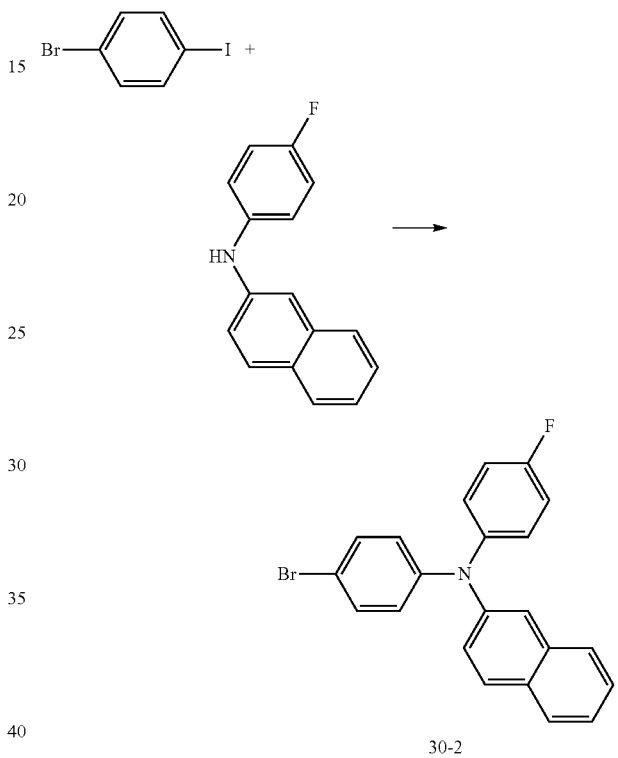

30-2

Synthesis of Intermediate 30-2

Intermediate 30-2 was synthesized in the same manner as in the synthesis of Intermediate 3-2 of Synthesis Example 1, except that N-(4-fluorophenyl)naphthalen-2-amine was used instead of 9,9-dimethylfluorene-phenylamine.

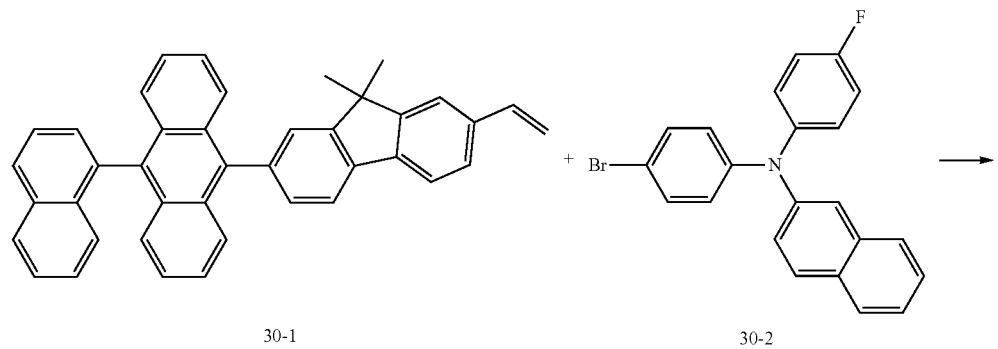

30-1      30-2

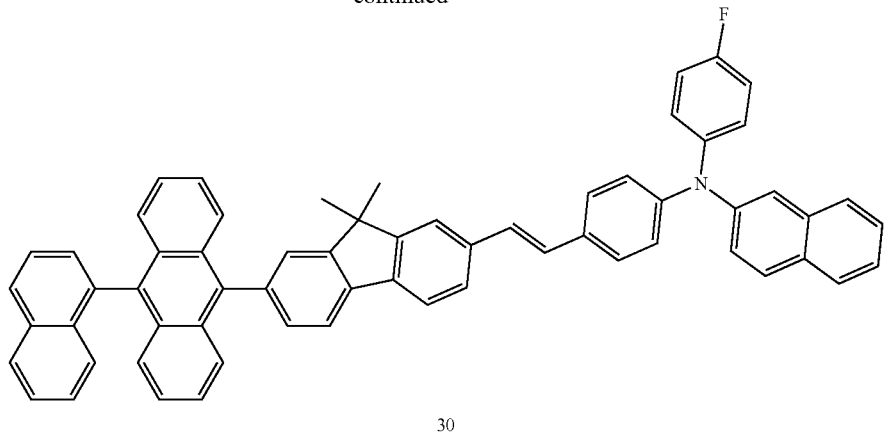

30

Synthesis of Intermediate 30

1.0425 g (1.25 mmol) of Compound 30 (yield 50%) was synthesized in the same manner as in the synthesis of Compound 3 of Synthesis Example 1, except that Intermediate 30-1 and Intermediate 30-2 were used instead of Intermediate 3-1 and Intermediate 3-2, respectively. LS/MS and ¹H NMR data for the synthesized compound are shown in Table 1.

Synthesis Example 4

Synthesis of Compound 40

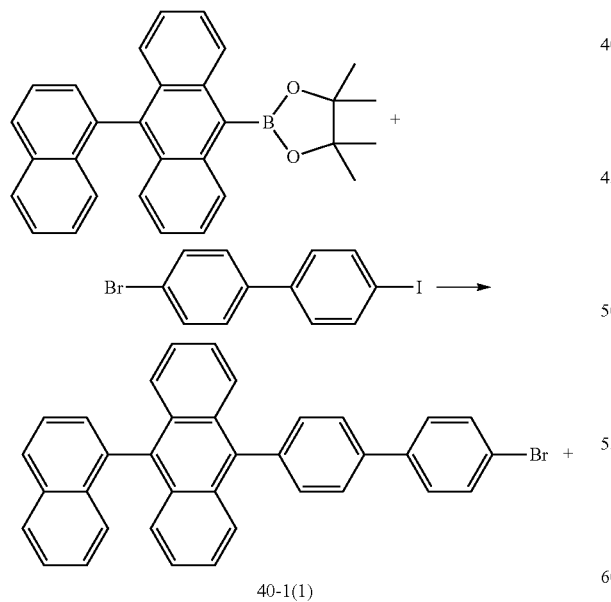

40-1(1)

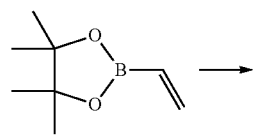

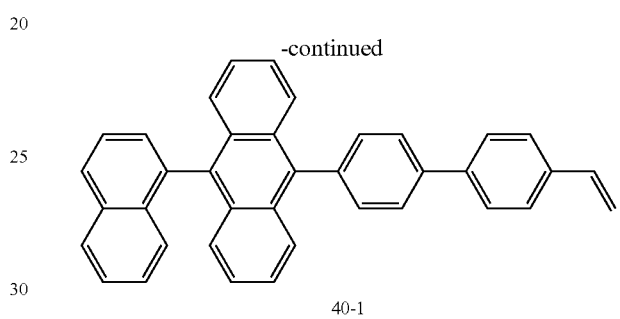

40-1

Synthesis of Intermediate 40-1(1)

Intermediate 40-1(1) was synthesized in the same manner as in the synthesis of Intermediate 19-1 of Synthesis Example 2, except that 4-bromo-4-iodo-biphenyl was used instead of 4-bromostyrene.

Synthesis of Intermediate 40-1

Intermediate 40-1 was synthesized in the same manner as in the synthesis of Intermediate 3-1 of Synthesis Example 1, except that Intermediate 40-1(1) was used instead of 9-bromo-10-naphthalen-anthracene.

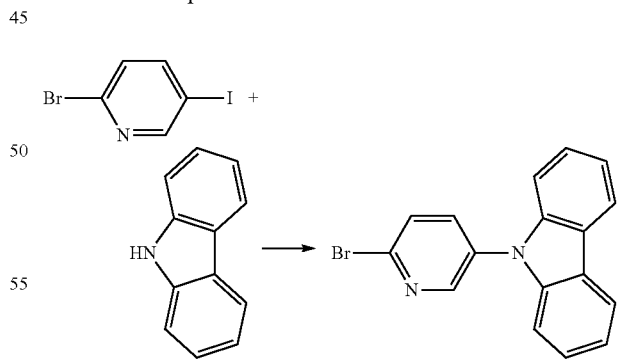

40-2

Synthesis of Intermediate 40-2

Intermediate 40-2 was synthesized in the same manner as in the synthesis of Intermediate 3-2 of Synthesis Example 1, except that 2-bromo-5-iodopyridine and carbazole were used instead of 4-bromoiodobenzene and 9,9-dimethylfluoren-phenylamine, respectively.

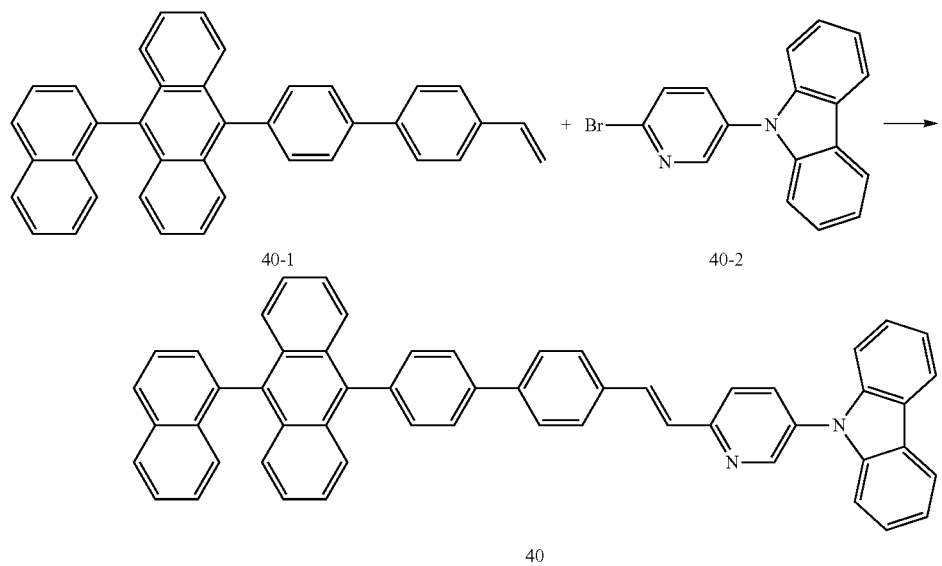

Synthesis of Compound 40

0.986 g (1.36 mmol) of Compound 40 (yield 67%) was synthesized in the same manner as in the synthesis of Compound 3 of Synthesis Example 1, except that Intermediate 40-1 and Intermediate 40-2 were used instead of Intermediate 3-1 and Intermediate 3-2, respectively. LS/MS and $^1$H NMR data for the synthesized compound are shown in Table 1.

Synthesis Example 5

Synthesis of Compound 47

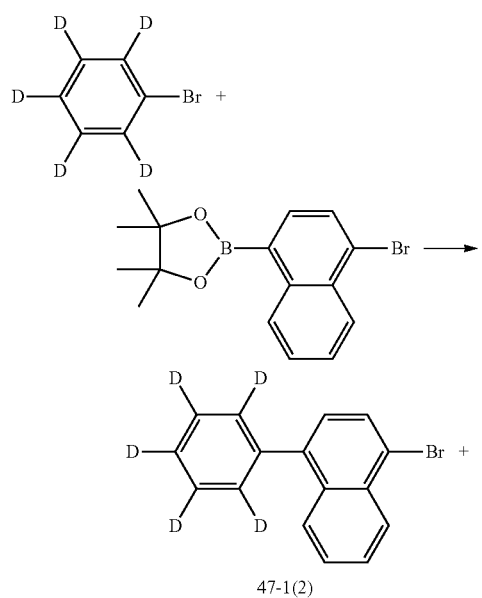

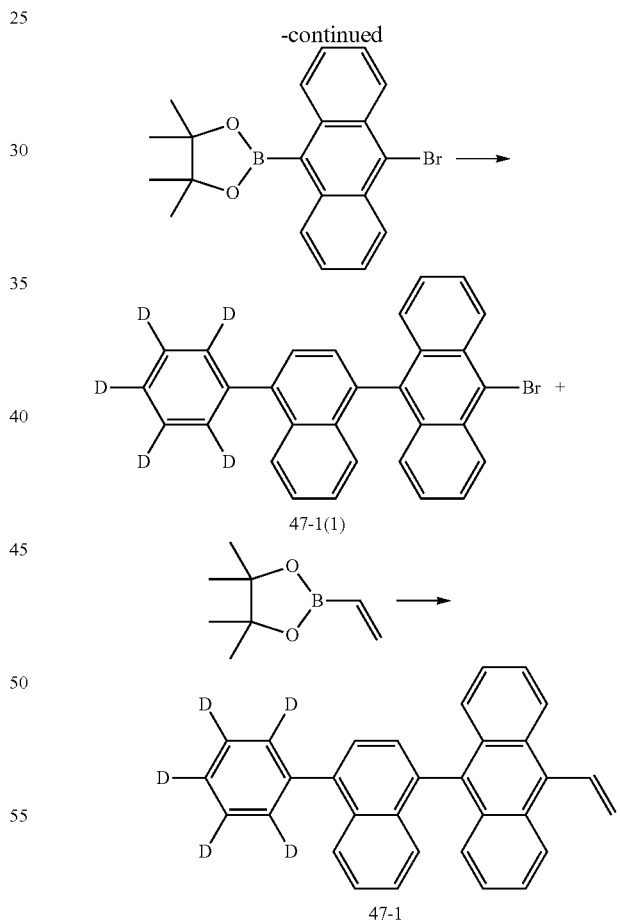

Synthesis of Intermediate 47-1(2)

Intermediate 47-1(2) was synthesized in the same manner as in the synthesis of Intermediate 3-1 of Synthesis Example 1, except that bromobenzene-d5 and 2-(1-bromonaphthalen-4-yl)-4,4,5,5-tetramethyl-1,3,2-dioxaborolane were used instead of 9-bromo-10-naphthalen-anthracene and vinyl boronic acid pinacol ester, respectively.

Synthesis of Intermediate 47-1(1)

Intermediate 47-1(1) was synthesized in the same manner as in the synthesis of Intermediate 3-1 of Synthesis Example 1, except that Intermediate 47-1(2) and 2-(10-bromoanthracen-9-yl)-4,4,5,5-tetramethyl-1,3,2-dioxaborolane were used instead of 9-bromo-10-naphthalen-anthracene and vinyl boronic acid pinacol ester, respectively.

Synthesis of Intermediate 47-1

Intermediate 47-1 was synthesized in the same manner as in the synthesis of Intermediate 3-1 of Synthesis Example 1, except that Intermediate 47-1(1) was used instead of 9-bromo-10-naphthalen-anthracene.

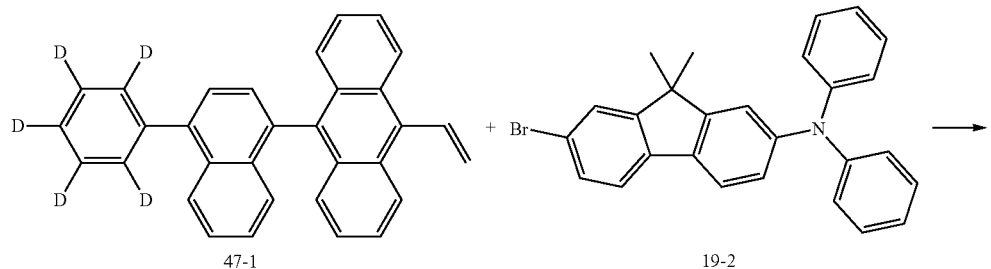

Synthesis of Intermediate 19-2

Intermediate 19-2 was prepared in the same manner as in Synthesis Example 2.

Synthesis of Compound 47

1.164 g (1.5 mmol) of Compound 47 (yield 75%) was synthesized in the same manner as in the synthesis of Compound 3 of Synthesis Example 1, except that Intermediate 47-1 and Intermediate 19-2 were used instead of Intermediate 3-1 and Intermediate 3-2, respectively. LS/MS and $^1$H NMR data for the synthesized compound are shown in Table 1.

Synthesis Example 6

Synthesis of Compound 56

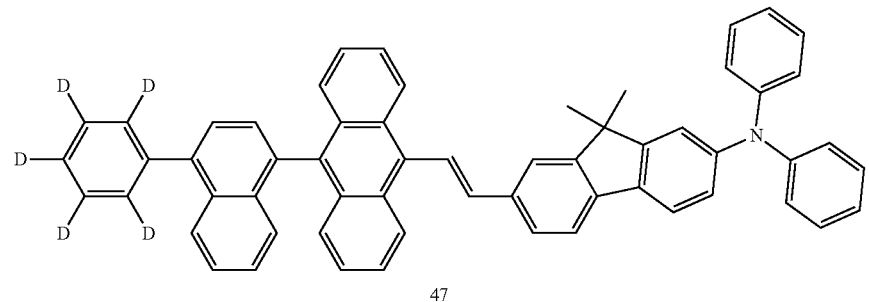

-continued

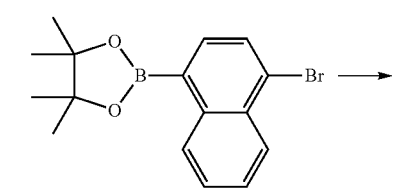

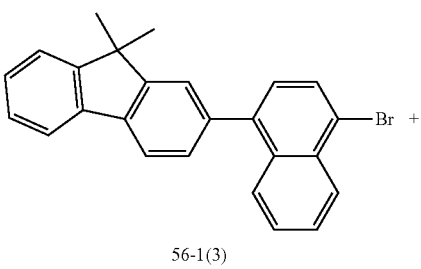

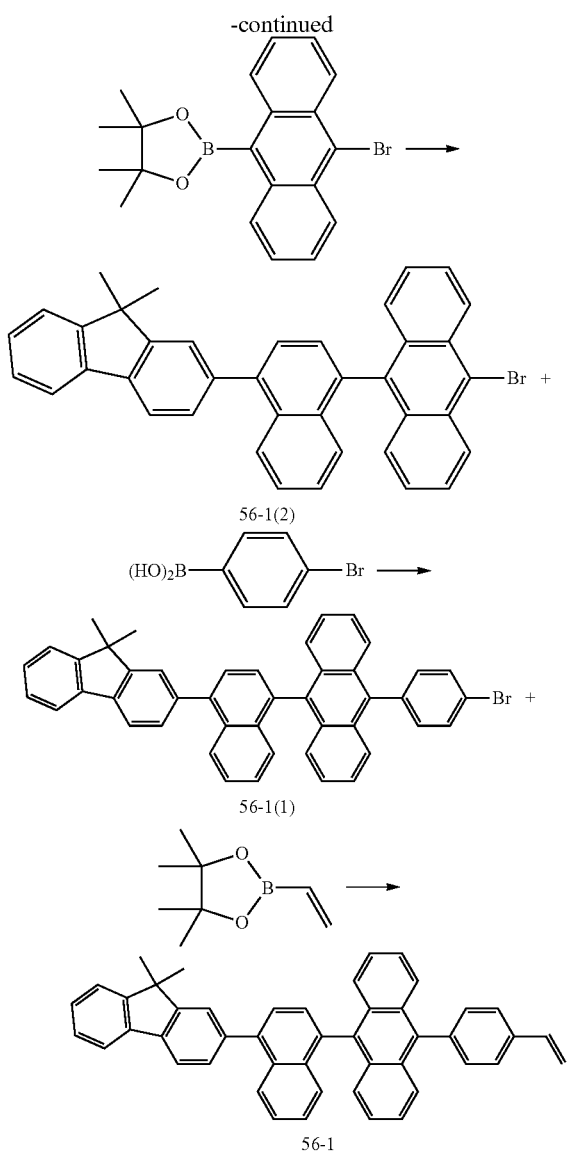

lane were used instead of 9-bromo-10-naphthalen-anthracene and vinyl boronic acid pinacol ester, respectively.

Synthesis of Intermediate 56-1(2)

Intermediate 56-1(2) was synthesized in the same manner as in the synthesis of Intermediate 3-1 of Synthesis Example 1, except that Intermediate 56-1(1) and 2-(10-bromoanthracen-9-yl)-4,4,5,5-tetramethyl-1,3,2-dioxaborolane were used instead of 9-bromo-10-naphthalen-anthracene and vinyl boronic acid pinacol ester, respectively.

Synthesis of Intermediate 56-1(1)

Intermediate 56-1(1) was synthesized in the same manner as in the synthesis of Intermediate 3-1 of Synthesis Example 1, except that Intermediate 56-1(2) and 1-bromophenyl-4-boronic acid were used instead of 9-bromo-10-naphthalen-anthracene and vinyl boronic acid pinacol ester, respectively.

Synthesis of Intermediate 56-1

Intermediate 56-1 was synthesized in the same manner as in the synthesis of Intermediate 3-1 of Synthesis Example 1, except that Intermediate 56-1(1) was used instead of 9-bromo-10-naphthalen-anthracene.

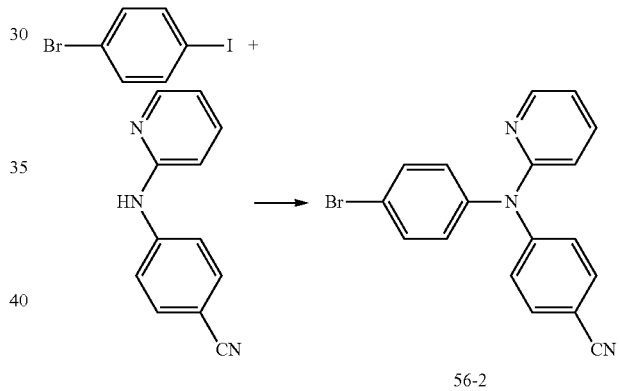

Synthesis of Intermediate 56-1(3)

Intermediate 56-1(3) was synthesized in the same manner as in the synthesis of Intermediate 3-1 of Synthesis Example 1, except that 2-bromo-9,9-dimethylfluorene and 2-(1-bromonaphthalen-4-yl)-4,4,5,5-tetramethyl-1,3,2-dioxaboro- Synthesis of Intermediate 56-2

Intermediate 56-2 was synthesized in the same manner as in the synthesis of Intermediate 3-2 of Synthesis Example 1, except that 4-(pyridin-2-ylamino)benzonitrile was used instead of 9,9-dimethylfluoren-phenylamine.

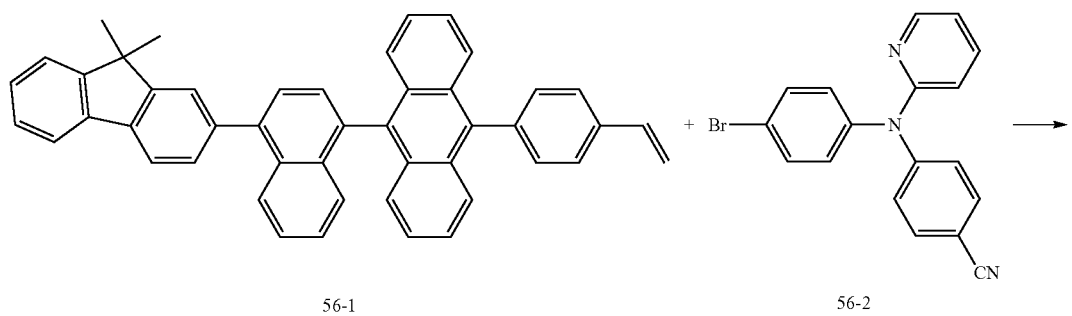

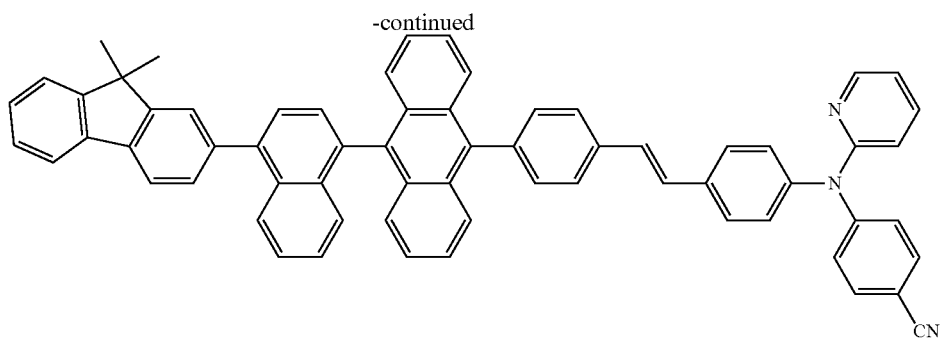

56

Synthesis of Compound 56

0.903 g (1.05 mmol) of Compound 56 (yield 50%) was synthesized in the same manner as in the synthesis of Compound 3 of Synthesis Example 1, except that Intermediate 56-1 and Intermediate 56-2 were used instead of Intermediate 3-1 and Intermediate 3-2, respectively. LS/MS and $^1$H NMR data for the synthesized compound are shown in Table 1.

Synthesis Example 7

Synthesis of Compound 76

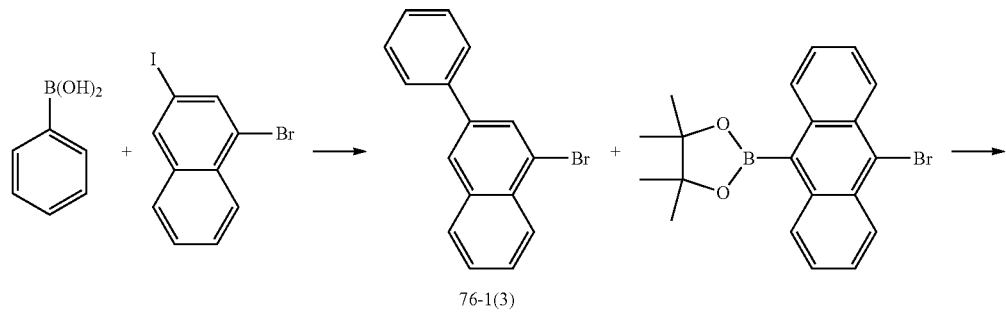

76-1(3)

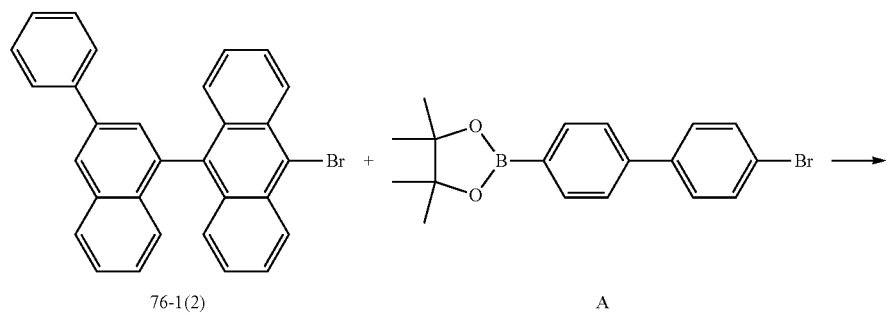

76-1(2)    A

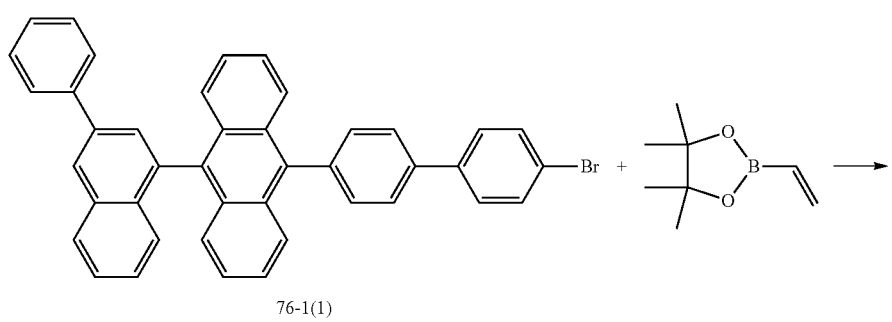

76-1(1)

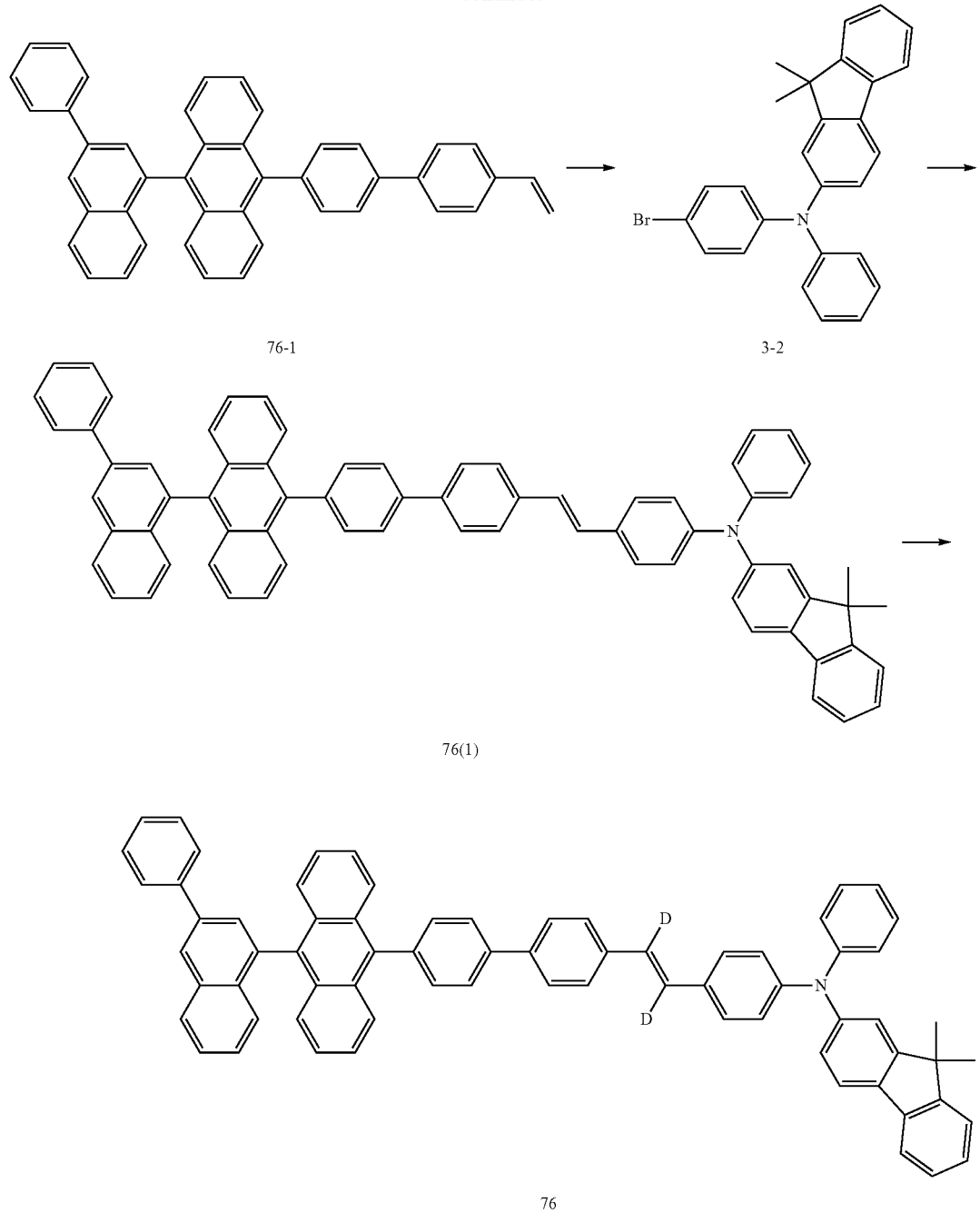

Synthesis of Intermediate 76-1(3)

Intermediate 76-1(3) was synthesized in the same manner as in the synthesis of Intermediate 3-1 of Synthesis Example 1, except that 2-iodo-4-bromo-naphthalene and phenylboronic acid were used instead of 9-bromo-10-naphthalen-anthracene and vinyl boronic acid pinacol ester, respectively.

Synthesis of Intermediate 76-1(21

Intermediate 76-1(2) was synthesized in the same manner as in the synthesis of Intermediate 3-1 of Synthesis Example 1, except that Intermediate 76-1(3) and 2-(10-bromoanthracen-9-yl)-4,4,5,5-tetramethyl-1,3,2-dioxaborolane were used instead of 9-bromo-10-naphthalen-anthracene and vinyl boronic acid pinacol ester, respectively.

Synthesis of Intermediate 76-1(1)

Intermediate 76-1(1) was synthesized in the same manner as in the synthesis of Intermediate 3-1 of Synthesis Example 1, except that Intermediate 76-1(2) and Intermediate A were used instead of 9-bromo-10-naphthalen-anthracene and vinyl boronic acid pinacol ester, respectively.

Synthesis of Intermediate 76(1)

Intermediate 76(1) was synthesized in the same manner as in the synthesis of Intermediate 3-1 of Synthesis Example 1, except that Intermediate 76-1(1) was used instead of Intermediate 3-1.

Synthesis of Compound 76

0.911 g (1.0 mmol) of Intermediate 76(1), 0.009 g (0.01 mmol) of [(Ph$_3$)P]$_3$Ru(CO)(Cl)H, and 0.05 mL (3.0 mmol) of D$_2$O were dissolved in 10 mL of 1,4-dioxane and stirred at 80° C. for 12 hours. The obtained reaction solution was cooled down to room temperature and then extracted three times with 30 ml of water and 30 ml of dichloromethane. The obtained organic layer was dried with magnesium sulfate and a solvent was evaporated therefrom to obtain a crude product. The crude product was purified with silica gel column chromatography to obtain 0.455 g of Compound 76 (yield 50%). LS/MS and $^1$H NMR data for the synthesized compound are shown in Table 1.

Synthesis Example 8

Synthesis of Compound 1

1.492 g (2.6 mmol) of Compound 1 (yield 65%) was synthesized in the same manner as in Synthesis Example 1, except that diphenylamine was used instead of 9,9-dimethylfluoren-phenylamine in the synthesis of Intermediate 3-2. LS/MS and $^1$H NMR data for the synthesized compound are shown in Table 1.

Synthesis Example 9

Synthesis of Compound 4

1.77 g (2.5 mmol) of Compound 4 (yield 62%) was synthesized in the same manner as in Synthesis Example 1, except that N-(4-fluorophenyl)-9,9-dimethyl-9H-fluoren-2-amine was used instead of 9,9-dimethylfluoren-phenylamine in the synthesis of Intermediate 3-2. LS/MS and $^1$H NMR data for the synthesized compound are shown in Table 1.

Synthesis Example 10

Synthesis of Compound 5

1.422 g (1.9 mmol) of Compound 5 (yield 49%) was synthesized in the same manner as in Synthesis Example 1, except that 9,9-dimethyl-N-(naphthalen-3-yl)-9H-fluoren-2-amine was used instead of 9,9-dimethylfluoren-phenylamine in the synthesis of Intermediate 3-2. LS/MS and $^1$H NMR data for the synthesized compound are shown in Table 1.

Synthesis Example 11

Synthesis of Compound 13

1.859 g (2.8 mmol) of Compound 13 (yield 71%) was synthesized in the same manner as in Synthesis Example 2, except that 4-bromoiodobenzene was used instead of 2-bromo-7-iodo-9,9-dimethylfluorene in the synthesis of Intermediate 19-2. LS/MS and $^1$H NMR data for the synthesized compound are shown in Table 1.

Synthesis Example 12

Synthesis of Compound 15

1.439 g (1.8 mmol) of Compound 15 (yield 49%) was synthesized in the same manner as in Synthesis Example 2, except that 4-bromoiodobenzene and 4-(9,9-dimethyl-9H-fluoren-2-ylamino)benzonitrile were used instead of 2-bromo-7-iodo-9,9-dimethylfluorene and diphenylamine, respectively, in the synthesis of Intermediate 19-2. LS/MS and $^1$H NMR data for the synthesized compound are shown in Table 1.

Synthesis Example 13

Synthesis of Compound 18

1.062 g (1.5 mmol) of Compound 18 (yield 37%) was synthesized in the same manner as in Synthesis Example 2, except that 4-bromoiodobenzene and 4-(pyridin-2-ylamino)benzonitrile were used instead of 2-bromo-7-iodo-9,9-dimethylfluorene and diphenylamine, respectively, in the synthesis of Intermediate 19-2. LS/MS and $^1$H NMR data for the synthesized compound are shown in Table 1.

Synthesis Example 14

Synthesis of Compound 22

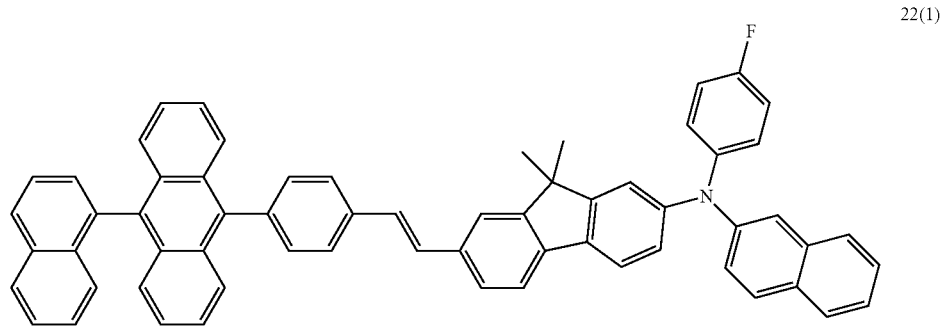 [SMILES: CC1(C)c2cc(/C=C/c3ccc(-c4c5ccccc5c(-c5cccc6ccccc56)c5ccccc45)cc3)ccc2-c2ccc(N(c3ccc(F)cc3)c3ccc4ccccc4c3)cc21]

22(1)

Synthesis of Intermediate 22(1)

Intermediate 22(1) was synthesized in the same manner as in Synthesis Example 2, except that N-(4-fluorophenyl)naphthalen-2-amine was used instead of diphenylamine in the synthesis of Intermediate 19-2.

Synthesis of Compound 22

1.3785 g (1.6 mmol) of Compound 22 (yield 40%) was synthesized in the same manner as in the synthesis of Compound 76 of Synthesis Example 7, except that Intermediate 22(1) was used instead of Intermediate 76(1). LS/MS and $^1$H NMR data for the synthesized compound are shown in Table 1.

Synthesis Example 15

Synthesis of Compound 28

1.472 g (2.1 mmol) of Compound 28 (yield 50%) was obtained in the same manner of Synthesis Example 3, except that 1-bromo-4-iodonaphthalene was used instead of 2-bromo-7-iodo-9,9-dimethylfluorene in the synthesis of Intermediate 30-1(1), and 5-bromo-2-iodopyridine and diphenylamine were used instead of 4-bromoiodobenzene and N-(4-fluorophenyl)naphthalene-2-amine in the synthesis of Intermediate 30-2. LS/MS and $^1$H NMR data for the synthesized compound are shown in Table 1.

Synthesis Example 16

Synthesis of Compound 29

1.685 g (2.2 mmol) of Compound 29 (yield 55%) was obtained in the same manner of Synthesis Example 3, except that 5-diphenylamine was used instead of N-(4-fluorophenyl)naphthalene-2-amine in the synthesis of Intermediate 30-2. LS/MS and $^1$H NMR data for the synthesized compound are shown in Table 1.

Synthesis Example 17

Synthesis of Compound 33

1.774 g (1.8 mmol) of Compound 33 (yield 49%) was obtained in the same manner of synthesis Example 3, except that 2-bromo-7-iodo-9,9-diphenyl-9H-fluorene was used instead of 2-bromo-7-iodo-9,9-dimethylfluorene in the synthesis of Intermediate 30-1(1), and N-p-tolylnaphthalene-2-amine was used instead of N-(4-fluorophenyl)naphthalene-2-amine in the synthesis of Intermediate 30-2. LS/MS and $^1$H NMR data for the synthesized compound are shown in Table 1.

Synthesis Example 18

Synthesis of Compound 36

1.836 g (2.5 mmol) of Compound 36 (yield 63%) was obtained in the same manner of synthesis Example 4, except that 4-bromoiodobenzene and diphenylamine were used instead of 2-bromo-5-iodopyridine and carbazole, respectively, in the synthesis of Intermediate 40-2. LS/MS and $^1$H NMR data for the synthesized compound are shown in Table 1.

Synthesis Example 19

Synthesis of Compound 43

1.501 g (1.9 mmol) of Compound 43 (yield 49%) was obtained in the same manner of synthesis Example 5, except that bromobenzene was used instead of bromobenzene-d5 in the synthesis of Intermediate 47-1(2), and Intermediate 3-2 was used instead of Intermediate 19-2 in the synthesis of Compound 47. LS/MS and $^1$H NMR data for the synthesized compound are shown in Table 1.

Synthesis Example 20

Synthesis of Compound 46

1.797 g (2.3 mmol) of Compound 46 (yield 58%) was obtained in the same manner of synthesis Example 5, except that bromobenzene was used instead of bromobenzene-d5 in the synthesis of Intermediate 47-1(2), and 5-bromo-2-iodopyridine and 9,9,-dimethylfluorene-phenylamine were used instead of 2-bromo-7-iodo-9,9-dimethylfluorene and diphenylamine, respectively, in the synthesis of Intermediate 19-2. LS/MS and $^1$H NMR data for the synthesized compound are shown in Table 1.

Synthesis Example 21

Synthesis of Compound 49

2.167 g (2.6 mmol) of Compound 49 (yield 65%) was obtained in the same manner of synthesis Example 5, except that 2-bromonaphthalene was used instead of bromobenzene-d5 in the synthesis of Intermediate 47-1(2), and 1-bromo-4-iodonaphthalene and 4-(naphthalene-3-ylamino)benzonitrile were used instead of 2-bromo-7-iodo-9,9-dimethylfluorene and diphenylamine, respectively, in the synthesis of Intermediate 19-2. LS/MS and $^1$H NMR data for the synthesized compound are shown in Table 1.

Synthesis Example 22

Synthesis of Compound 51

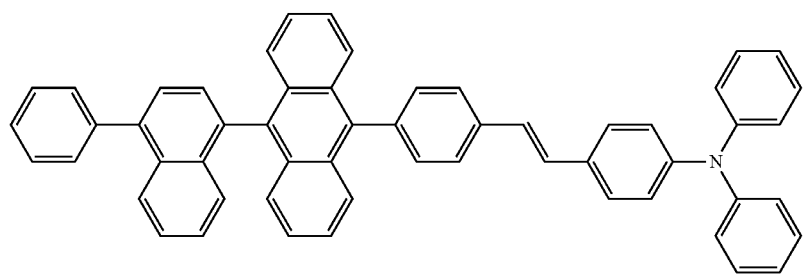

51(1)

Synthesis of Intermediate 51(1)

Intermediate 51(1) was synthesized in the same manner as in Synthesis Example 6, except that bromobenzene was used instead of 2-bromo-9,9-dimethylfluorene in the synthesis of Intermediate 56-1(3), and diphenylamine was used instead of 4-(pyridin-2-yl-amino)benzonitrile in the synthesis of Intermediate 56-2.

Synthesis of Compound 51

1.324 g (1.8 mmol) of Compound 51 (yield 80%) was obtained in the same manner of synthesis Example 7, except that Intermediate 51(1) was used instead of Intermediate 76(1). LS/MS and $^1$H NMR data for the synthesized compound are shown in Table 1.

Synthesis Example 23

Synthesis of Compound 54

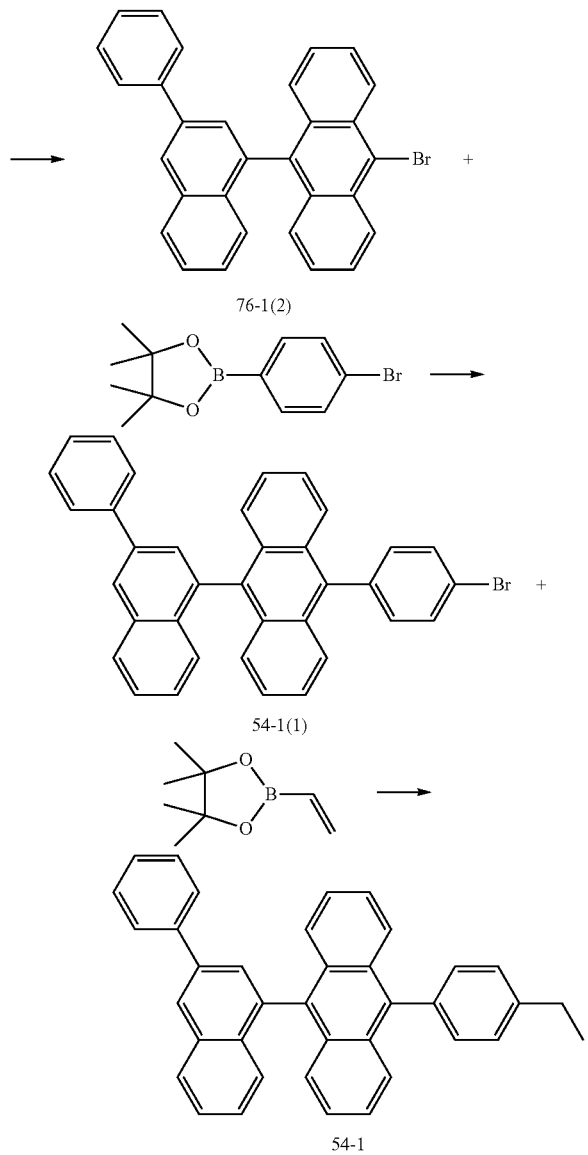

Synthesis of Intermediate 54-1(1)

Intermediate 54-1(1) was synthesized in the same manner as in the synthesis of Intermediate 76-1(1) of Synthesis Example 7, except that 2-(4-bromophenyl)-4,4,5,5-tetramethyl-1,3,2-dioxaborolane was used instead of Intermediate A.

Synthesis of Intermediate 54-1

Intermediate 54-1 was synthesized in the same manner as in the synthesis of Intermediate 76-1 of Synthesis Example 7, except that Intermediate 54-1(1) was used instead of Intermediate 76-1(1).

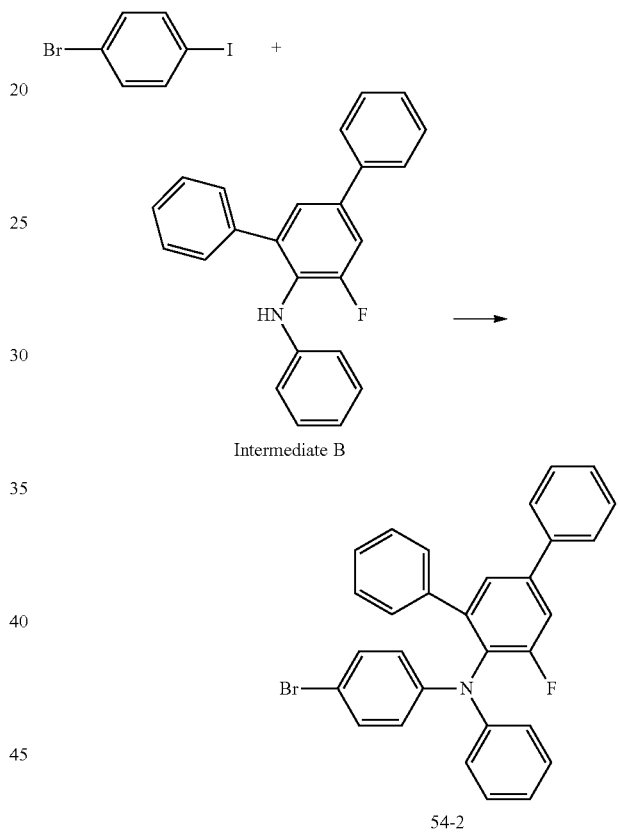

Synthesis of Intermediate 54-2

Intermediate 54-2 was synthesized in the same manner as in the synthesis of Intermediate 19-2 of Synthesis Example 2, except that Intermediate B was used instead of 9,9-dimethylfluorene-phenylamine.

Synthesis of Compound 54

1.747 g (1.9 mmol) of Compound 54 (yield 49%) was synthesized in the same manner as in the synthesis of Compound 3 of Synthesis Example 1, except that Intermediate 54-1 and Intermediate 54-2 were used instead of Intermediate 3-1 and Intermediate 3-2, respectively. LS/MS and $^1$H NMR data for the synthesized compound are shown in Table 1.

Synthesis Example 24

Synthesis of Compound 57

1.955 g (2.3 mmol) of Compound 57 (yield 58%) was synthesized in the same manner as in Synthesis Example 6, except that 3-bromopyridine was used instead of 2-bromo-9,9-dimethylfluorene in the synthesis of Intermediate 56-1 (3), and Intermediate 19-2 was used instead of Intermediate 56-2 in the synthesis of Compound 56. LS/MS and $^1$H NMR data for the synthesized compound are shown in Table 1.

Synthesis Example 25

Synthesis of Compound 61

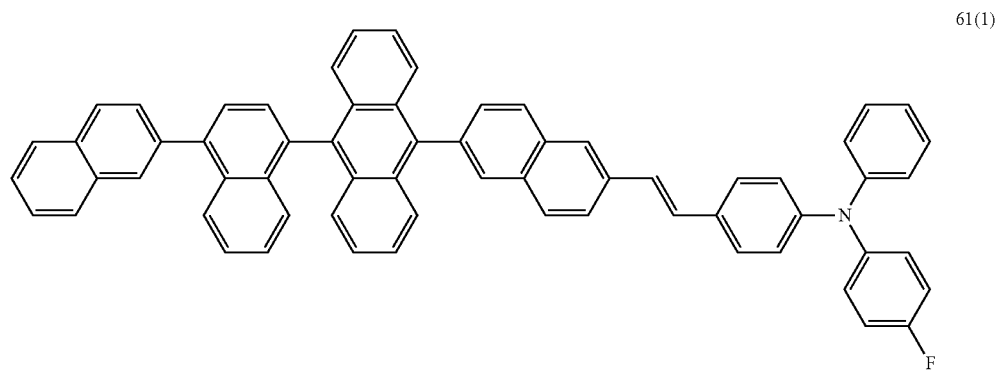 [SMILES: Fc1ccc(N(c2ccccc2)c2ccc(/C=C/c3ccc4cc(-c5c6ccccc6c(-c6ccc(-c7ccc8ccccc8c7)c7ccccc67)c6ccccc56)ccc4c3)cc2)cc1]

61(1)

Synthesis of Intermediate 61(1)

Intermediate 61(1) was synthesized in the same manner as in Synthesis Example 6, except that 2-bromonaphthalene was used instead of 2-bromo-9,9-dimethylfluorene in the synthesis of Intermediate 56-1(3), 6-bromonaphthalen-2-yl-2-boronic acid was used instead of 1-bromophenyl-4-boronic acid in the synthesis of Intermediate 56-2, and 4-fluoro-N-phenylbenzenamine was used instead of 4-(pyridine-2-yl-amino)benzonitrile in the synthesis of Intermediate 56-2.

Synthesis of Compound 61

1.482 g (1.7 mmol) of Compound 61 (yield 87%) was synthesized in the same manner as in the synthesis of Compound 76 of Synthesis Example 7, except that Intermediate 61(1) was used instead of Intermediate 76(1). LS/MS and $^1$H NMR data for the synthesized compound are shown in Table 1.

Synthesis Example 26

Synthesis of Compound 66

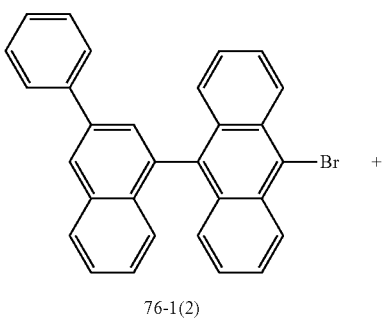

76-1(2)

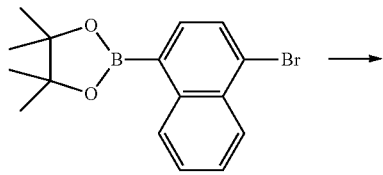

-continued

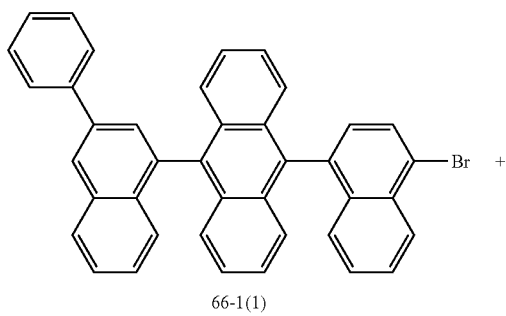

66-1(1)

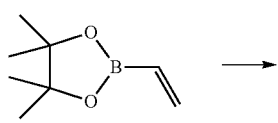

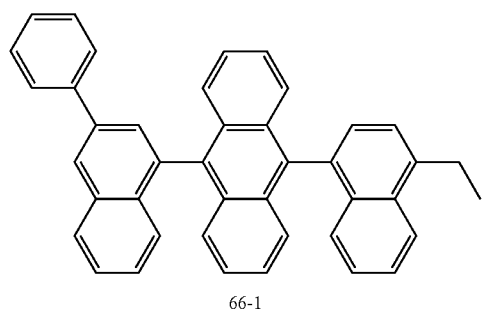

66-1

Synthesis of Intermediate 66-1(1)

Intermediate 66-1(1) was synthesized in the same manner as in the synthesis of Intermediate 76-1(1) of Synthesis Example 7, except that 2-(1-bromonaphthalen-4-yl)-4,4,5,5-tetramethyl-1,3,2-dioxaborolane was used instead of Intermediate A.

Synthesis of Intermediate 66-1

Intermediate 66-1 was synthesized in the same manner as in the synthesis of Intermediate 76-1 of Synthesis Example 7, except that Intermediate 66-1(1) was used instead of Intermediate 76-1(1).

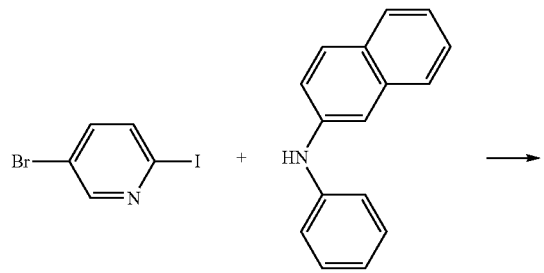

-continued

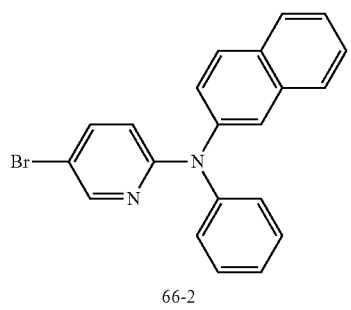

66-2

Synthesis of Compound 66-2

Intermediate 66-2 was synthesized in the same manner as in the synthesis of Intermediate 19-2 of Synthesis Example 2, except that 5-bromo-2-iodopyridine and N-phenylnaphthalen-2-amine were used instead of 4-bromoiodobenzene and 9,9-dimethylfluorene-phenylamine, respectively.

Synthesis of Compound 66

2.257 g (2.7 mmol) of Compound 66 (yield 68%) was synthesized in the same manner as in the synthesis of Compound 3 of Synthesis Example 1, except that Intermediate 66-1 and Intermediate 66-2 were used instead of Intermediate 3-1 and Intermediate 3-2, respectively. LS/MS and $^1$H NMR data for the synthesized compound are shown in Table 1.

Synthesis Example 27

Synthesis of Compound 74

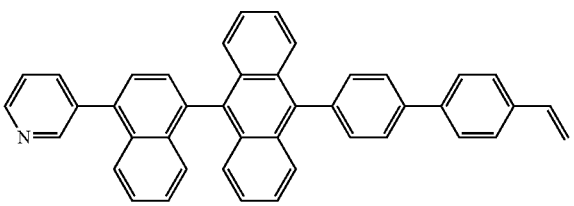

74-1

Synthesis of Intermediate 74-1

Intermediate 74-1 was sequentially synthesized in the same manners as in the syntheses of Intermediate 76-1(3), Intermediate 76-1(2), Intermediate 76-1(1), and Intermediate 76-1, except that 1-bromo-4-iodonaphthalene and pyridine-3-yl-3-boronic acid were used instead of 2-iodo-4-bromo-naphthalene and phenylboronic acid, respectively, in the synthesis of Intermediate 76-1(3).

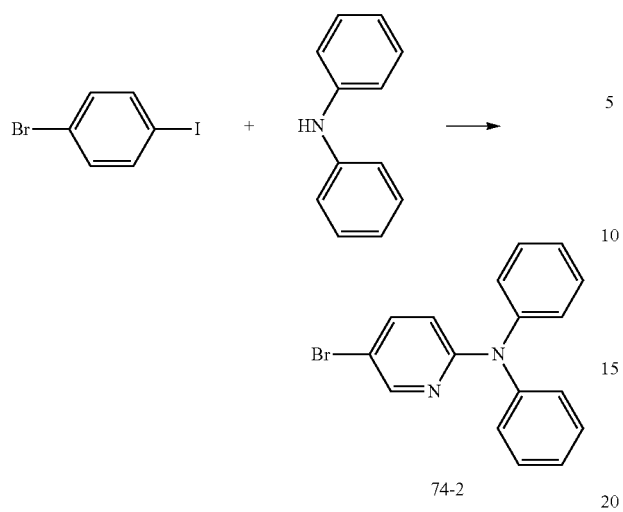

Synthesis of Intermediate 74-2

Intermediate 74-2 was synthesized in the same manner as in the synthesis of Intermediate 19-2 of Synthesis Example 2, except that diphenylamine was used instead of 9,9-dimethylfluorene-phenylamine.

Synthesis of Compound 74

1.491 g (1.9 mmol) of Compound 74 (yield 45%) was synthesized in the same manner as in the synthesis of Compound 3 of Synthesis Example 1, except that Intermediate 74-1 and Intermediate 74-2 were used instead of Intermediate 3-1 and Intermediate 3-2, respectively. LS/MS and $^1$H NMR data for the synthesized compound are shown in Table 1.

Synthesis Example 28

Synthesis of Compound 78

Compound 78 was synthesized in the same manner as in the synthesis of Compound 78 of Synthesis Example 27, except that Intermediate 40-2 was used instead of Intermediate 74-2. LS/MS and $^1$H NMR data for the synthesized compound are shown in Table 1.

TABLE 1

| Compound | $^1$H NMR (CDCl$_3$, 400 MHz) | LC/MS found | calc. |
|---|---|---|---|
| 1 | δ = 7.84 (m, 2H), 7.80-7.58 (m, 7H), 7.48-7.26 (m, 6H), 7.15-7.08 (m, 8H), 7.00 (dd, 2H), 6.96 (t, 2H), 6.65 (dd, 4H) | 574.33 | 573.25 |
| 3 | δ = 7.86 (m, 2H), 7.81-7.60 (m, 8H), 7.58 (d, 1H), 7.54-7.38 (m, 7H), 7.26-7.00 (m, 8H), 6.94-6.80 (m, 4H), 6.62 (d, 1H), 6.54 (d, 2H), 1.62 (s, 6H) | 699.86 | 698.31 |
| 4 | δ = 7.86 (m, 2H), 7.79-7.58 (m, 8H), 7.56 (d, 1H), 7.53-7.35 (m, 7H), 7.24 (t, 2H), 7.18-7.05 (m, 6H), 7.00 (dd, 2H), 6.92 (dd, 1H), 6.74 (q, 2H), 6.70 (d, 1H), 1.63 (s, 6H) | 708.90 | 707.30 |
| 5 | δ = 7.86 (m, 2H), 7.78-7.54 (m, 10H), 7.52-7.46 (m, 4H), 7.42-7.24 (m, 8H), 7.16-7.10 (m, 3H), 7.06-7.00 (m, 6H), 6.96 (dd, 1H), 6.74 (d, 1H), 1.63 (s, 6H) | 741.05 | 739.32 |
| 13 | δ = 7.74-7.70 (m, 5H), 7.64-7.58 (m, 6H), 7.50-7.22 (m, 9H), 7.16 (d, 1H), 7.14-7.06 (m, 6H), 6.94-6.88 (m, 4H), 6.66 (dd, 4H) | 650.44 | 649.28 |
| 15 | δ = 7.84-7.62 (m, 12H), 7.60-7.56(m, 2H), 7.50-7.46 (m, 3H), 7.42-7.22 (m, 8H), 7.15-7.10 (m, 3H), 7.06-6.78 (m, 7H), 6.62 (d, 1H), 1.63 (s, 6H) | 791.05 | 790.33 |
| 18 | δ = 7.96 (dd, 1H), 7.82-7.62 (m, 11H), 7.58-7.29 (m, 13H), 7.25-7.20-7.14 (m, 3H), 7.10-7.02 (m, 4H), 6.92 (dd, 1H) | 677.03 | 675.27 |
| 19 | δ = 7.85-7.66 (m, 14H), 7.62-7.54 (m, 3H), 7.50-7.40 (m, 5H), 7.28-7.18 (m, 7H), 6.98-6.94 (m, 3H), 6.84 (d, 1H), 6.64 (dd, 4H), 1.63 (s, 6H) | 766.35 | 765.34 |
| 22 | δ = 7.85-7.64 (m, 16H), 7.60-7.54 (m, 4H), 7.50-7.36 (m, 8H), 7.32 (dd, 1H), 7.24-7.18 (m, 3H), 7.02 (dd, 1H), 6.82 (d, 1H), 6.76 (dd, 2H), 1.63 (s, 6H) | 846.66 | 835.36 |
| 28 | δ = 8.23 (d, 1H), 7.86 (d, 1H), 7.82-7.60 (m, 11H), 7.54-7.48 (m, 3H), 7.44-7.22 (m, 10H), 7.18-7.04 (m, 6H), 6.82 (dd, 4H) | 701.44 | 700.29 |
| 29 | δ = 7.84-7.76 (m, 6H), 7.66-7.58 (m, 6H), 7.52-7.32 (m, 11H), 7.18-7.10 (m, 6H), 6.96-6.88 (m, 4H), 6.78 (d, 4H), 1.63 (s, 6H) | 766.89 | 765.34 |
| 30 | δ = 7.86-7.80 (m, 3H), 7.78-7.34 (m, 26H), 7.16-7.04 (m, 7H), 6.86-6.80 (m, 2H), 1.63 (s, 6H) | 834.45 | 833.35 |
| 33 | δ = 7.84-7.68 (m, 12H), 7.66-7.30 (m, 18H), 7.26-7.20 (m, 9H), 7.14-7.02 (m, 7H), 6.84-6.78 (m, 2H), 1.93 (s, 3H) | 954.44 | 953.40 |
| 36 | δ = 7.84-7.80 (m, 5H), 7.74-7.62 (m, 6H), 7.56-7.42 (m, 8H), 7.40-7.30 (m, 6H), 7.22-7.10 (m, 6H), 6.96-6.90 (m, 4H), 6.78 (dd, 4H) | 726.36 | 725.31 |
| 40 | δ = 8.23 (d, 1H), 8.05 (dd, 2H), 7.82-7.68 (m, 5H), 7.64-7.36 (m, 15H), 7.32-7.06 (m, 12H), 6.84 (t, 1H) | 725.44 | 724.29 |
| 43 | δ = 7.84-7.78 (m, 4H), 7.72-7.66 (m, 8H), 7.52-7.32 (m, 9H), 7.22-7.08 (m, 9H), 6.94-6.88 (m, 4H), 6.82-6.74 (m, 3H), 1.63 (s, 6H) | 766.89 | 765.34 |

TABLE 1-continued

| Compound | $^1$H NMR (CDCl$_3$, 400 MHz) | LC/MS found | LC/MS calc. |
|---|---|---|---|
| 46 | δ = 8.33 (d, 1H), 8.07 (dd, 4H), 7.86-7.64 (m, 10H), 7.60-7.36 (m, 9H), 7.32-7.14 (m, 8H), 7.05-6.98 (m, 3H), 6.88 (d, 1H), 1.62 (s, 6H) | 768.02 | 766.33 |
| 47 | δ = 7.96-7.90 (m, 3H), 7.84-7.70 (m, 9H), 7.54-7.48 (m, 4H), 7.40-7.28 (m, 8H), 7.02-6.94 (m, 3H), 6.88 (d, 1H), 6.68 (d, 4H), 1.62 (s, 6H) | 771.45 | 770.37 |
| 49 | δ = 8.10-7.99 (m, 4H), 7.94-7.78 (m, 10H), 7.74-7.52 (m, 10H), 7.48-7.44 (m, 3H), 7.40-7.32 (m, 5H), 7.28-7.04 (m, 6H), 6.82 (dd, 2H) | 824.46 | 824.32 |
| 51 | δ = 8.08-8.02 (m, 3H), 7.94-7.82 (m, 11H), 7.76-7.53 (m, 9H), 7.36-7.26 (m, 6H), 7.18-7.14 (m, 4H), 6.86 (dd, 4H) | 728.46 | 727.32 |
| 54 | δ = 7.94-7.90 (d, 2H), 7.84-7.42 (m, 33H), 7.36-7.30 (m, 5H), 7.05 (d, 1H), 6.84-6.68 (m, 3H), 6.36 (dd, 2H) | 896.54 | 895.36 |
| 56 | δ = 8.14 (dd, 1H), 8.02 (d, 1H), 7.86-7.80 (m, 8H), 7.76-7.70 (m, 6H), 7.62-7.54 (m, 6H), 7.50-7.34 (m, 6H), 7.28-7.20 (m, 5H), 7.16-7.08 (m, 5H), 6.88 (dd, 1H), 1.62 (s, 6H) | 868.66 | 867.36 |
| 57 | δ = 8.56 (d, 1H), 8.34 (dd, 1H), 7.92-7.80 (m, 15H), 7.74-7.62 (m, 7H), 7.54-7.42 (m, 8H), 7.23-7.18 (m, 3H), 7.12 (d, 1H), 6.88 (dd, 4H), 1.62 (s, 6H) | 843.88 | 842.37 |
| 61 | δ = 8.14-7.88 (m, 15H), 7.82-7.64 (m, 6H), 7.60-7.38 (m, 6H), 7.22-7.14 (m, 6H), 7.10-7.02 (m, 3H), 6.84 (q, 2H), 6.62 (dd, 2H) | 847.08 | 846.34 |
| 63 | δ = 8.32-8.28 (m, 3H), 8.07-7.84 (m, 8H), 7.80-7.70 (m, 4H), 7.48-7.20 (m, 7H), 7.10 (t, 1H), 6.86 (q, 2H), 6.66 (dd, 2H) | 810.25 | 809.23 |
| 66 | δ = 8.42 (d, 1H), 8.18-7.92 (m, 16H), 7.86-7.48 (m, 17H), 7.32-7.18 (m, 6H), 6.86 (dd, 2H) | 827.54 | 826.33 |
| 67 | δ = 8.36 (dd, 2H), 8.18-7.96 (m, 8H), 7.88-7.80 (m, 4H), 7.65-7.48 (m, 8H), 7.24-7.18 (m, 6H), 7.08-6.92 (m, 4H), 6.64 (dd, 4H), 1.62 (s, 6H) | 791.46 | 790.33 |
| 74 | δ = 8.56 (d, 1H), 8.42 (dd, 1H), 8.05-7.72 (m, 12H), 7.66-7.30 (m, 13H), 7.18-7.08 (m, 7H), 6.86-6.80 (m, 4H), 6.62-6.60 (d, 5H) | 804.01 | 802.33 |
| 76 | δ = 8.10 (d, 1H), 8.05-7.84 (m, 15H), 7.70-7.42 (m, 15H), 7.30-7.15 (m, 5H), 6.98-6.88 (m, 4H), 6.78 (d, 1H), 6.64 (dd, 2H), 1.62(s, 6H) | 920.61 | 919.41 |
| 78 | δ = 8.58 (d, 1H), 8.38 (dd, 1H), 8.34 (d, 1H), 8.24 (dd, 2H), 8.05-7.68 (m, 19H), 7.60-7.38 (m, 13H), 7.22-7.14 (m, 2H) | 802.64 | 801.31 |

Example 1

As an anode, a 15 Ω/cm$^2$ (1200 Å) Corning ITO glass substrate was cut to a size of 50 mm×50 mm×0.7 mm, washed with ultrasonic waves in isopropyl alcohol and pure water for 5 minutes each, and then cleaned with UV and ozone for 30 minutes. The ITO glass substrate was mounted on a vacuum depositor.

2-TNATA was deposited on the ITO glass substrate to form a HIL having a thickness of 600 Å and 4,4'-bis[N-(1-naphthyl)-N-phenylamino]biphenyl (NPB) was then deposited on the HIL to form a HTL having a thickness of 300 Å.

Then, 9,10-di(naphthalene-2-yl)anthracene (ADN) (a host) and Compound 3 (a dopant) were co-deposited on the HTL at a weight ratio of 98:2 to form an EML having a thickness of 300 Å.

Then, Alq$_3$ was deposited on the EML to form an ETL having a thickness of 300 Å, LiF was deposited on the ETL to form an EIL having a thickness of 10 Å, and Al was deposited on the EIL to form a second electrode (cathode) having a thickness of 3,000 Å, thereby completing the manufacture of an OLED.

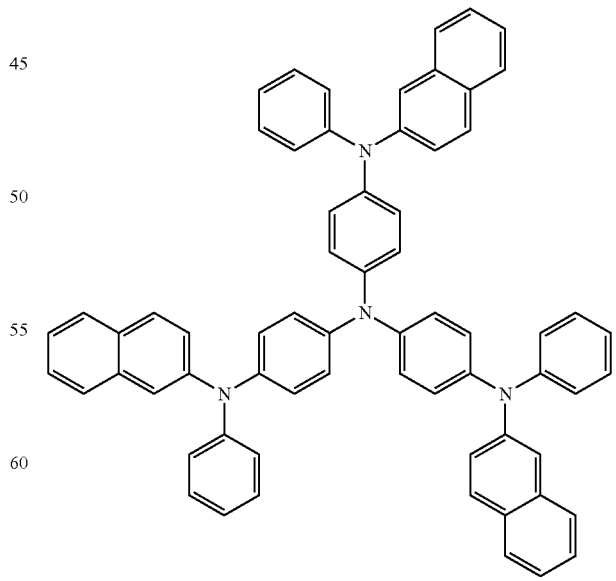

2-TNATA

-continued

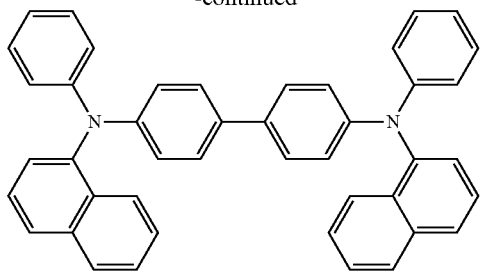

NPB

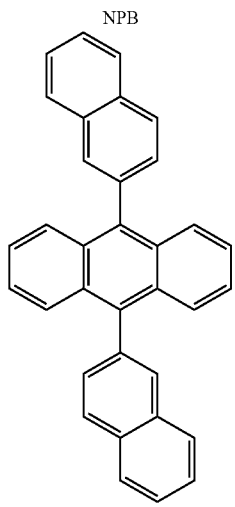

DNA

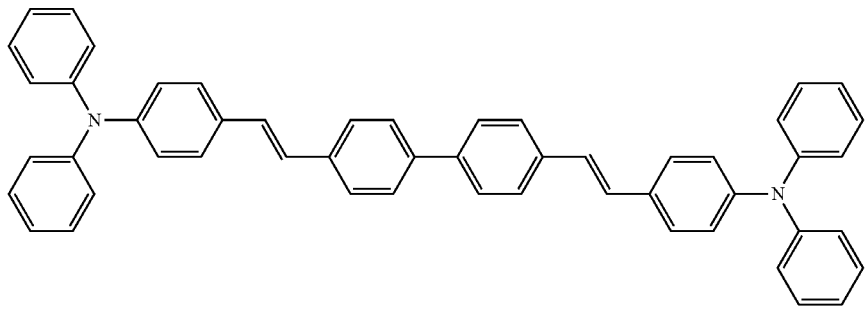

DPAVBi

Example 2

An OLED was manufactured in the same manner as in Example 1, except that Compound 19 was used instead of Compound 3 in the formation of the EML.

Example 3

An OLED was manufactured in the same manner as in Example 1, except that Compound 30 was used instead of Compound 3 in the formation of the EML.

Example 4

An OLED was manufactured in the same manner as in Example 1, except that Compound 40 was used instead of Compound 3 in the formation of the EML.

Example 5

An OLED was manufactured in the same manner as in Example 1, except that Compound 47 was used instead of Compound 3 in the formation of the EML.

Example 6

An OLED was manufactured in the same manner as in Example 1, except that Compound 56 was used instead of Compound 3 in the formation of the EML.

Example 7

An OLED was manufactured in the same manner as in Example 1, except that Compound 76 was used instead of Compound 3 in the formation of the EML.

Comparative Example 1

An OLED was manufactured in the same manner as in Example 1, except that DPAVBi was used instead of Compound 3 in the formation of the EML.

Comparative Example 2

An OLED was manufactured in the same manner as in Example 1, except that Compound A was used instead of Compound 3 in the formation of the EML.

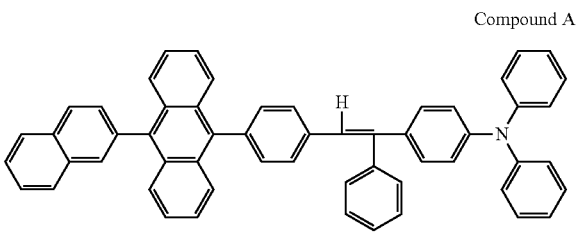 [SMILES: C(=C(/c1ccccc1)c1ccc(N(c2ccccc2)c2ccccc2)cc1)/c1ccc(-c2c3ccccc3c(-c3ccc4ccccc4c3)c3ccccc23)cc1]

Compound A

Comparative Example 3

An OLED was manufactured in the same manner as in Example 1, except that Compound B was used instead of Compound 3 in the formation of the EML.

Compound B

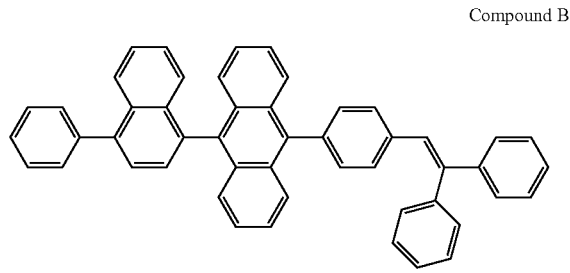 [SMILES: C(=C(c1ccccc1)c1ccccc1)c1ccc(-c2c3ccccc3c(-c3ccc(-c4ccccc4)c4ccccc34)c3ccccc23)cc1]

Comparative Example 4

An OLED was manufactured in the same manner as in Example 1, except that Compound C was used instead of Compound 3 in the formation of the EML.

Compound C

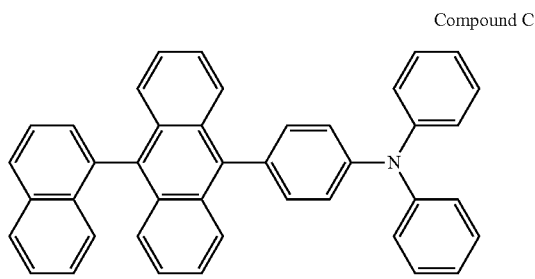 [SMILES: c1ccc(N(c2ccccc2)c2ccc(-c3c4ccccc4c(-c4cccc5ccccc45)c4ccccc34)cc2)cc1]

Evaluation Example 1

Driving voltage, current density, brightness, emission color, efficiency, and half lifetime (@50 mA/cm$^2$) of each of the OLEDs of Examples 1 through 7 and Comparative Examples 1 through 4 were evaluated using PR650 Spectroscan Source Measurement Unit (available from PhotoResearch), and the results are shown in Table 2 below.

From the results shown in Table 2, it is confirmed that the OLEDs of Example 1 through 7 have excellent driving voltage, high brightness, higher efficiency, higher color purity, and longer lifetime, as compared to the OLEDs of Comparative Examples 1 through 4.

As described above, according to the one or more of the above embodiments of the present invention, an OLED including the styryl-based compound may have a low driving voltage, high brightness, high efficiency, and long lifetime.

While the present invention has been particularly shown and described with reference to certain embodiments thereof, it will be understood by those of ordinary skill in the art that various changes in form and details may be made therein without departing from the spirit and scope of the present invention as defined by the following claims, and equivalents thereof.

What is claimed is:

1. A styryl-based compound represented by Formula 1 below:

Formula 1

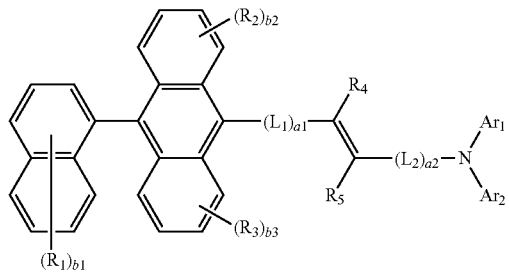

wherein $L_1$ and $L_2$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, and a substituted or unsubstituted $C_2$-$C_{60}$ heteroarylene group;

a1 and a2 are each independently an integer from 0 to 3;

$Ar_1$ and $Ar_2$ are each independently selected from a substituted or unsubstituted $C_3$-$C_{10}$ cycloalkyl group, a

TABLE 2

| | Dopant | Driving voltage (V) | Current density (mA/cm$^2$) | Brightness (cd/m$^2$) | Efficiency (cd/A) | Color coordiante | Half lifetime (hr) |
|---|---|---|---|---|---|---|---|
| Example 1 | Compound 3 | 6.24 | 50 | 3,175 | 6.35 | (0.132, 0.225) | 334 |
| Example 2 | Compound 19 | 6.12 | 50 | 3,605 | 7.21 | (0.129, 0.228) | 328 |
| Example 3 | Compound 30 | 6.15 | 50 | 3,670 | 7.34 | (0.130, 0.206) | 326 |
| Example 4 | Compound 40 | 6.35 | 50 | 3,285 | 6.57 | (0.132, 0.222) | 273 |
| Example 5 | Compound 47 | 6.44 | 50 | 3,585 | 7.17 | (0.129, 0.218) | 347 |
| Example 6 | Compound 56 | 6.24 | 50 | 3,460 | 6.92 | (0.132, 0.210) | 258 |
| Example 7 | Compound 76 | 6.42 | 50 | 3,420 | 6.84 | (0.128, 0.209) | 320 |
| Comparative Example 1 | DPAVBi | 7.35 | 50 | 2,065 | 4.13 | (0.130, 0.232) | 145 |
| Comparative Example 2 | Compound A | 6.65 | 50 | 3,025 | 6.05 | (0.138, 0.210) | 208 |
| Comparative Example 3 | Compound B | 6.84 | 50 | 2,975 | 5.95 | (0.139, 0.225) | 189 |
| Comparative Example 4 | Compound C | 6.95 | 50 | 2,885 | 5.77 | (0.142, 0.240) | 195 | substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, and a substituted or unsubstituted $C_2$-$C_{60}$ heteroaryl group, wherein $Ar_1$ and $Ar_2$, optionally, are linked to each other to form a saturated or unsaturated ring;

$R_1$ through $R_3$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —Si($Q_1$)($Q_2$)($Q_3$) and —N($Q_4$)($Q_5$), $Q_1$ through $Q_5$ each being independently selected from a $C_1$-$C_{60}$ alkyl group, a $C_1$-$C_{60}$ alkoxy group, a $C_6$-$C_{60}$ aryl group, and a $C_2$-$C_{60}$ heteroaryl group;

b1 is an integer from 1 to 7;

b2 and b3 are each independently an integer from 1 to 4; and $R_4$ and $R_5$ are each independently selected from a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_2$-$C_{60}$ heteroaryl group, and wherein when b1 is greater than 1, the styryl-based compound comprises a plurality of $R_1$, and the plurality of $R_1$ are not bonded to each other.

2. The styryl-based compound of claim 1, wherein $L_1$ and $L_2$ are each independently selected from, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, a acridinylene group, a phenanthrolinylene group, a phenazinylene group, a benzoxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, and a dibenzosilolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pyrrolylene group, an imidazolylene group, a pyrazolylene group, a pyridinylene group, a pyrazinylene group, a pyrimidinylene group, a pyridazinylene group, an isoindolylene group, an indolylene group, an indazolylene group, a purinylene group, a quinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, a acridinylene group, a phenanthrolinylene group, a phenazinylene group, a benzoxazolylene group, a benzoimidazolylene group, a furanylene group, a benzofuranylene group, a thiophenylene group, a benzothiophenylene group, a thiazolylene group, an isothiazolylene group, a benzothiazolylene group, an isoxazolylene group, an oxazolylene group, a triazolylene group, a tetrazolylene group, an oxadiazolylene group, a triazinylene group, a dibenzofuranylene group, a dibenzothiophenylene group, a benzocarbazolylene group, and a dibenzosilolylene group, substituted with at least one of, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group.

3. The styryl-based compound of claim 1, wherein $L_1$ and $L_2$ are each independently represented by one of Formulae 2-1 through 2-28 below:

Formula 2-1

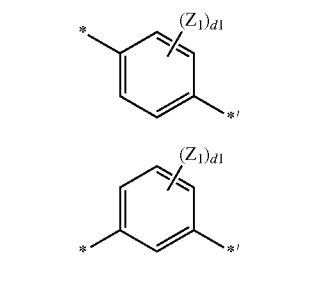

Formula 2-2

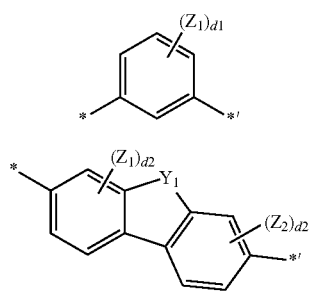

Formula 2-3

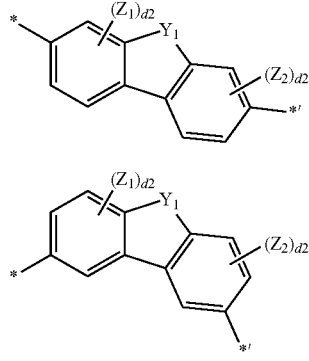

Formula 2-4

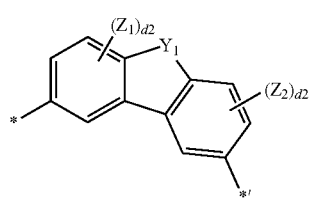

Formula 2-5

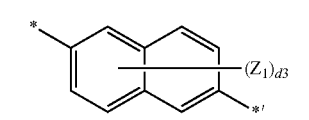

Formula 2-6

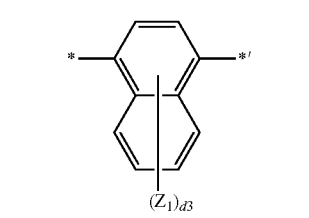

Formula 2-7

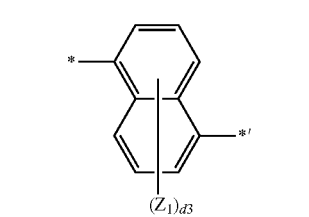

Formula 2-8

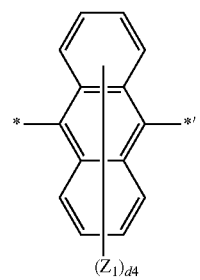

Formula 2-9

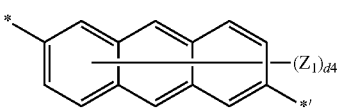

Formula 2-10

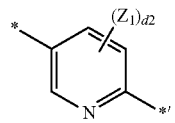

Formula 2-11

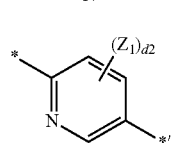

Formula 2-12

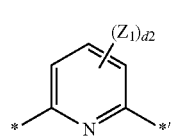

Formula 2-13

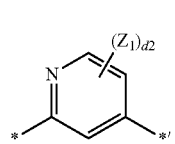

Formula 2-14

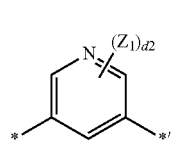

Formula 2-15

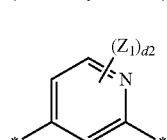

Formula 2-16

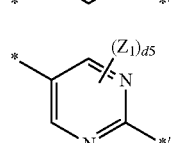

Formula 2-17

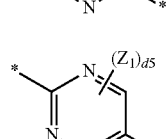

Formula 2-18

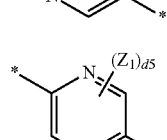

-continued

Formula 2-19

Formula 2-20

Formula 2-21

Formula 2-22

Formula 2-23

Formula 2-24

Formula 2-25

Formula 2-26

Formula 2-27

Formula 2-28 wherein $Y_1$ is O, S, $C(Z_3)(Z_4)$, $N(Z_5)$, or $Si(Z_6)(Z_7)$;
$Z_1$ through $Z_7$ are each independently selected from,
a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group;

d1 is an integer from 1 to 4;
d2 is an integer from 1 to 3;
d3 is an integer from 1 to 6;
d4 is an integer from 1 to 8;
d5 is an integer from 1 or 2;
d6 is an integer from 1 to 5, and
wherein each of * and *' is a binding site for a neighboring atom.

4. The styryl-based compound of claim 1, wherein $L_1$ and $L_2$ are each independently represented by one of Formulae 3-1 through 3-19 below:

Formula 3-1

Formula 3-2

Formula 3-3

Formula 3-4

Formula 3-5

Formula 3-6

Formula 3-7

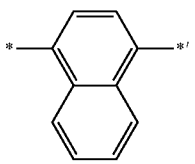

Formula 3-8

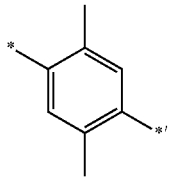

Formula 3-9

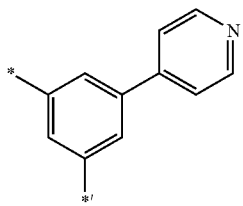

Formula 3-10

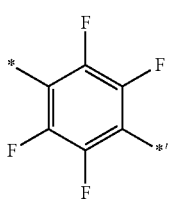

Formula 3-11

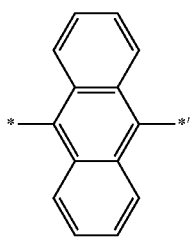

Formula 3-12

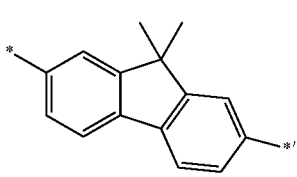

Formula 3-13

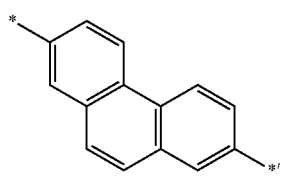

Formula 3-14

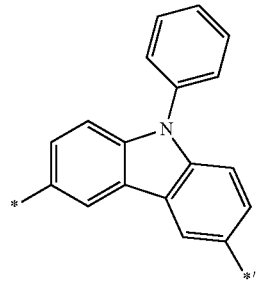

Formula 3-15

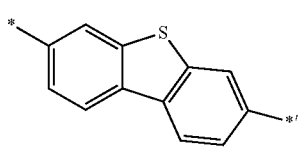

Formula 3-16

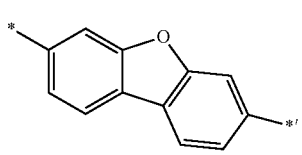

Formula 3-17

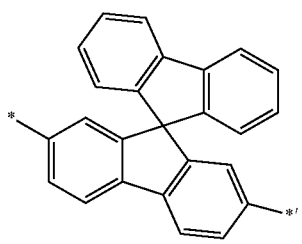

Formula 3-18

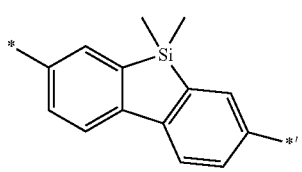

Formula 3-19

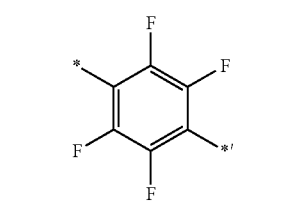

wherein each of * and *' is a binding site for a neighboring atom.

5. The styryl-based compound of claim 1, wherein i) a1 is 0, and a2 is 1 or 2; ii) a1 is 1, and a2 is 1 or 2; or iii) a1 is 2, and a2 is 1 or 2.

6. The styrl-based compound of claim 1, wherein $Ar_1$ and $Ar_2$ are each independently selected from, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylene group, a pyrenyl group, a chrysenyl group, a naphtacenyl group, a picenyl group, a perylenyl group, a pentaphenyl group, a hexacenyl group, pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, a acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group, substituted with at least one selected from, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group.

7. The styryl-based compound of claim 1, wherein $Ar_1$ and $Ar_2$ are bonded to each other via a single bond or a $C_1$-$C_5$ alkylene group therebetween.

8. The styryl-based compound of claim 1, wherein $Ar_1$ and $Ar_2$ are each independently one selected from Formulae 5-1 through 5-13 below:

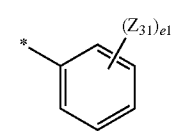

Formula 5-1

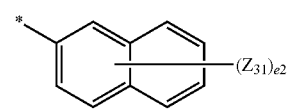

Formula 5-2

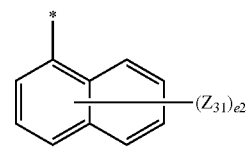

Formula 5-3

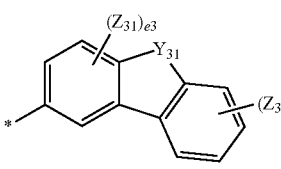

Formula 5-4

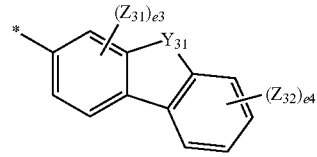

Formula 5-5

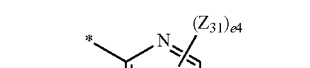

Formula 5-6

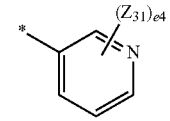

Formula 5-7

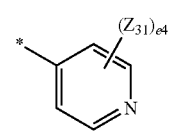

Formula 5-8

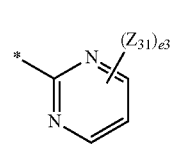

Formula 5-9

-continued

Formula 5-10

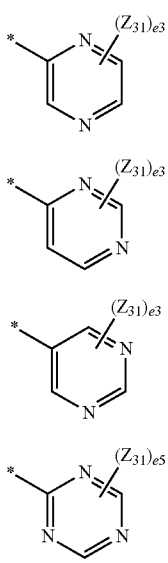

Formula 5-11

Formula 5-12

Formula 5-13 wherein $Y_{31}$ is O, S, $C(Z_{33})(Z_{34})$, or $N(Z_{35})$;

$Z_{31}$ through $Z_{35}$ are each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group;

e1 is an integer from 1 to 5;

e2 is an integer from 1 to 7;

e3 is an integer from 1 to 3;

e4 is an integer from 1 to 4;

e5 is an integer from 1 or 2, and wherein * is a binding site for N in Formula 1.

9. The styryl-based compound of claim 1, wherein $Ar_1$ and $Ar_2$ are each independently selected from Formulae 6-1 through 6-15 below:

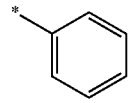

Formula 6-1

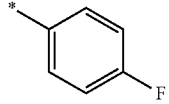

Formula 6-2

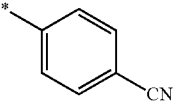

Formula 6-3

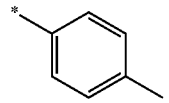

Formula 6-4

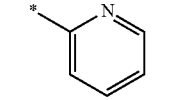

Formula 6-5

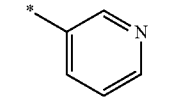

Formula 6-6

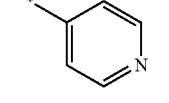

Formula 6-7

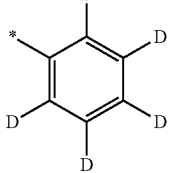

Formula 6-8

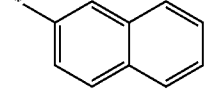

Formula 6-9

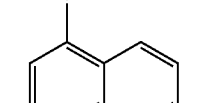

Formula 6-10

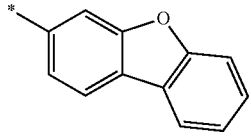

Formula 6-11

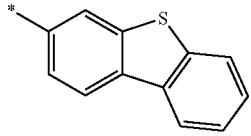

Formula 6-12

-continued

Formula 6-13
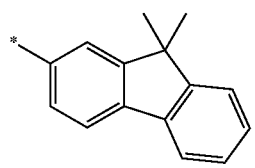

Formula 6-14
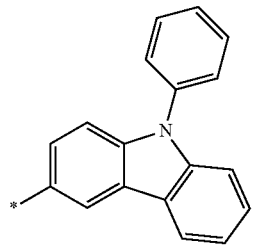

Formula 6-15
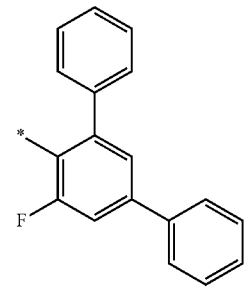

wherein * is a binding site for a neighboring atom.

10. The styryl-based compound of claim 1, wherein —N(Ar$_1$)(Ar$_2$) is represented by Formula 7-1 below:

Formula 7-1
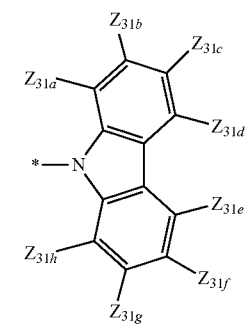

wherein $Z_{31a}$ through $Z_{31h}$ are each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group;

a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, an isoquinolinyl group, a dibenzothiophenyl group, and a dibenzofuranyl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group;

—Si(Q$_{13}$)(Q$_{14}$)(Q$_{15}$), Q$_{13}$ through Q$_{15}$ each being independently selected from a $C_1$-$C_{20}$ alkyl group, a $C_1$-$C_{20}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group, and wherein * is a binding site for a neighboring atom.

11. The styryl-based compound of claim 1, wherein R$_1$ through R$_3$ are each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C^1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolylene group, a triazinylene group, a dibenzofuranyl group, a dibenzothiophenyl group, and a benzocarbazolyl group, substituted with at least one selected from, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

a $C_6$-$C_{20}$ aryl group and a $C_2$-$C_{20}$ heteroaryl group; and a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a pyridinyl group, a pyrimidinyl group, a pyrazinyl group, a pyridazinyl group, a triazinyl group, a quinolinyl group, and an isoquinolinyl group; and —Si($Q_1$)($Q_2$)($Q_3$) and —N($Q_4$)($Q_5$) $Q_{11}$ through $Q_{15}$ each being independently selected from a $C_1$-$C_{20}$ alkyl group, a phenyl group, a naphthyl group, and an anthracenyl group.

12. The styryl-based compound of claim 1, wherein $R_1$ through $R_3$ are each independently selected from, a hydrogen atom, a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid group or a salt thereof, and a $C_1$-$C_{20}$ alkyl group;

a $C_1$-$C_{20}$ alkyl group substituted with at least one of a deuterium atom, a halogen atom, a hydroxyl group, a cyano group, a nitro group, an amino group, an amidino group, a hydrazine group, a hydrazone group, a carboxyl group or a salt thereof, a sulfonic acid group or a salt thereof, and a phosphoric acid group or a salt thereof;

Formulae 6-1 through 6-15 below; and

—Si($Q_1$)($Q_2$)($Q_3$) $Q_1$ through $Q_3$ each being independently, a $C_1$-$C_{20}$ alkyl group, a phenyl group, a naphthyl group, and an anthracenyl group

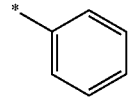

Formula 6-1

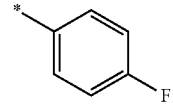

Formula 6-2

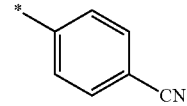

Formula 6-3

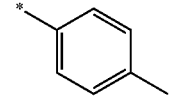

Formula 6-4

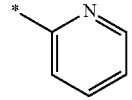

Formula 6-5

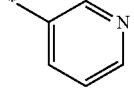

Formula 6-6

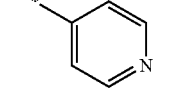

Formula 6-7

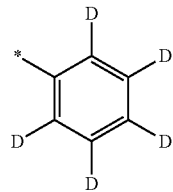

Formula 6-8

-continued

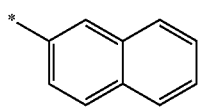
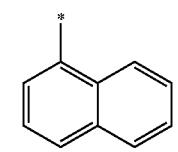
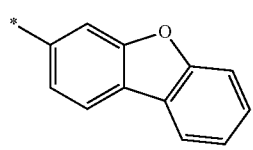
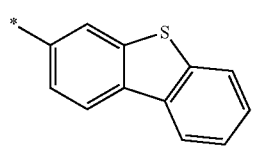
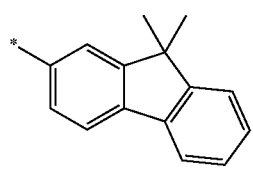
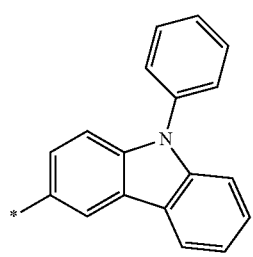
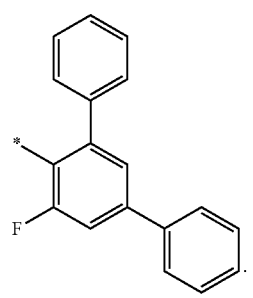

Formula 6-9
Formula 6-10
Formula 6-11
Formula 6-12
Formula 6-13
Formula 6-14
Formula 6-15

13. The styryl-based compound of claim 1, wherein $R_4$ and $R_5$ are each independently selected from a hydrogen atom, a deuterium atom, a $C_1$-$C_{20}$ alkyl group, a phenyl group, a naphthyl group, and an anthracenyl group.

14. The styryl-based compound of claim 1, wherein the styryl-based compound is represented by Formulae 1A, 1B, or 1C below:

Formula 1A
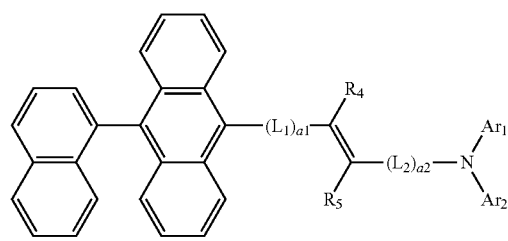

Formula 1B
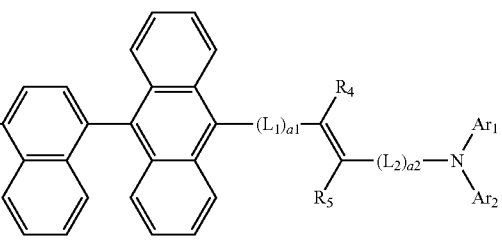

Formula 1C
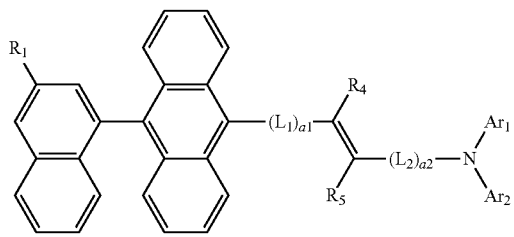

wherein $L_1$, $L_2$, a1, a2, $Ar_1$, $Ar_2$, $R_1$, $R_4$, and $R_5$ are the same as those of claim 1, with the proviso that $R_1$ of Formulae 1B and 1C is not a hydrogen atom.

15. The styryl-based compound of claim 1, wherein the styryl-based compound is represented by one of Formulae 1 through 78 below:

1
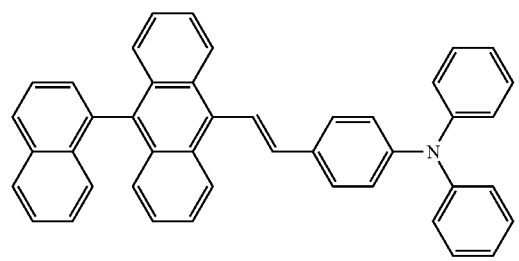
2
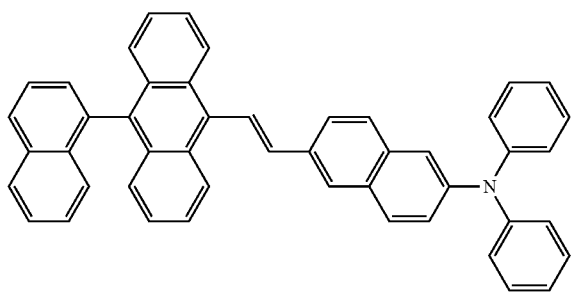
3
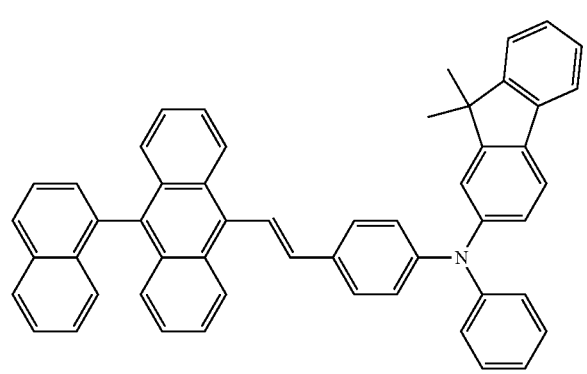
4
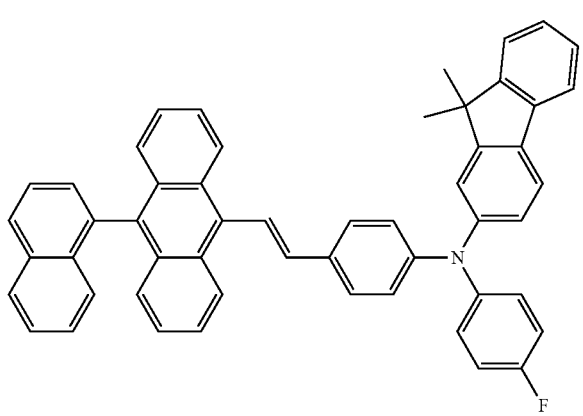
5
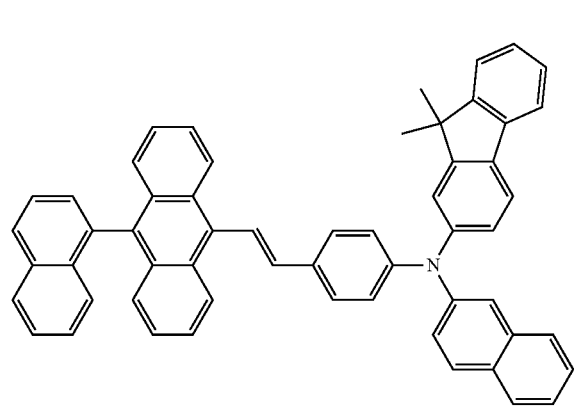
6
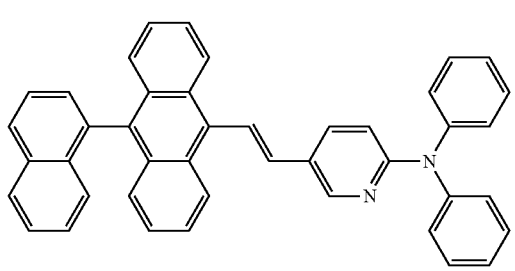
7
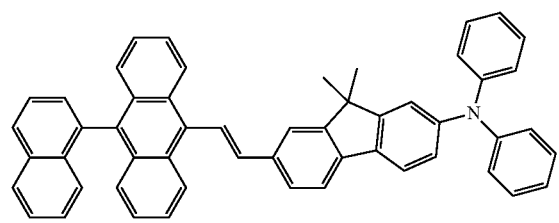
8
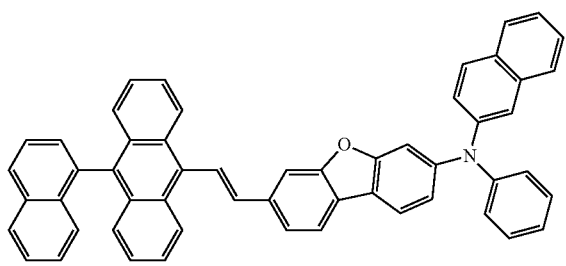

-continued
9
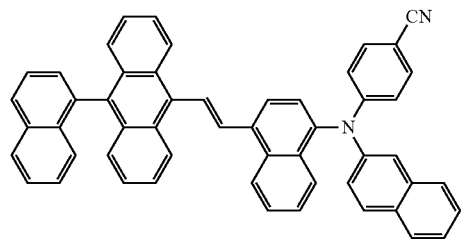
10
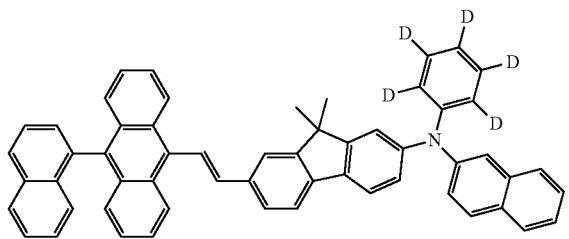
11
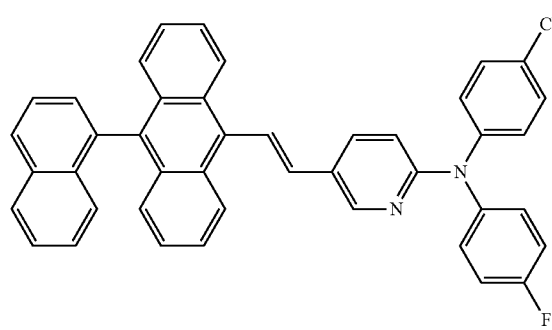
12
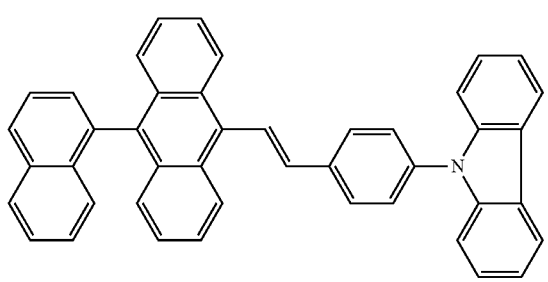
13
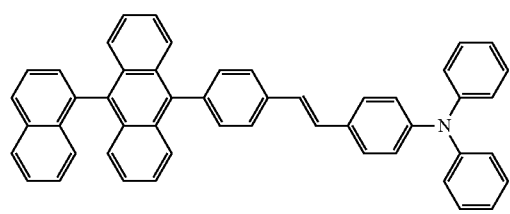
14
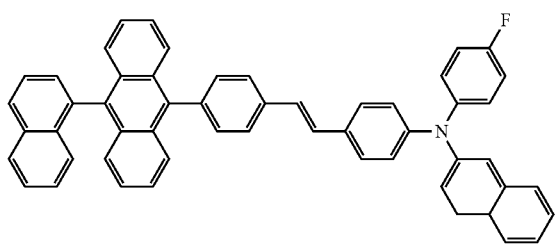
15
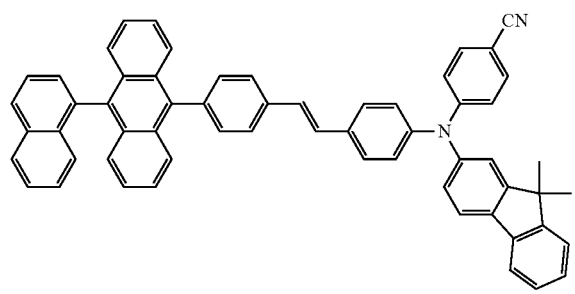
16
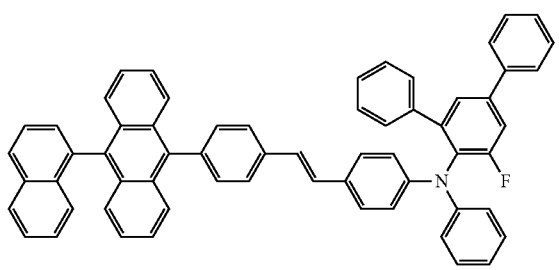
17
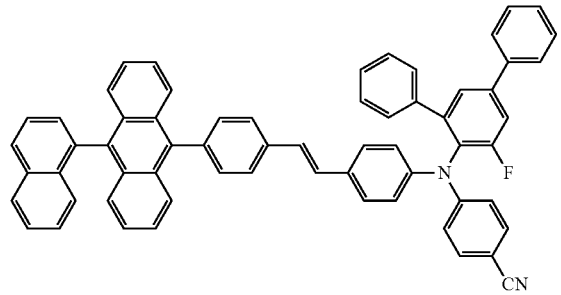
18
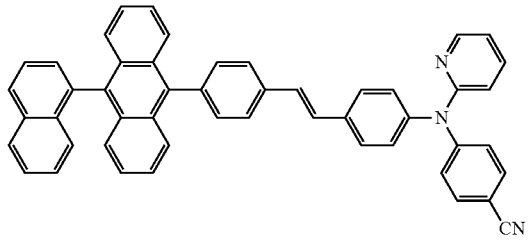

19
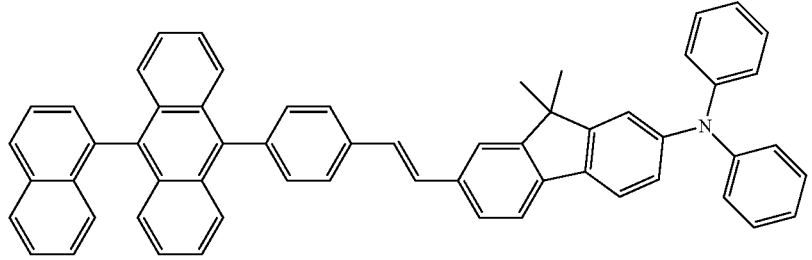
20
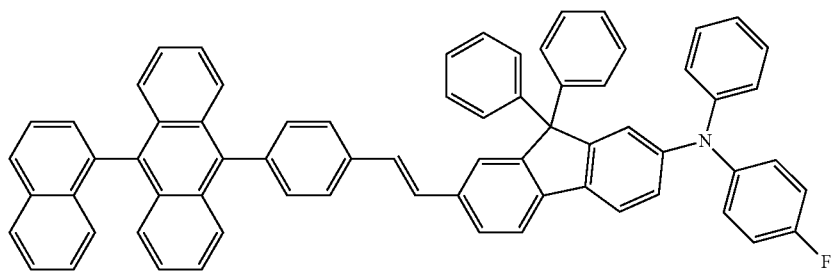
21
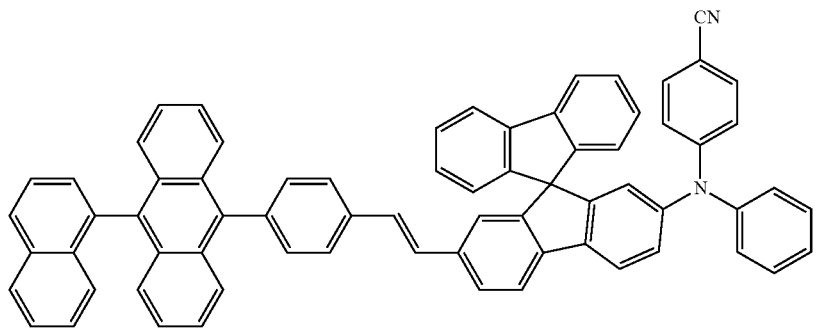
22
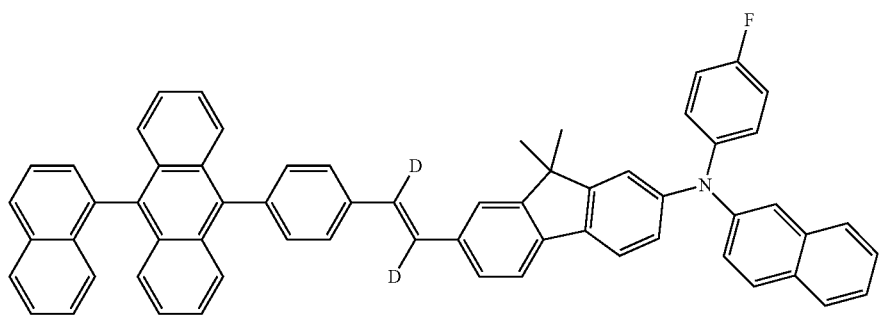
23
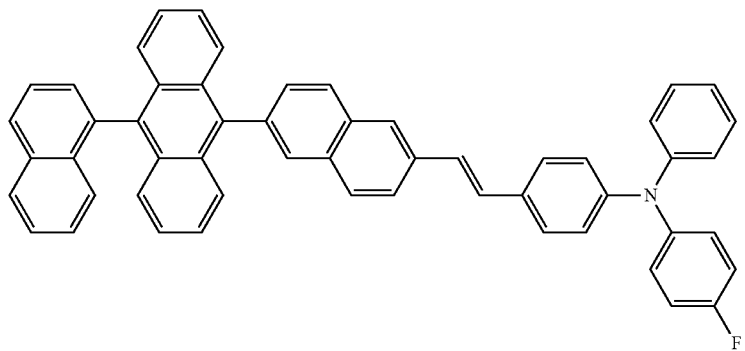

-continued
24
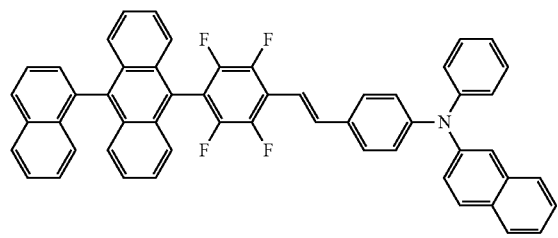
25
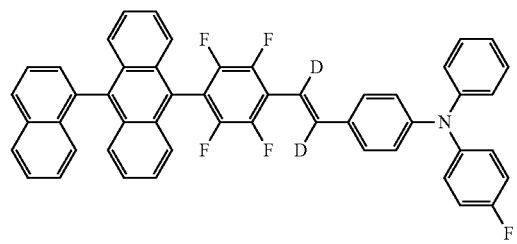
26
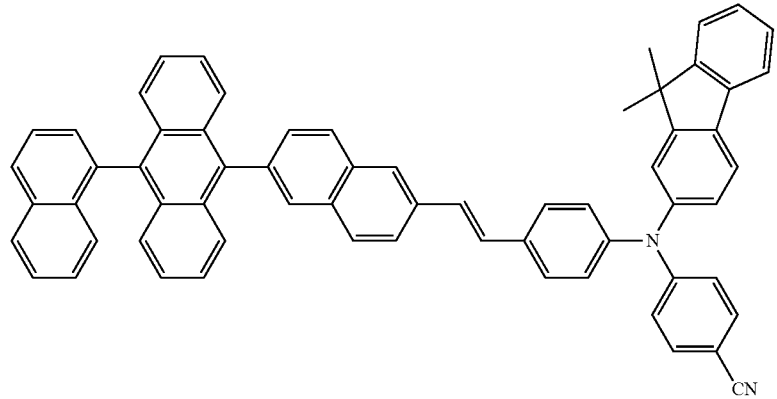
27
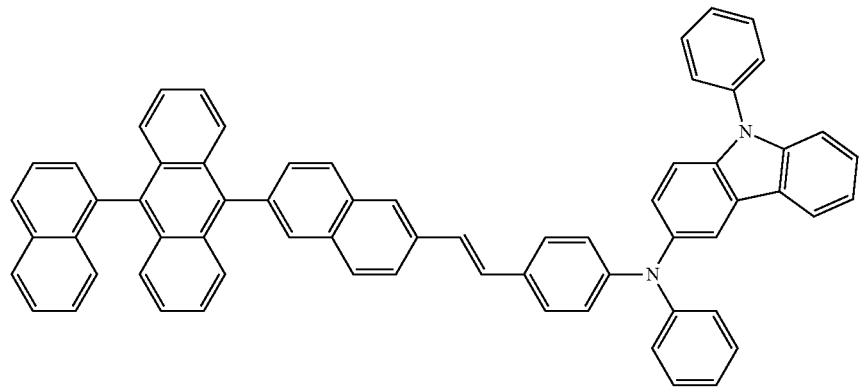
28
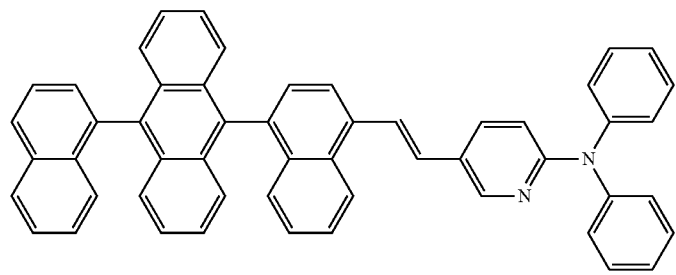
29
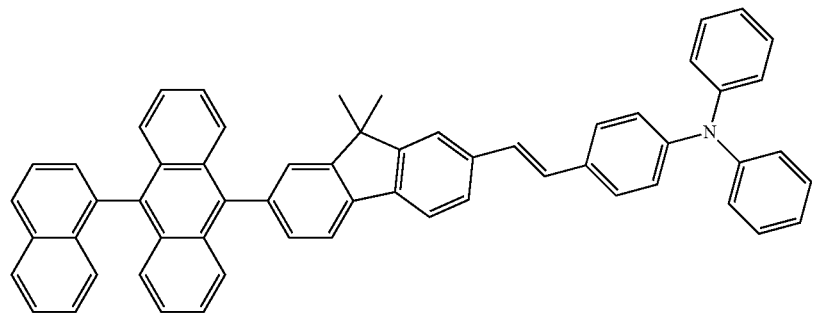

30
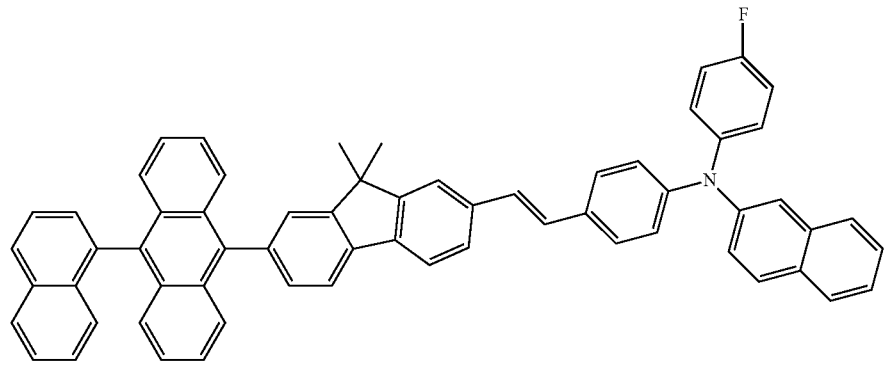
31
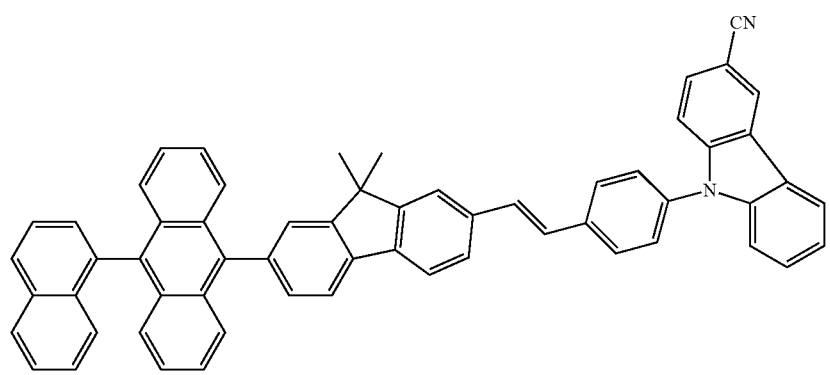
32
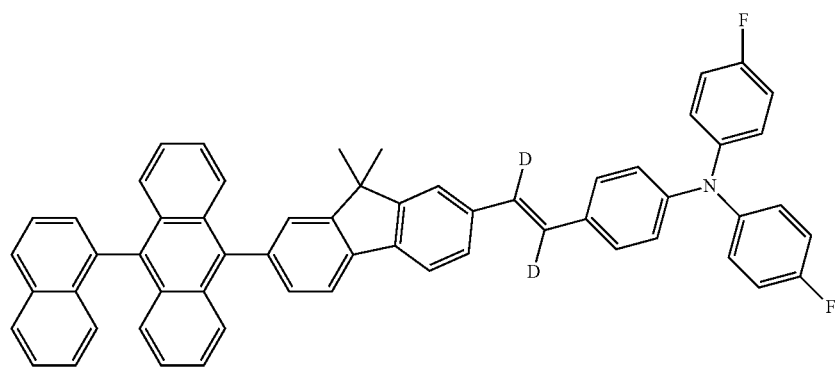
33
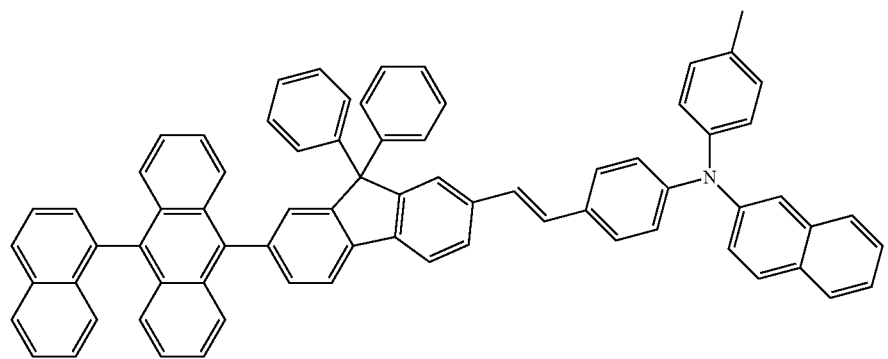

34
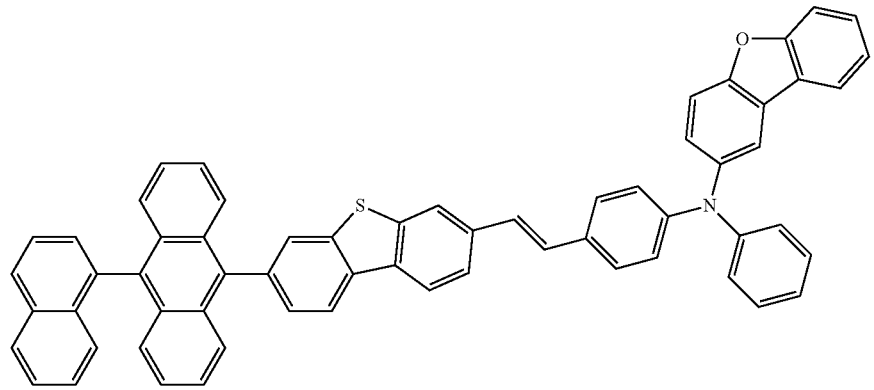
35
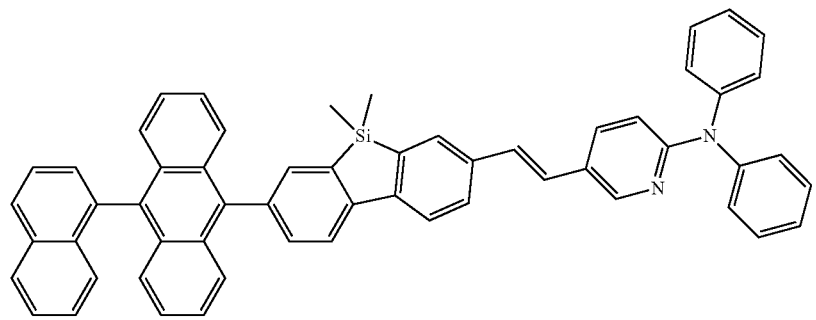
36
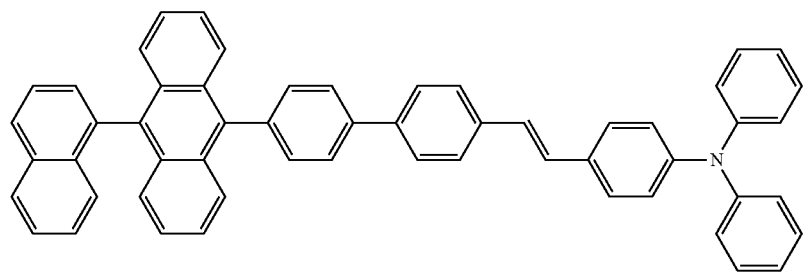
37
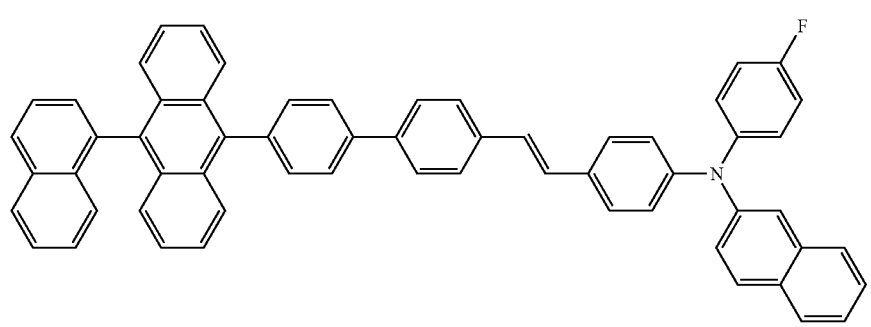

38
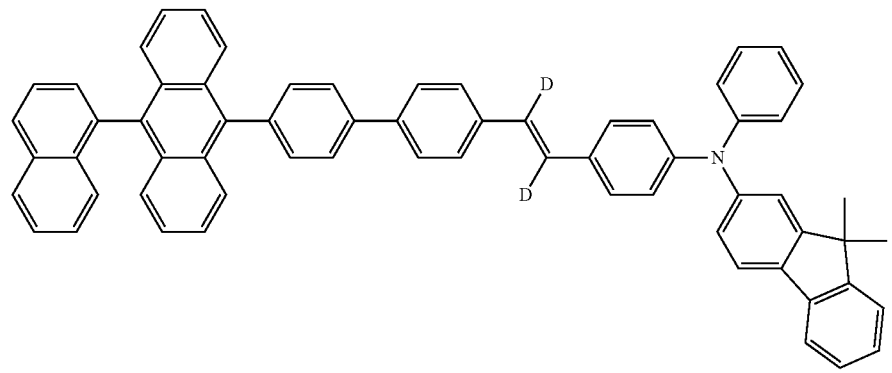
39
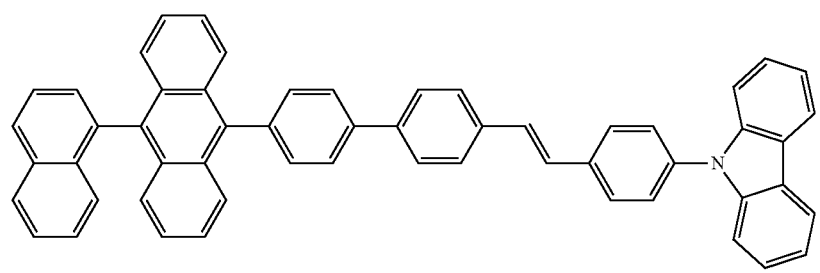
40
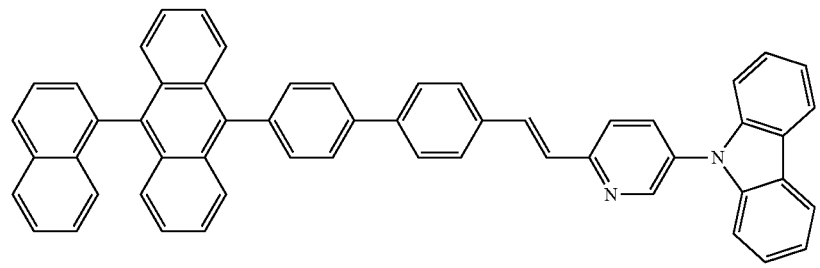
41
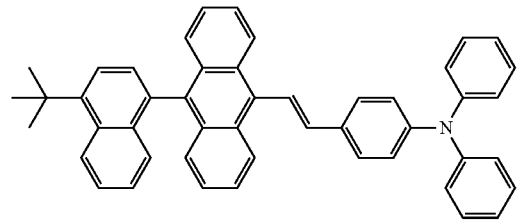
42
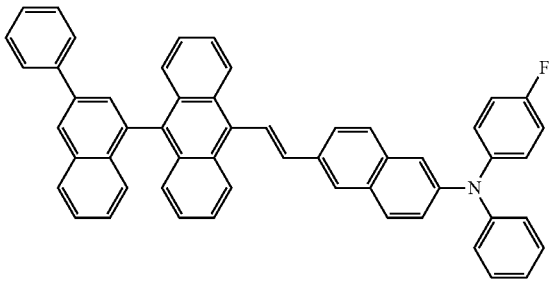
43
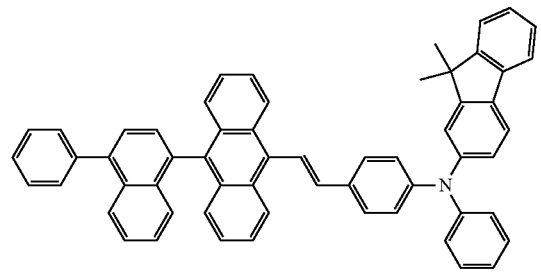
44
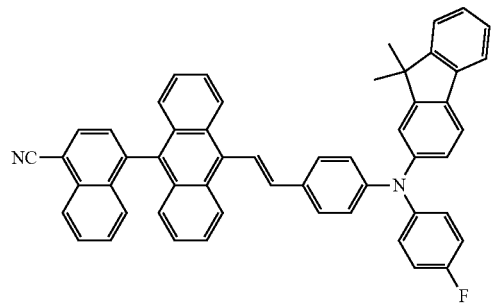

45
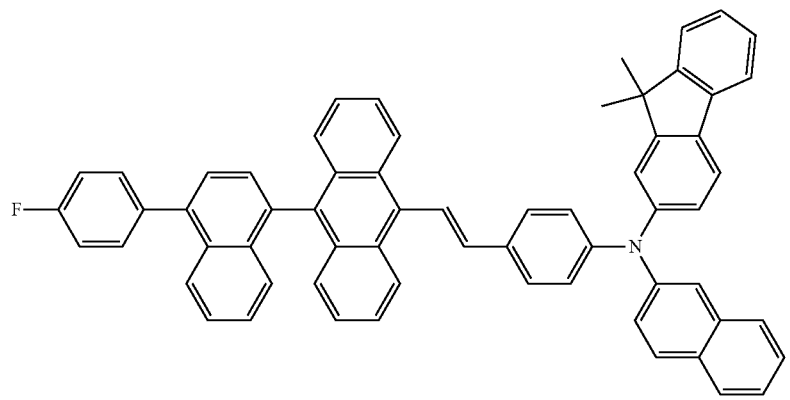
46
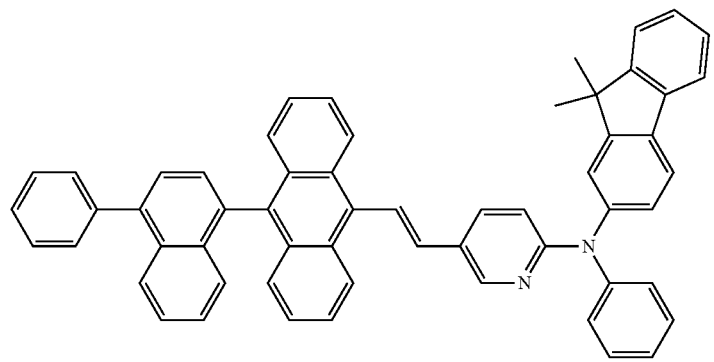
47
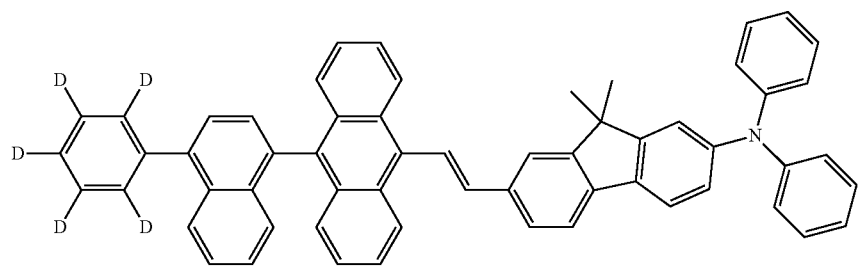
48
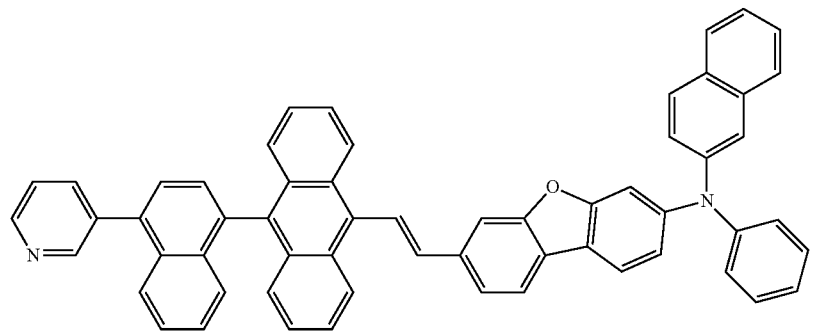

49
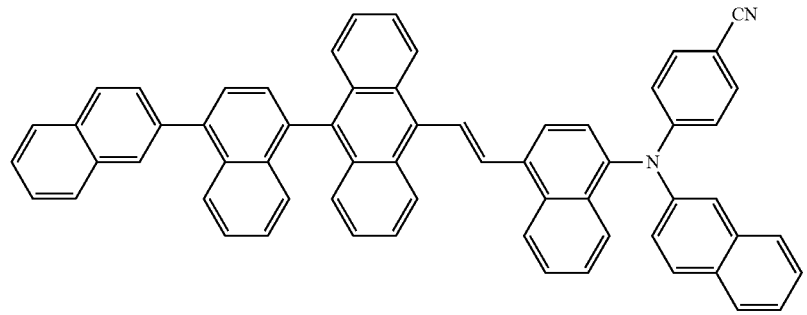
50
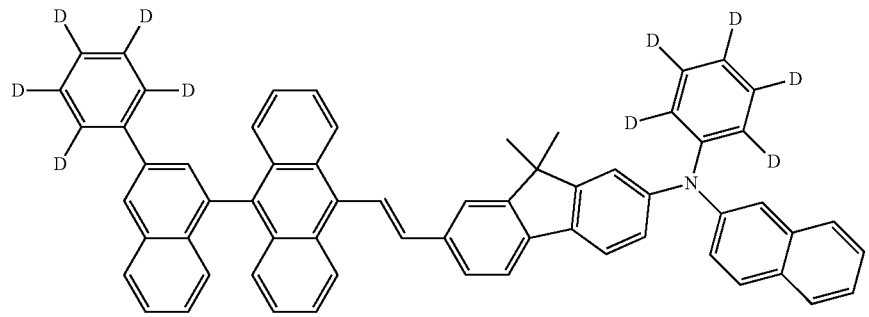
51
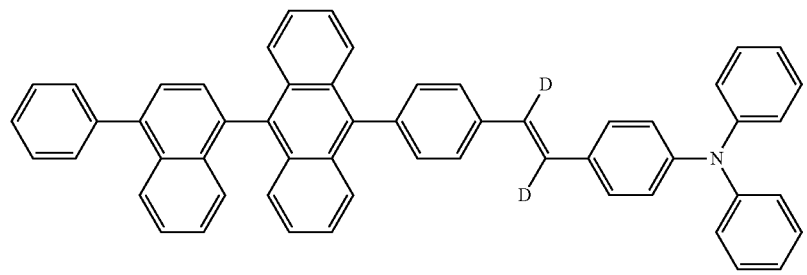
52
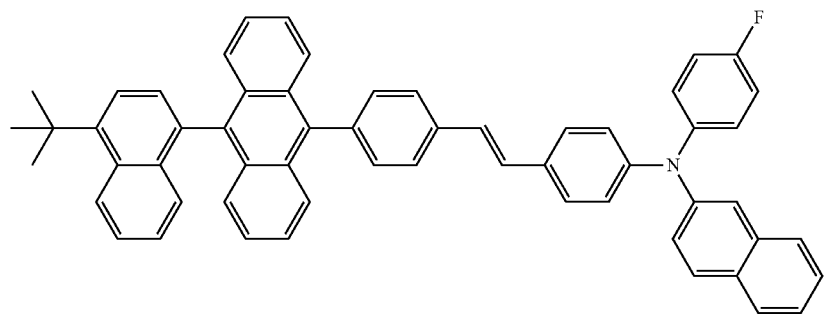
53
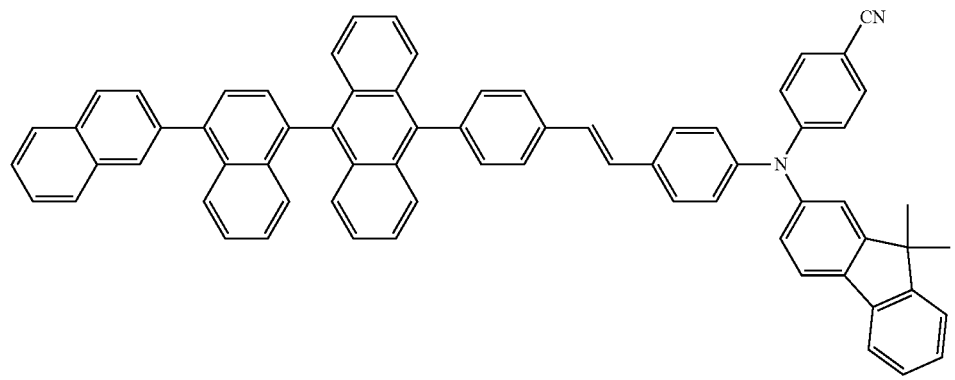

54
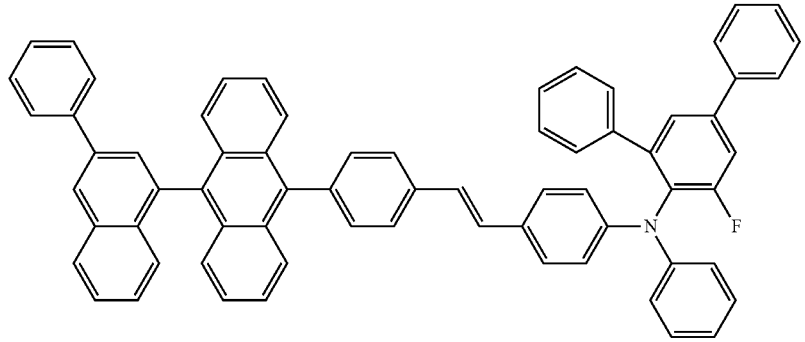
55
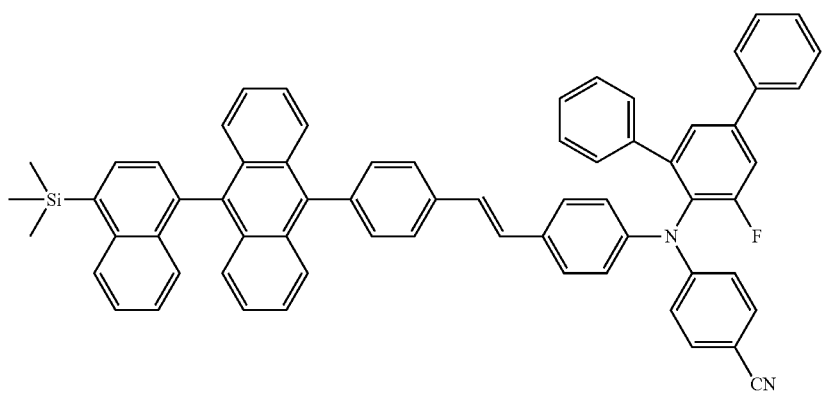
56
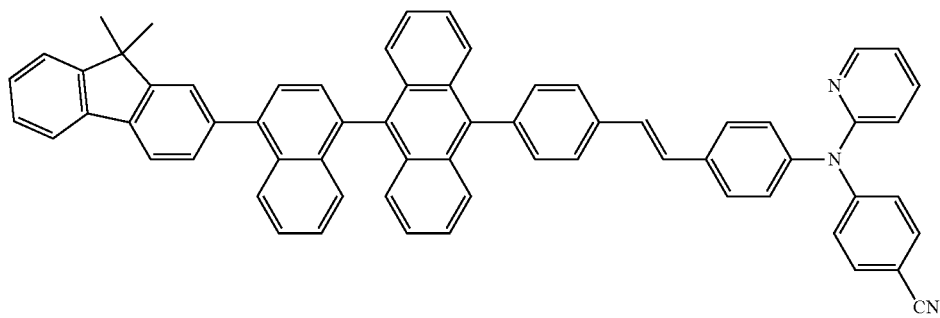
57
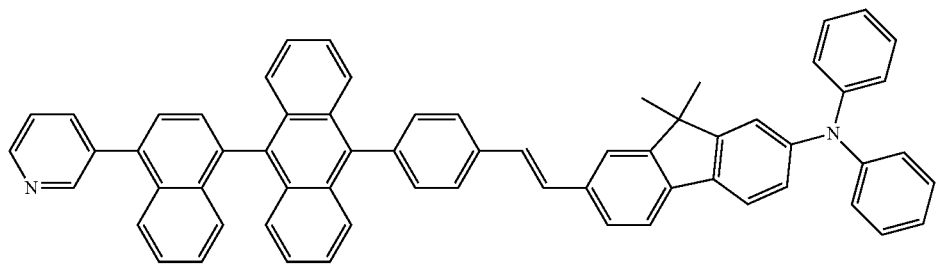
58
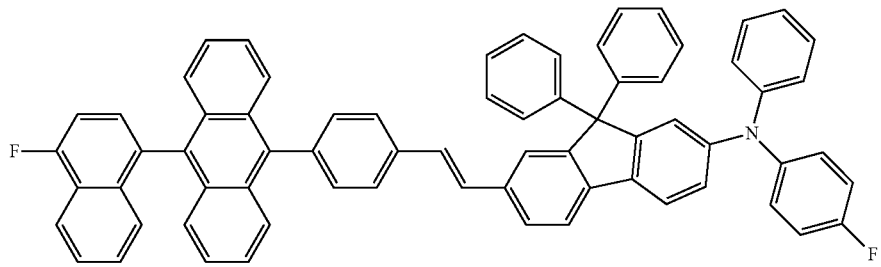

-continued
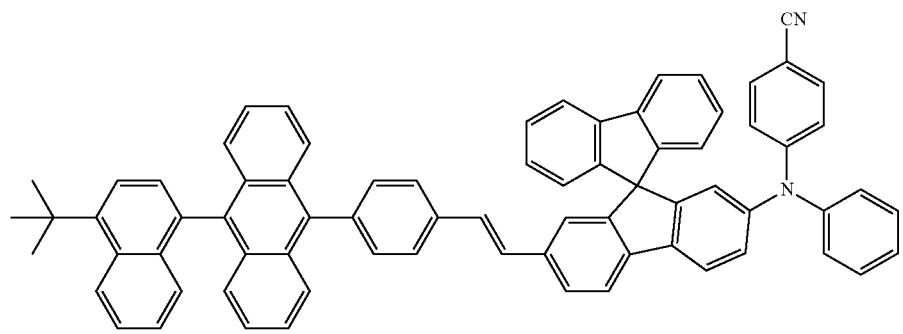
59
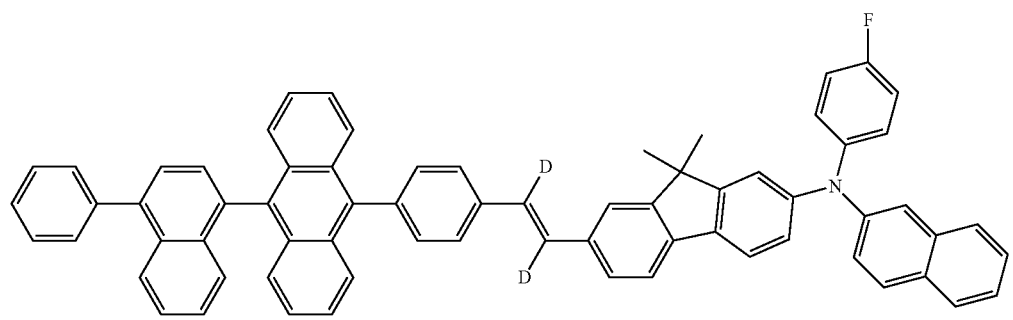
60
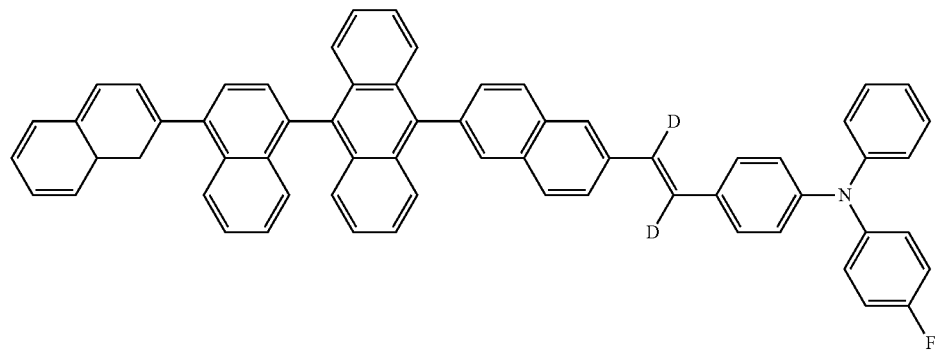
61
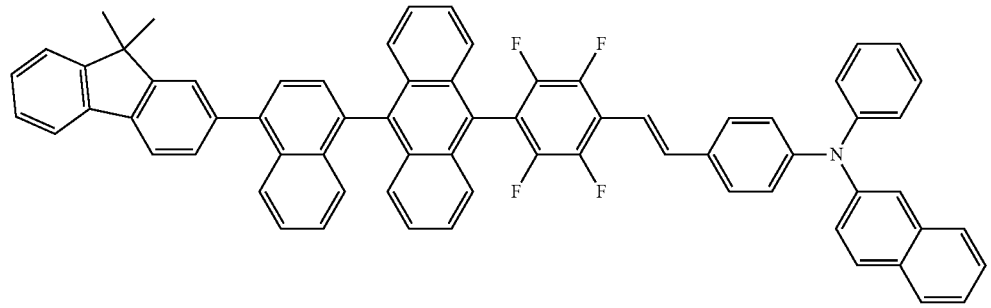
62
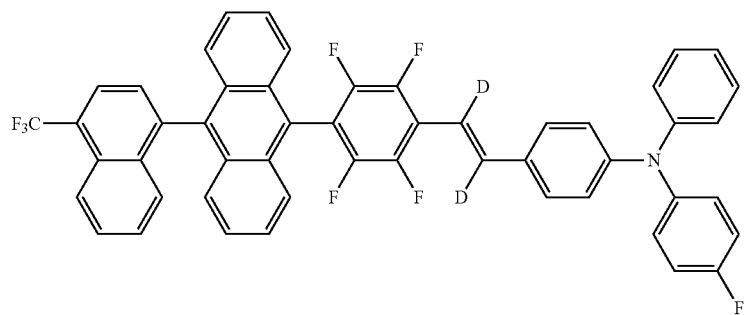
63

64
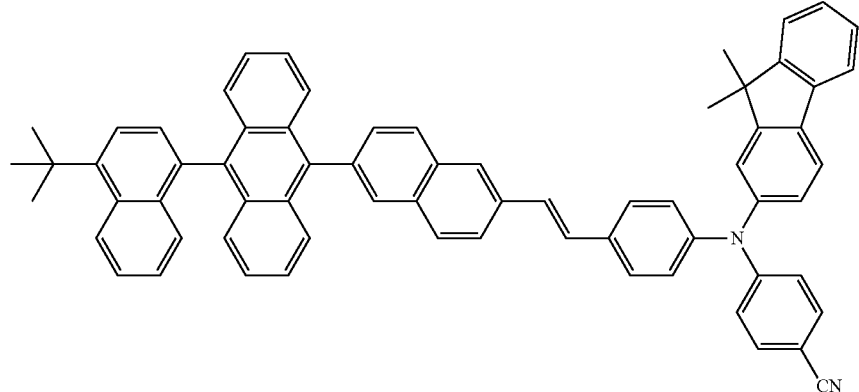
65
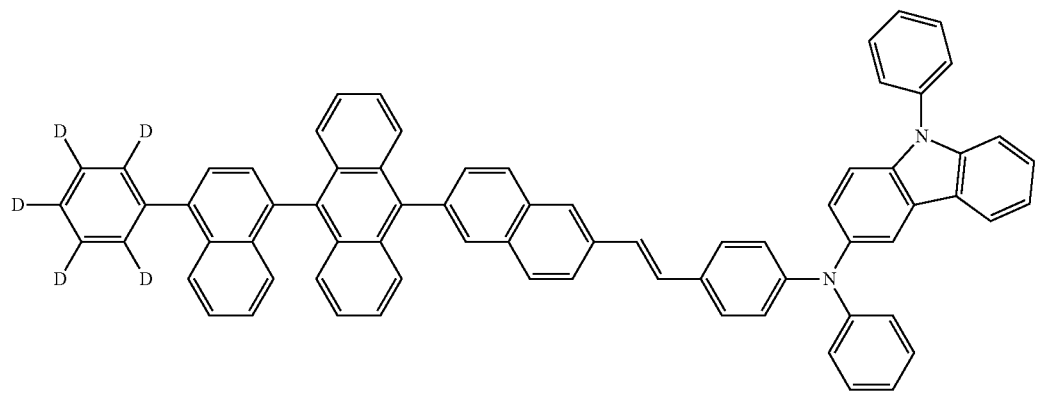
66
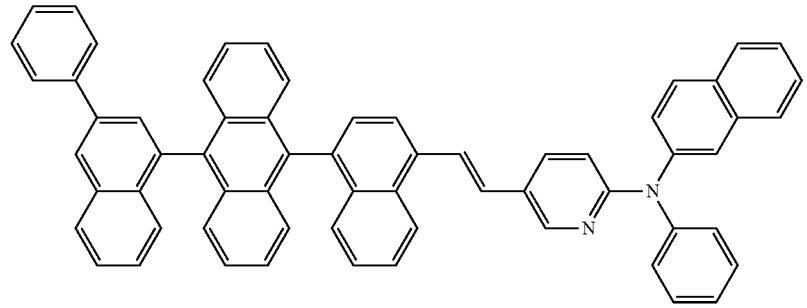
67
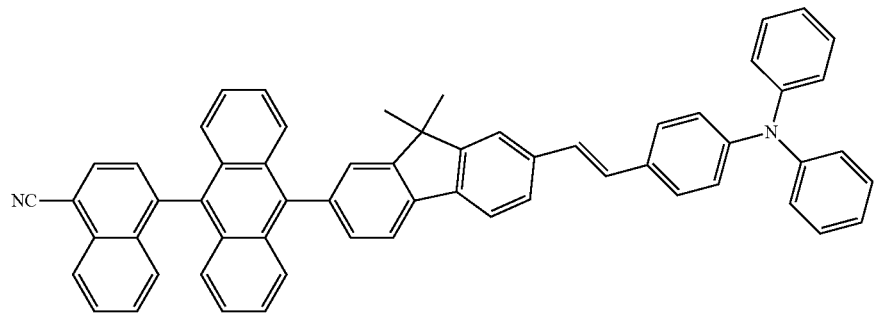

68
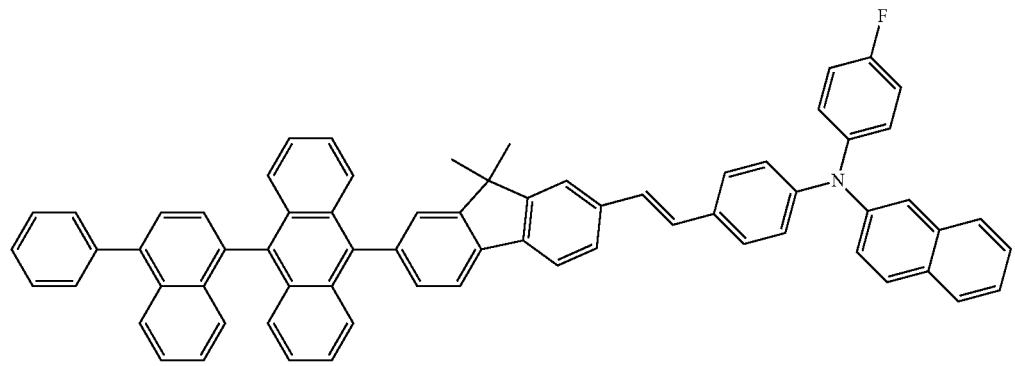
69
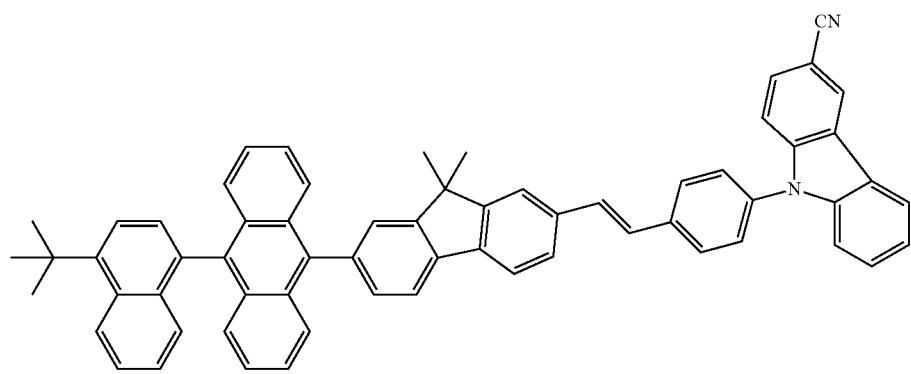
70
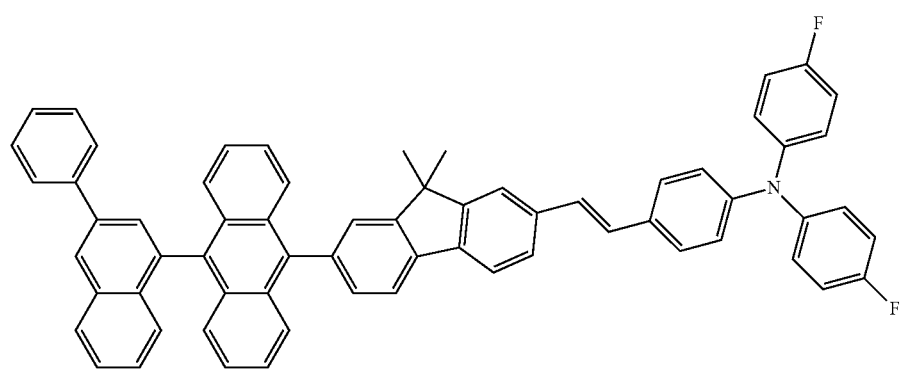
71
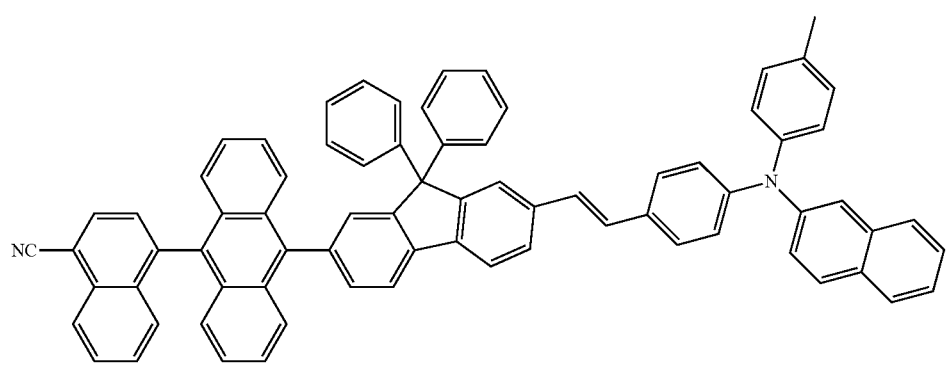

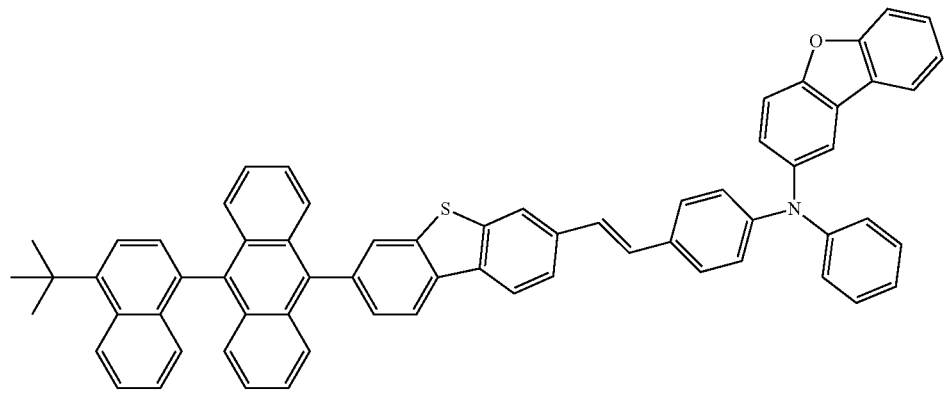
72
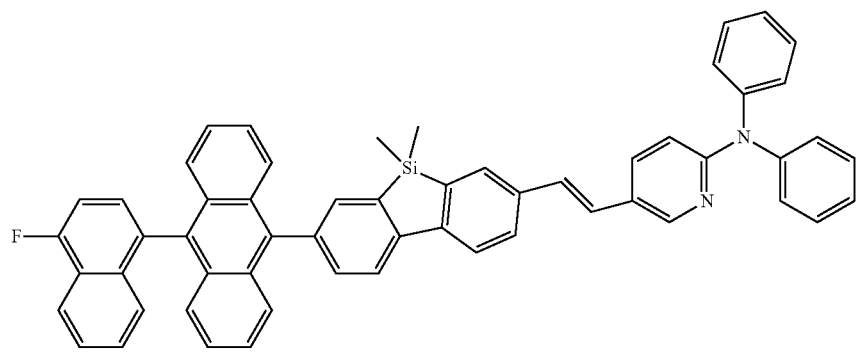
73
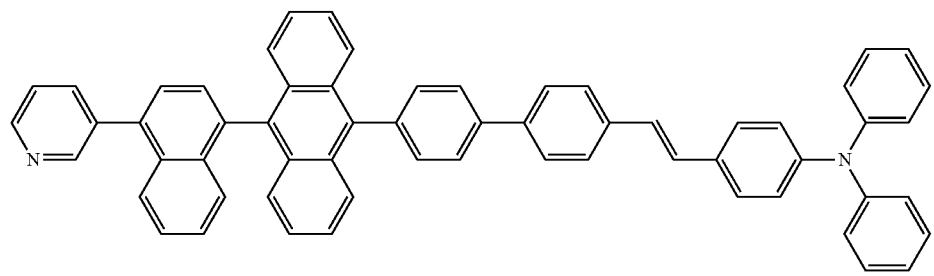
74
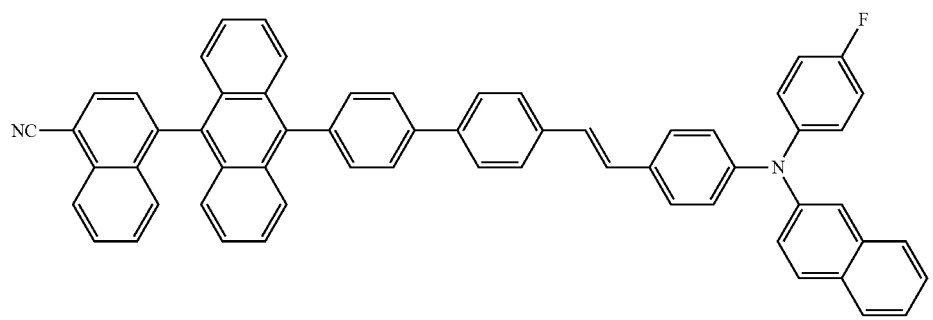
75

-continued

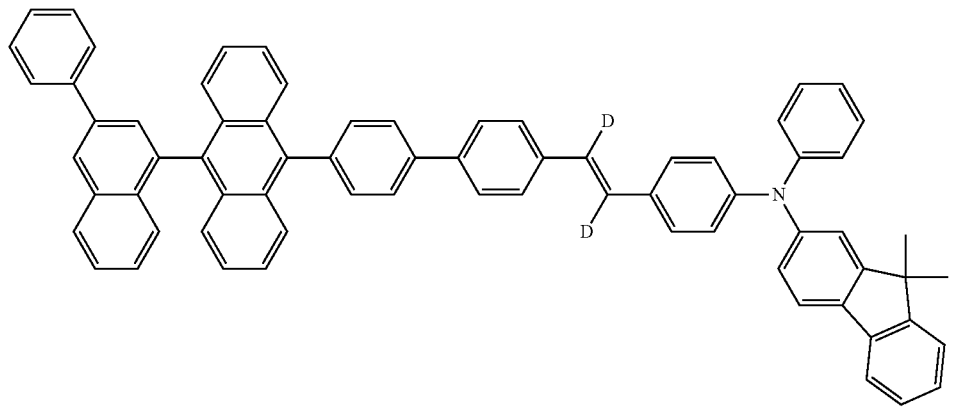

76

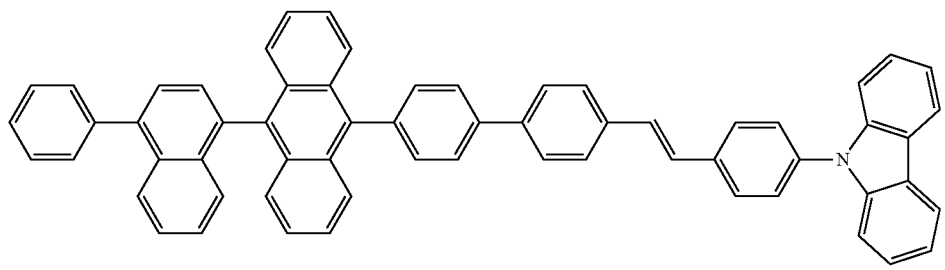

77

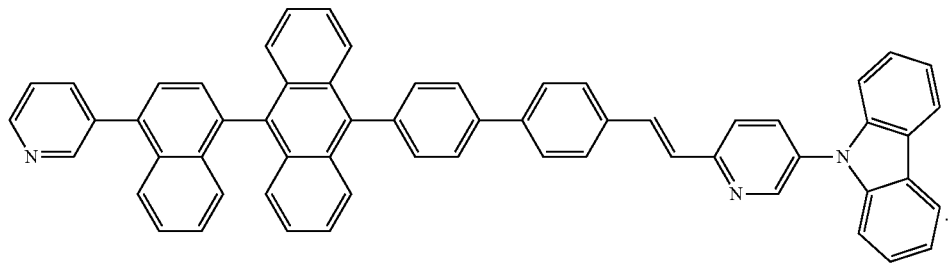

78

16. An organic light-emitting diode (OLED) comprising:
a first electrode;
a second electrode facing the first electrode; and
an organic layer between the first electrode and the second electrode,
wherein the organic layer comprises a hole transporting region between the first electrode and an emission layer, and an electron transporting region between the emission layer and the second electrode, wherein the organic layer comprises at least one of the styryl-based compound of claim 1.

17. The OLED of claim 16, wherein the hole transporting region comprises at least one selected from the group consisting of a hole injection layer (HIL), a hole transport layer (HTL), a functional layer having both hole injection and transport abilities, a buffer layer, and an electron blocking layer (EBL), and
wherein the electron transporting region comprises at least one of a hole blocking layer, an electron transport layer, and the electron injection layer.

18. The OLED of claim 16, wherein the emission layer comprises the styryl-based compound,
wherein the styryl-based compound serves as a dopant, and
wherein the emission layer further comprises a host.

19. The OLED of claim 16, wherein the hole transport region comprises a p-dopant.

20. The OLED of claim 16, wherein the electron transporting region comprises a metal-containing material.

* * * * *